United States Patent
Kadoma et al.

(10) Patent No.: US 12,471,492 B2
(45) Date of Patent: Nov. 11, 2025

(54) ORGANIC COMPOUND, LIGHT-EMITTING DEVICE, LIGHT-EMITTING APPARATUS, ELECTRONIC DEVICE, DISPLAY DEVICE, AND LIGHTING DEVICE

(71) Applicant: Semiconductor Energy Laboratory Co., Ltd., Kanagawa-ken (JP)

(72) Inventors: Hiroshi Kadoma, Kanagawa (JP); Satoshi Seo, Kanagawa (JP); Harue Osaka, Kanagawa (JP); Tsunenori Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 818 days.

(21) Appl. No.: 17/500,114

(22) Filed: Oct. 13, 2021

(65) Prior Publication Data
US 2022/0123231 A1   Apr. 21, 2022

(30) Foreign Application Priority Data
Oct. 16, 2020   (JP) .................. 2020-174339

(51) Int. Cl.
| | |
|---|---|
| H01L 51/00 | (2006.01) |
| C07D 209/80 | (2006.01) |
| C07D 209/86 | (2006.01) |
| C09K 11/06 | (2006.01) |
| H10K 85/60 | (2023.01) |

(Continued)

(52) U.S. Cl.
CPC ....... *H10K 85/6572* (2023.02); *C07D 209/80* (2013.01); *C07D 209/86* (2013.01); *C09K 11/06* (2013.01); *H10K 85/615* (2023.02); *C09K 2211/1018* (2013.01); *H10K 50/11* (2023.02); *H10K 50/15* (2023.02); *H10K 2101/10* (2023.02)

(58) Field of Classification Search
CPC ............. H10K 85/6572; H10K 85/615; C07D 209/80; C09K 2211/1018
See application file for complete search history.

(56) References Cited

U.S. PATENT DOCUMENTS

| | | |
|---|---|---|
| 8,084,146 B2 | 12/2011 | Murase et al. |
| 11,641,777 B2 | 5/2023 | Kadoma et al. |

(Continued)

FOREIGN PATENT DOCUMENTS

| | | |
|---|---|---|
| CN | 113429393 A | 9/2021 |
| JP | 2013-048221 A | 3/2013 |

(Continued)

OTHER PUBLICATIONS

English language translation of WO 2018/113538, pp. 1-41, Jul. 22, 2024.*

*Primary Examiner* — Alexander C Kollias
(74) *Attorney, Agent, or Firm* — Husch Blackwell LLP

(57) ABSTRACT

A novel light-emitting device that is highly convenient, useful, or reliable is provided. An organic compound in which a substituted or unsubstituted naphtho[2,3-c]carbazolyl group or a substituted or unsubstituted benzo[c]naphtho[2,3-g]carbazolyl group is bonded to a substituted or unsubstituted 9H-carbazolyl group or a substituted or unsubstituted anthryl group through a substituted or unsubstituted arylene group. The arylene group has 6 to 13, inclusive, carbon atoms.

16 Claims, 32 Drawing Sheets

(51) Int. Cl.
*H10K 50/11* (2023.01)
*H10K 50/15* (2023.01)
*H10K 101/10* (2023.01)

(56) References Cited

U.S. PATENT DOCUMENTS

| | | |
|---|---|---|
| 11,665,960 B2 | 5/2023 | Kadoma et al. |
| 2003/0186077 A1 | 10/2003 | Chen |
| 2007/0247063 A1 | 10/2007 | Murase et al. |
| 2007/0267969 A1 | 11/2007 | Nakashima et al. |
| 2008/0107918 A1 | 5/2008 | Egawa et al. |
| 2008/0114178 A1 | 5/2008 | Kawakami et al. |
| 2008/0124455 A1 | 5/2008 | Shin et al. |
| 2008/0176041 A1* | 7/2008 | Sato ............. H10K 59/877 428/161 |
| 2009/0015140 A1 | 1/2009 | Kawakami et al. |
| 2009/0058261 A1 | 3/2009 | Kawakami et al. |
| 2009/0253916 A1 | 10/2009 | Kawakami et al. |
| 2009/0267498 A1 | 10/2009 | Kawakami et al. |
| 2010/0069647 A1 | 3/2010 | Suzuki et al. |
| 2010/0076201 A1 | 3/2010 | Suzuki et al. |
| 2010/0200847 A1 | 8/2010 | Kawakami et al. |
| 2011/0050118 A1 | 3/2011 | Egawa et al. |
| 2012/0007066 A1 | 1/2012 | Kawakami et al. |
| 2012/0104370 A1 | 5/2012 | Suzuki et al. |
| 2012/0104379 A1 | 5/2012 | Kawakami et al. |
| 2012/0309984 A1 | 12/2012 | Kawakami et al. |
| 2013/0005067 A1 | 1/2013 | Kawakami et al. |
| 2013/0020561 A1 | 1/2013 | Suzuki et al. |
| 2013/0323870 A1 | 12/2013 | Kawakami et al. |
| 2014/0081031 A1 | 3/2014 | Kawakami et al. |
| 2014/0159011 A1 | 6/2014 | Suzuki et al. |
| 2014/0187791 A1 | 7/2014 | Suzuki et al. |
| 2014/0239802 A1* | 8/2014 | Lee ............. H04M 1/0266 313/504 |
| 2014/0339524 A1 | 11/2014 | Shitagaki et al. |
| 2014/0364626 A1 | 12/2014 | Nakashima et al. |
| 2015/0004731 A1 | 1/2015 | Kawakami et al. |
| 2015/0171347 A1 | 6/2015 | Suzuki et al. |
| 2015/0249220 A1 | 9/2015 | Osaka et al. |
| 2015/0376400 A1* | 12/2015 | Kang ............. C08L 67/02 362/350 |
| 2016/0126463 A1 | 5/2016 | Kadoma et al. |
| 2016/0233437 A1 | 8/2016 | Suzuki et al. |
| 2017/0098776 A1 | 4/2017 | Nakashima et al. |
| 2017/0125703 A1 | 5/2017 | Suzuki et al. |
| 2017/0125704 A1 | 5/2017 | Suzuki et al. |
| 2017/0250346 A1 | 8/2017 | Seo et al. |
| 2018/0026207 A1 | 1/2018 | Takeda et al. |
| 2021/0061787 A1 | 3/2021 | Yen et al. |
| 2023/0263055 A1 | 8/2023 | Kadoma et al. |

FOREIGN PATENT DOCUMENTS

| | | | |
|---|---|---|---|
| KR | 2016-0123510 A | 10/2016 | |
| KR | 2018-0010409 A | 1/2018 | |
| WO | WO-2018113538 * | 6/2018 | ........... C07D 209/94 |
| WO | WO-2018/146570 | 8/2018 | |
| WO | WO-2019/102292 | 5/2019 | |

* cited by examiner

0eV —

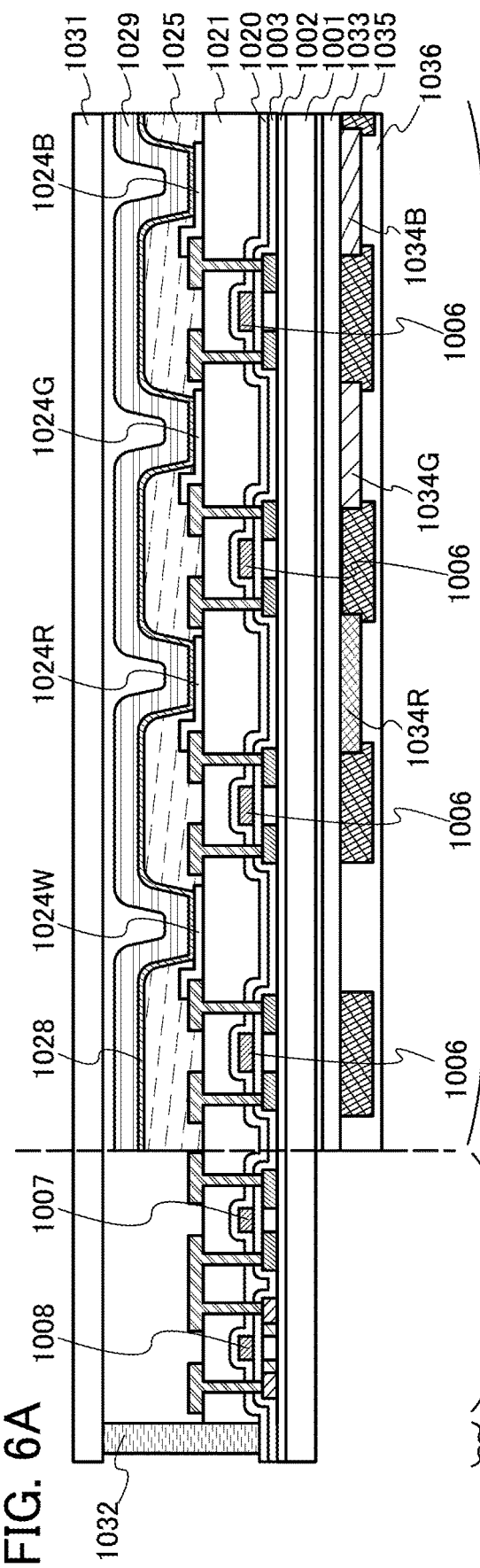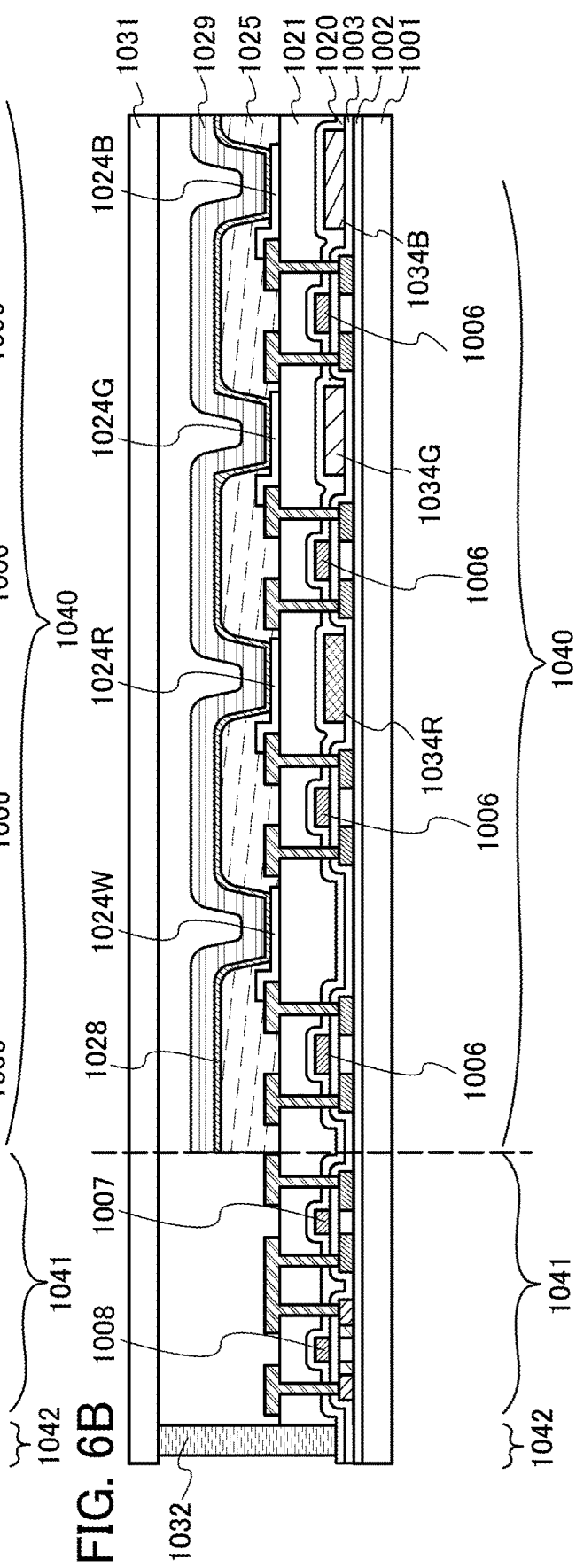
FIG. 6A
FIG. 6B

ORGANIC COMPOUND, LIGHT-EMITTING DEVICE, LIGHT-EMITTING APPARATUS, ELECTRONIC DEVICE, DISPLAY DEVICE, AND LIGHTING DEVICE

BACKGROUND OF THE INVENTION

1. Field of the Invention

One embodiment of the present invention relates to an organic compound, a light-emitting device, a light-emitting apparatus, an electronic device, a display device, a lighting device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting apparatus, a power storage device, a memory device, a method of driving any of them, and a method of manufacturing any of them.

2. Description of the Related Art

Some display devices and light-emitting apparatuses including organic EL elements are practically used and are increasingly finding diverse applications. It is natural that organic EL displays, next-generation displays, need to have high quality.

Although a variety of substances has been developed as materials for organic EL displays, not so many of them have high resistance enough for practical use. In consideration of diversity, affinity, and the like of combinations, it is needless to say that the number of options is preferably larger.

For example, it is known that the use of a dibenzo[c,g] carbazole compound in which an aryl group having 14 to 30, inclusive, carbon atoms and at least anthracene is bonded to nitrogen of a dibenzo[c,g]carbazole derivative for an organic EL element enables a light-emitting element having excellent characteristics to be easily formed (Patent Document 1).

REFERENCE

[Patent Document 1] Japanese Published Patent Application No. 2013-48221

SUMMARY OF THE INVENTION

An object of one embodiment of the present invention is to provide a novel organic compound that is highly convenient, useful, or reliable. Another object is to provide a novel light-emitting device that is highly convenient, useful, or reliable. Another object is to provide a novel photoelectric conversion device that is highly convenient, useful, or reliable. Another object is to provide a novel light-emitting apparatus that is highly convenient, useful, or reliable. Another object is to provide a novel electronic device that is highly convenient, useful, or reliable. Another object is to provide a novel display device that is highly convenient, useful, or reliable. Another object is to provide a novel lighting device that is highly convenient, useful, or reliable. Another object is to provide a novel organic compound, a novel light-emitting device, a novel light-emitting apparatus, a novel electronic device, a novel display device, a novel lighting device, or a novel semiconductor device.

Note that the descriptions of these objects do not preclude the existence of other objects. In one embodiment of the present invention, there is no need to achieve all these objects. Other objects will be apparent from and can be derived from the descriptions of the specification, the drawings, the claims, and the like.

(1) One embodiment of the present invention is an organic compound represented by General Formula (G1) below.

[Chemical Formula 1]

$$E\text{-}Ar\text{-}A \quad (G1)$$

In General Formula (G1) above, E represents a substituted or unsubstituted naphtho[2,3-c]carbazolyl group or a substituted or unsubstituted benzo[c]naphtho[2,3-g]carbazolyl group; Ar represents a substituted or unsubstituted arylene group and the arylene group has 6 to 13, inclusive, carbon atoms; and A represents a substituted or unsubstituted 9H-carbazolyl group or a substituted or unsubstituted anthryl group.

(2) Another embodiment of the present invention is an organic compound represented by General Formula (G2) below.

[Chemical Formulae 2]

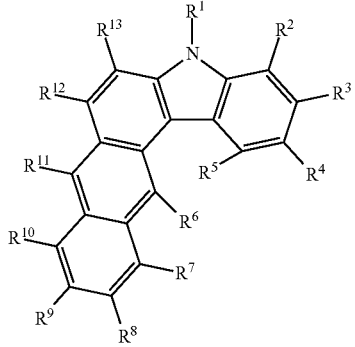

(G2)

$$\text{---}Ar\text{---}A \quad (G3)$$

In General Formula (G2) above, any one of a substituent $R^1$ to a substituent $R^{13}$ is represented by General Formula (G3) above.

In General Formula (G3) above, Ar represents a substituted or unsubstituted arylene group and the arylene group has 6 to 13, inclusive, carbon atoms. A represents a substituted or unsubstituted 9H-carbazolyl group or a substituted or unsubstituted anthryl group. The others of the substituent $R^1$ to the substituent $R^{13}$ each independently represent hydrogen, an alkyl group, a cyclic alkyl group, or a substituted or unsubstituted aryl group.

The alkyl group has 1 to 6, inclusive, carbon atoms; the cyclic alkyl group has 3 to 7, inclusive, carbon atoms; and the substituted or unsubstituted aryl group has 6 to 13, inclusive, carbon atoms.

(3) Another embodiment of the present invention is the organic compound represented by General Formula (G2) above, in which any one of the substituent R', the substituent $R^3$, the substituent $R^4$, and the substituent $R^{10}$ is represented by General Formula (G3).

(4) Another embodiment of the present invention is an organic compound represented by General Formula (G4) below.

[Chemical Formulae 3]

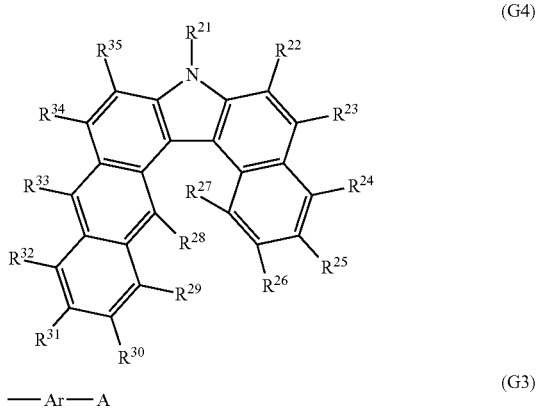

(G4)

—Ar—A (G3)

In General Formula (G4) above, any one of a substituent $R^{21}$ to a substituent $R^{35}$ is represented by General Formula (G3) above.

In General Formula (G3) above, Ar represents a substituted or unsubstituted arylene group and the arylene group has 6 to 13, inclusive, carbon atoms. A represents a substituted or unsubstituted 9H-carbazolyl group or a substituted or unsubstituted anthryl group.

The others of the substituent $R^{21}$ to the substituent $R^{35}$ each independently represent hydrogen, an alkyl group, a cyclic alkyl group, or a substituted or unsubstituted aryl group.

The alkyl group has 1 to 6, inclusive, carbon atoms; the cyclic alkyl group has 3 to 7, inclusive, carbon atoms; and the substituted or unsubstituted aryl group has 6 to 13, inclusive, carbon atoms.

(5) Another embodiment of the present invention is the organic compound in General Formula (G4) above, in which any one of the substituent $R^{21}$, the substituent $R^{23}$, the substituent $R^{24}$, and the substituent $R^{32}$ is represented by General Formula (G3).

(6) Another embodiment of the present invention is the organic compound in General Formula (G3) above, in which Ar represents a substituted or unsubstituted phenylene group or a substituted or unsubstituted biphenyldiyl group.

(7) Another embodiment of the present invention is the organic compound in General Formula (G3) above, in which A represents a substituted or unsubstituted carbazol-9-yl group or a substituted or unsubstituted 9-anthryl group.

(8) Another embodiment of the present invention is a light-emitting device including a first electrode, a second electrode, a first layer, and a second layer.

The second electrode includes a region overlapping with the first electrode, and the first layer includes a region between the first electrode and the second electrode.

The first layer contains a light-emitting material and a charge-transport material CTM. The second layer includes a region between the first layer and the second electrode, and contains the charge-transport material CTM.

The charge-transport material CTM is the above organic compound.

(9) Another embodiment of the present invention is a light-emitting apparatus including the above light-emitting device, and a transistor or a substrate.

(10) Another embodiment of the present invention is a display device including the above light-emitting device, and a transistor or a substrate.

(11) Another embodiment of the present invention is a lighting device including the light-emitting apparatus and a housing.

(12) Another embodiment of the present invention is an electronic device including the display device, and a sensor, an operation button, a speaker, or a microphone.

Although the block diagram in drawings attached to this specification shows components classified by their functions in independent blocks, it is difficult to classify actual components according to their functions completely, and it is possible for one component to have a plurality of functions.

Note that the light-emitting apparatus in this specification includes, in its category, an image display device that uses a light-emitting element. The light-emitting apparatus may also include, in its category, a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. Furthermore, a lighting device or the like may include the light-emitting apparatus.

According to one embodiment of the present invention, a novel organic compound that is highly convenient, useful, or reliable can be provided. Alternatively, a novel light-emitting device that is highly convenient, useful, or reliable can be provided. Alternatively, a novel photoelectric conversion device that is highly convenient, useful, or reliable can be provided. Alternatively, a light-emitting apparatus that is highly convenient, useful, or reliable can be provided. Alternatively, a novel electronic device that is highly convenient, useful, or reliable can be provided. Alternatively, a novel display device that is highly convenient, useful, or reliable can be provided. Alternatively, a novel lighting device that is highly convenient, useful, or reliable can be provided. Alternatively, a novel organic compound, a novel light-emitting device, a novel light-emitting apparatus, a novel electronic device, a novel display device, a novel lighting device, or a novel semiconductor device can be provided.

Note that the descriptions of these effects do not preclude the existence of other effects. One embodiment of the present invention does not necessarily have all these effects. Other effects will be apparent from and can be derived from the descriptions of the specification, the drawings, the claims, and the like.

BRIEF DESCRIPTION OF THE DRAWINGS

FIGS. 6A and 6B are conceptual diagrams of active matrix light-emitting apparatuses.

DETAILED DESCRIPTION OF THE INVENTION

Figure 1A:
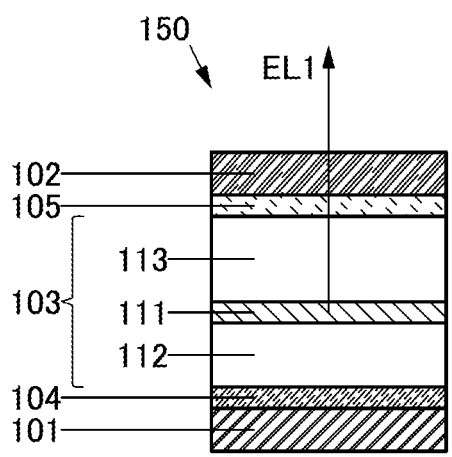
FIGS. 1A and 1B illustrate structures of a light-emitting device of an embodiment.

In an organic compound of one embodiment of the present invention, a substituted or unsubstituted naphtho[2,3-c]carbazolyl group or a substituted or unsubstituted benzo[c]naphtho[2,3-g]carbazolyl group is bonded to a substituted or unsubstituted 9H-carbazolyl group or a substituted or unsubstituted anthryl group through a substituted or unsubstituted arylene group. Note that the arylene group has 6 to 13, inclusive, carbon atoms.

Accordingly, an organic compound having an excellent carrier-transport property can be provided. An organic compound that can be suitably used in a light-emitting device can be provided. A light-emitting device having favorable characteristics can be provided. As a result, a novel organic compound that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and the description thereof is not repeated.

Embodiment 1

In this embodiment, an organic compound of one embodiment of the present invention will be described.

Example 1 of Organic Compound

The organic compound described in this embodiment is an organic compound represented by General Formula (G1) below.

[Chemical Formula 4]

$$E\text{-}Ar\text{-}A \quad (G1)$$

Example of E

In General Formula (G1) above, E represents a substituted or unsubstituted naphtho[2,3-c]carbazolyl group or a substituted or unsubstituted benzo[c]naphtho[2,3-g]carbazolyl group. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

Example of Ar

In General Formula (G1) above, Ar represents a substituted or unsubstituted arylene group, and the arylene group has 6 to 13, inclusive, carbon atoms. Note that substituents of the arylene group may be bonded to each other to form a ring. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the sub stituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

For example, any of a phenylene group, a biphenyldiyl group, a naphthalene-diyl group, and a fluorene-diyl group can be used, and these groups may have substituents. Moreover, any of arylene groups represented by Structural Formulae (Ar-1) to (Ar-17) below can be used as Ar.

[Chemical Formulae 5]

(Ar-1)

(Ar-2) 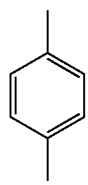

(Ar-3)

(Ar-4) 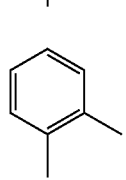

(Ar-5)

(Ar-6) 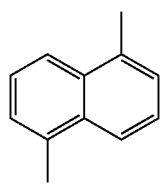

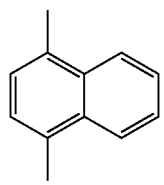

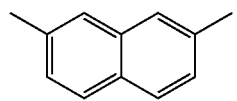

(Ar-7) 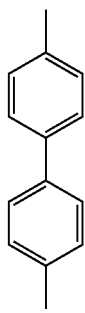

(Ar-8) 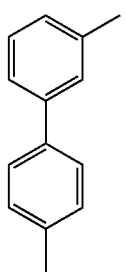

(Ar-9)

(Ar-10) 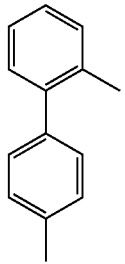

(Ar-11) 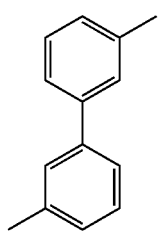

(Ar-12) 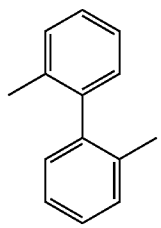

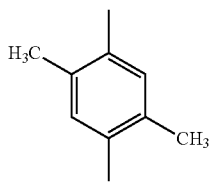

(Ar-13)

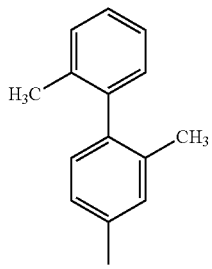

(Ar-14)

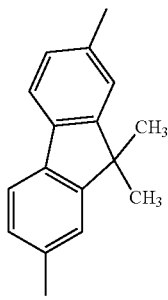

(Ar-15)

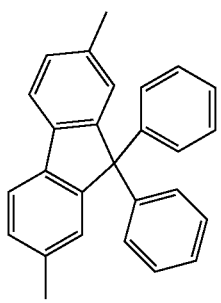

(Ar-16)

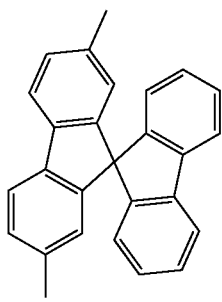

(Ar-17)

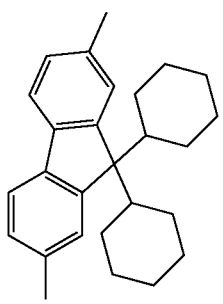

Example of A

In General Formula (G1) above, A represents a substituted or unsubstituted 9H-carbazolyl group or a substituted or unsubstituted anthryl group. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an iso-propyl group, or a tert-butyl group can be used as the substituent. Alternatively, a cyclohexyl group, an adamantyl group, or the like can be used as the sub stituent.

Specific examples of the substituted or unsubstituted anthryl group are given below.

[Chemical Formulae 6]

(A-1)

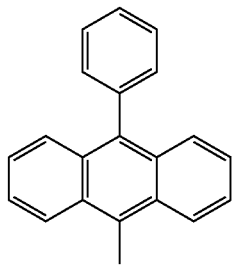

(A-2)

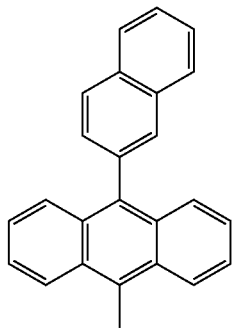

(A-3)

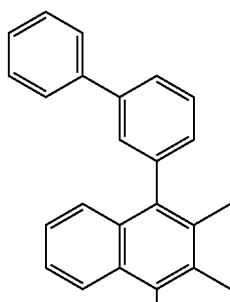

(A-4)

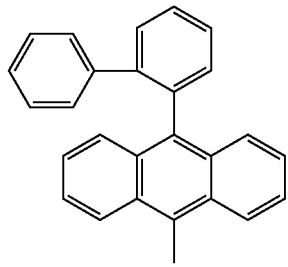

(A-5)
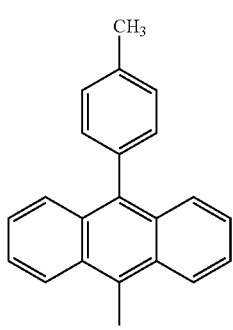
(A-6)
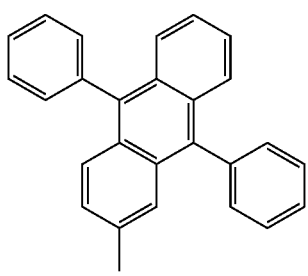
(A-7)
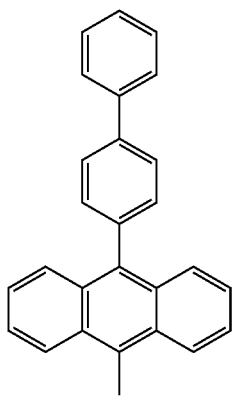
(A-8)
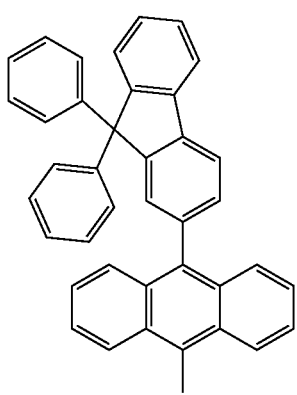
(A-9)
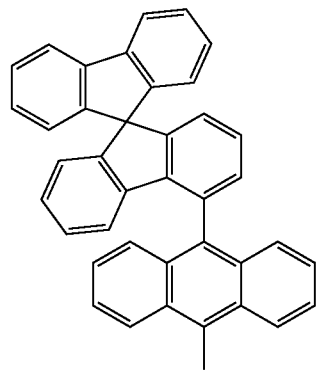
Specific examples of the substituted or unsubstituted 9H-carbazolyl group are given below.
[Chemical Formulae 7]
(A-10)
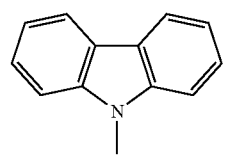
(A-11)
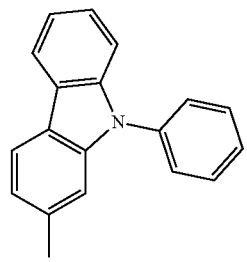
(A-12)
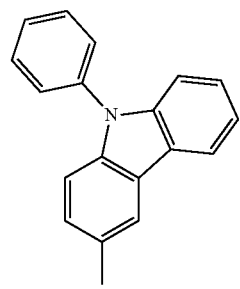
(A-13)
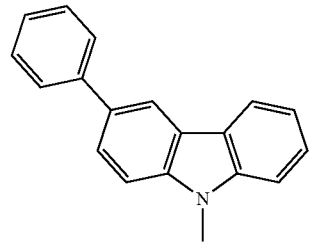

-continued

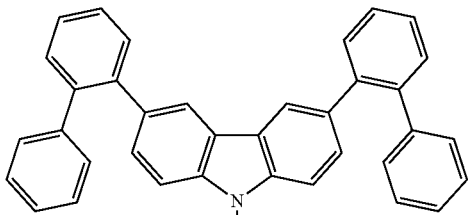
(A-14)

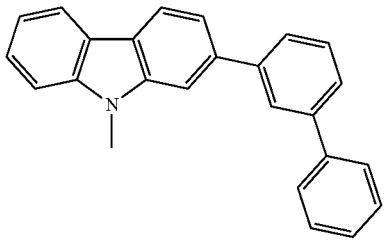
(A-15)

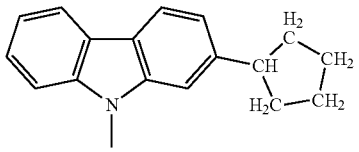
(A-16)

Example 2 of Organic Compound

The organic compound described in this embodiment is an organic compound represented by General Formula (G2) below.

[Chemical Formula 8]

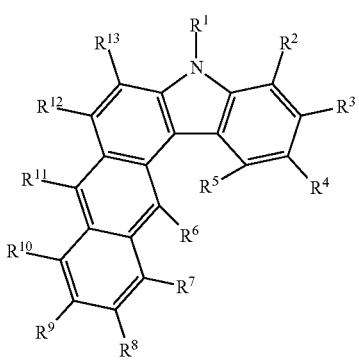
(G2)

Example of any One of Substituents $R^1$ to $R^{13}$

In General Formula (G2) above, any one of substituents $R^1$ to $R^{13}$ is represented by General Formula (G3) below.

[Chemical Formula 9]

—Ar-A  (G3)

Example of Ar

In General Formula (G3) above, Ar represents a substituted or unsubstituted arylene group, and the arylene group has 6 to 13, inclusive, carbon atoms. When the arylene group has substituents, the substituents may be bonded to each other to form a ring. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

For example, any of the arylene groups represented by Structural Formulae (Ar-1) to (Ar-17) above can be used as Ar.

Example of A

In General Formula (G3) above, A represents a substituted or unsubstituted 9H-carbazolyl group or a substituted or unsubstituted anthryl group. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

Example of the Others of Substituents $R^1$ to $R^{13}$

In General Formula (G2) above, the others of the substituents $R^1$ to $R^{13}$ each independently represent hydrogen, an alkyl group, a cyclic alkyl group, or a substituted or unsubstituted aryl group.

The number of carbon atoms is 1 or more and 6 or less when the substituent is an alkyl group, and the number of carbon atoms is 3 or more and 7 or less when the substituent is a cyclic alkyl group.

[Chemical Formulae 10]

(R-1)

(R-2)

(R-3)

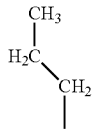
(R-4)

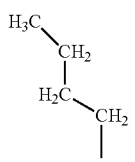 (R-5)
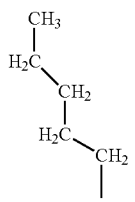 (R-6)
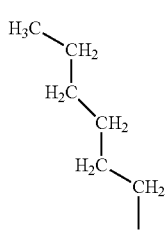 (R-7)
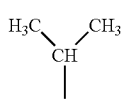 (R-8)
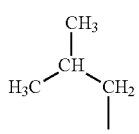 (R-9)
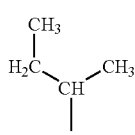 (R-10)
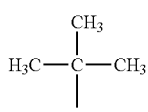 (R-11)
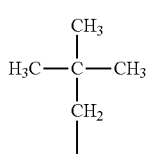 (R-12)
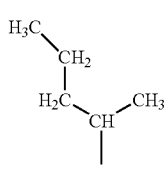 (R-13)
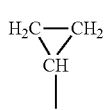 (R-14)
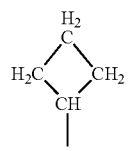 (R-15)
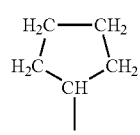 (R-16)
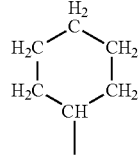 (R-17)
The number of carbon atoms is 6 or more and 13 or less when the substituent is an aryl group.
[Chemical Formulae 11]
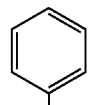 (R-18)
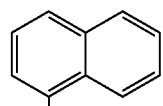 (R-19)
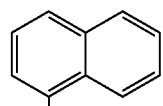 (R-20)
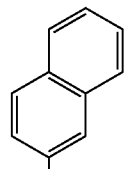 (R-20)
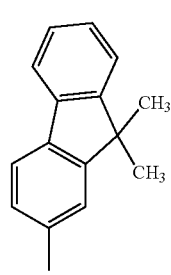 (R-21)

(R-22) 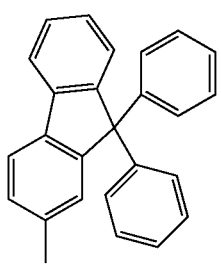
(R-23) 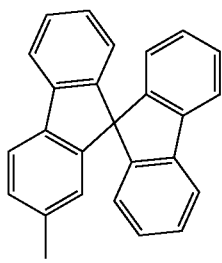
(R-24) 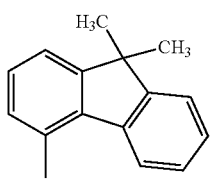
(R-25) 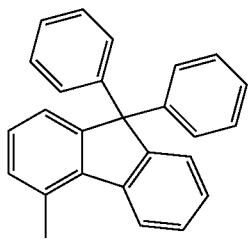
(R-26) 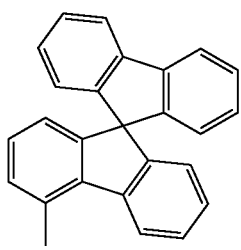
(R-27) 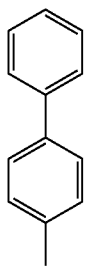
(R-28) 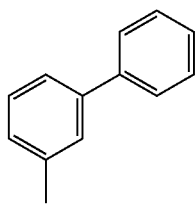
(R-29) 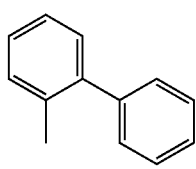
(R-30) 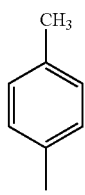
(R-31) 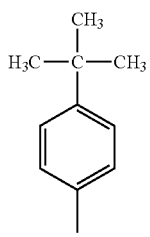
(R-32) 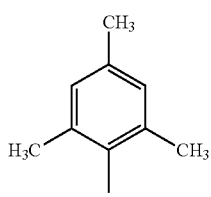
Specific Example of Organic Compound
Specific examples of the organic compound having the above-described structure are shown below.

[Chemical Formulae 12]
(100)
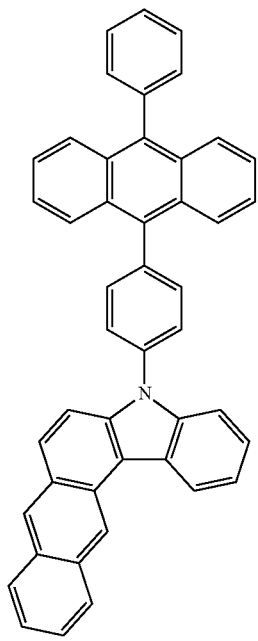
(101)
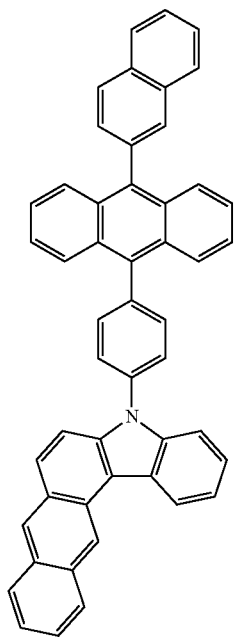
(102)
(103)
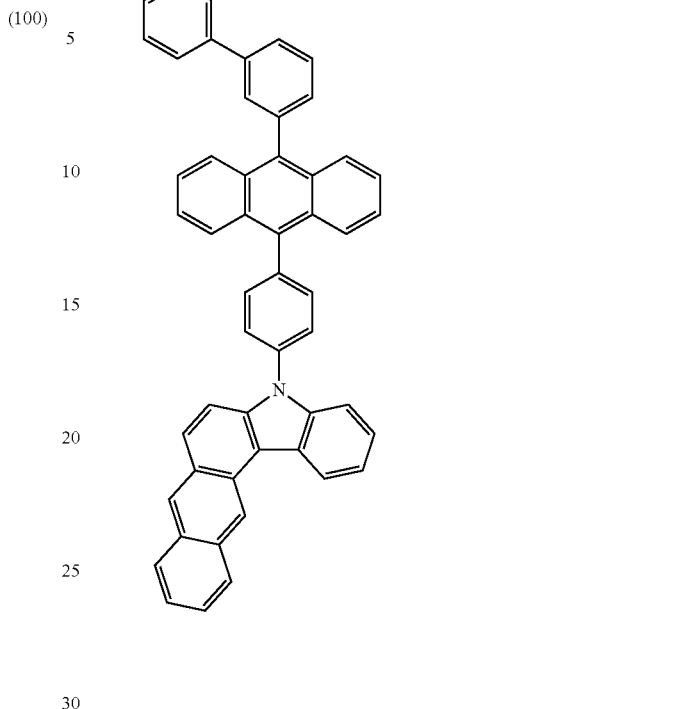
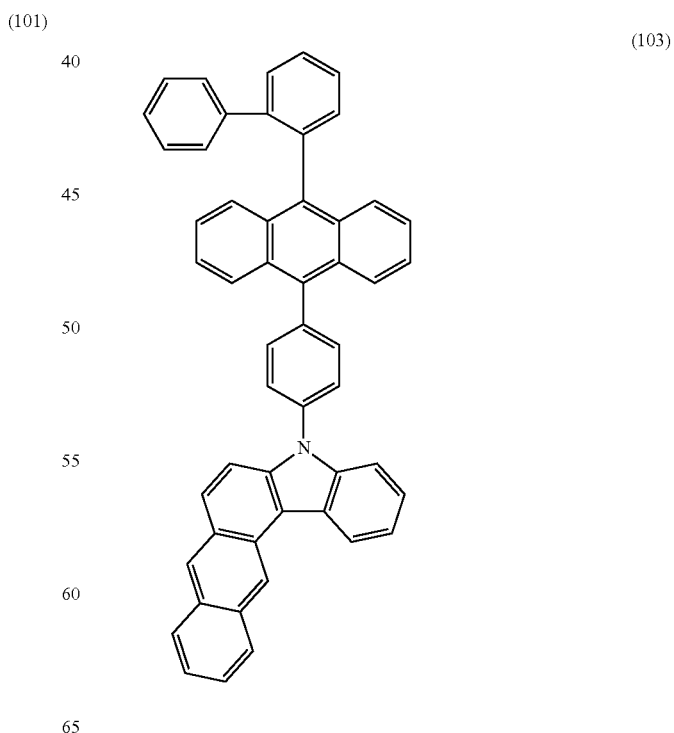

(104)
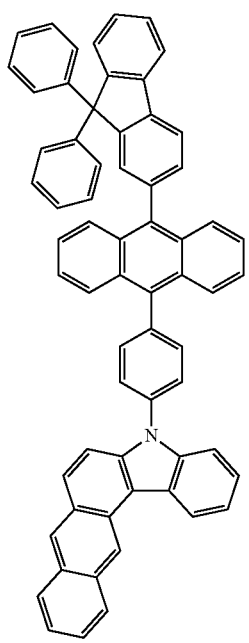
(105)
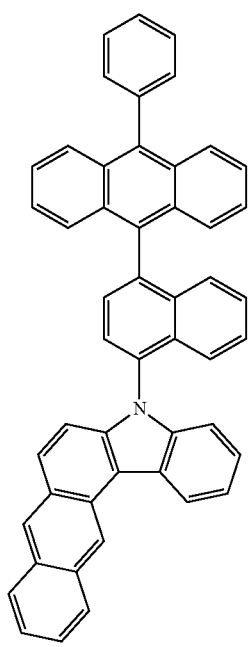
(106)
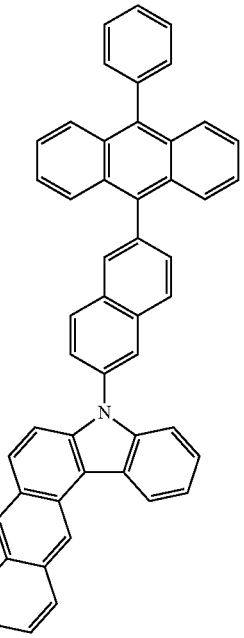
(107)
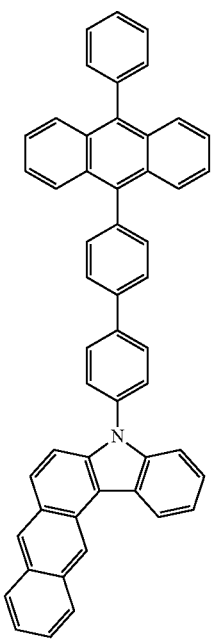

[Chemical Formulae 13]
(108)
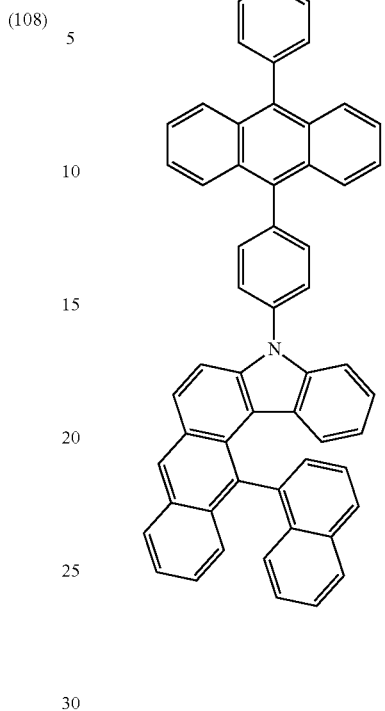
(110)
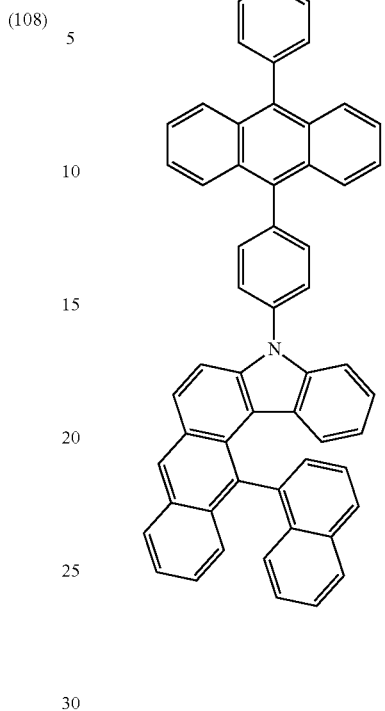
(109)
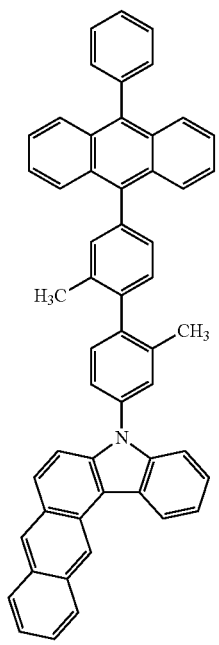
(111)
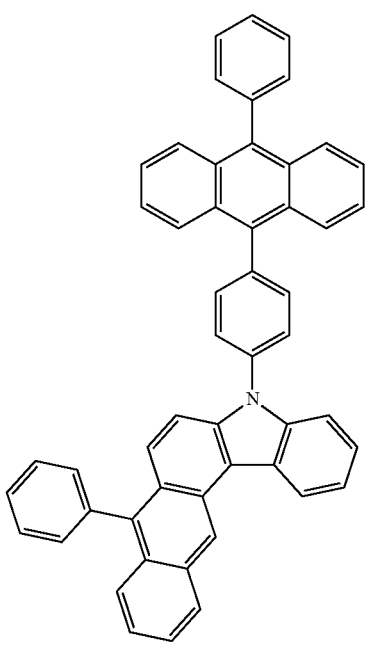
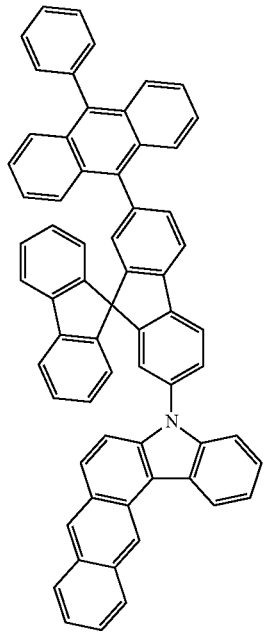

(112)
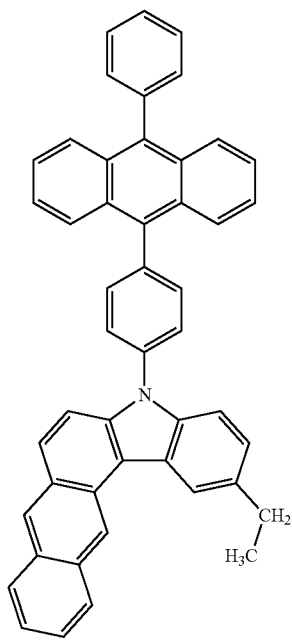
(113)
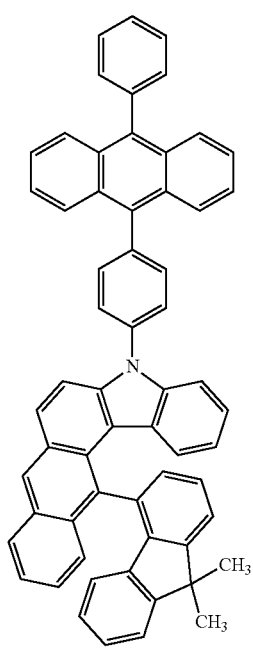
(114)
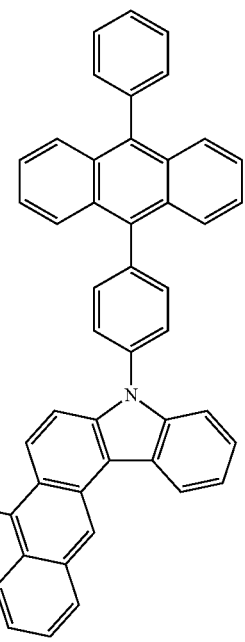
(115)
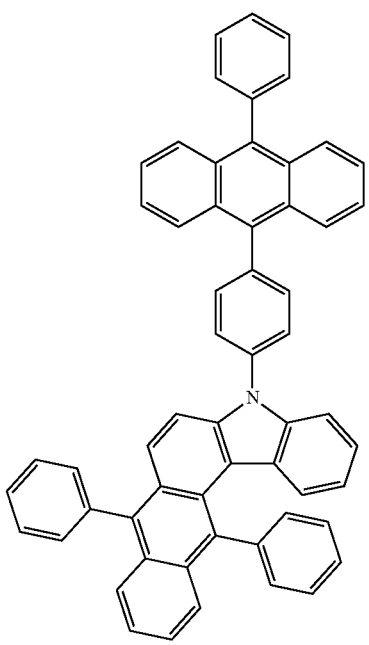

[Chemical Formulae 14]
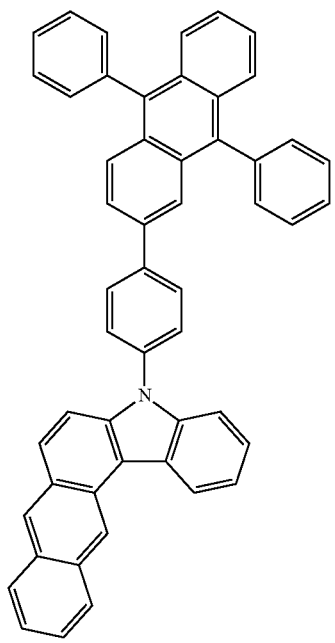
(116)
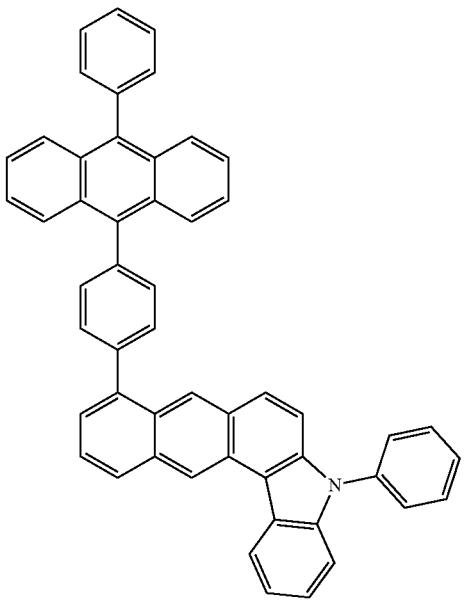
(118)
[Chemical Formulae 15]
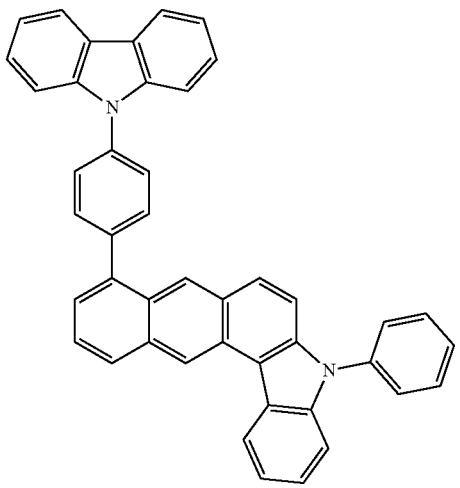
(119)
(117)
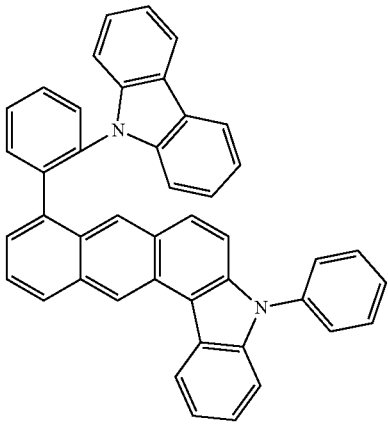
(120)

(121)
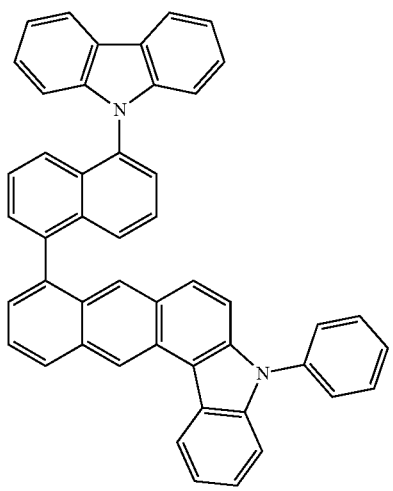
(122)
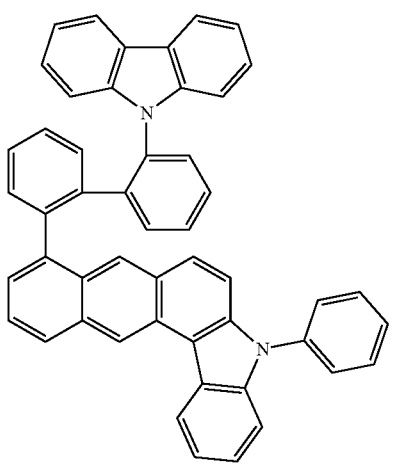
(123)
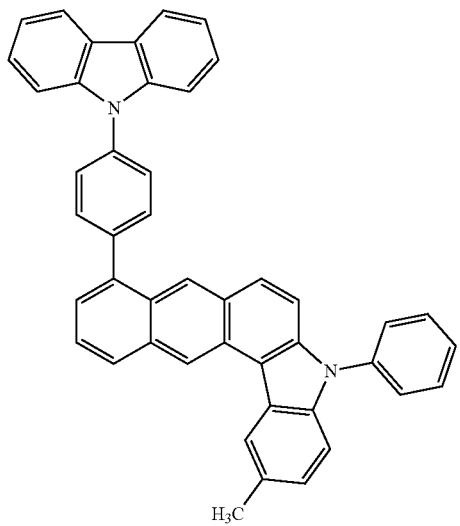
(124)
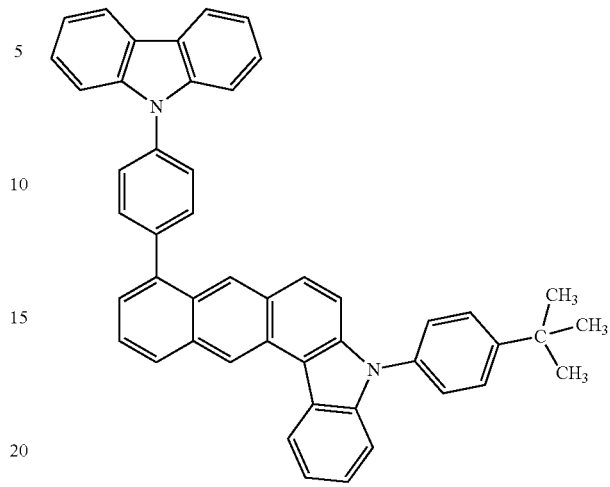
(125)
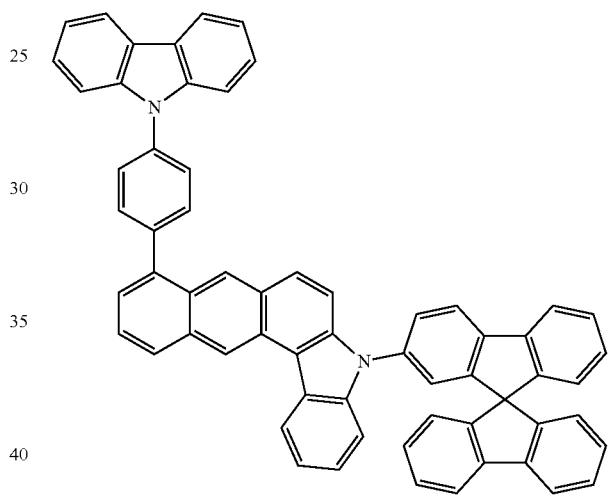
(126)
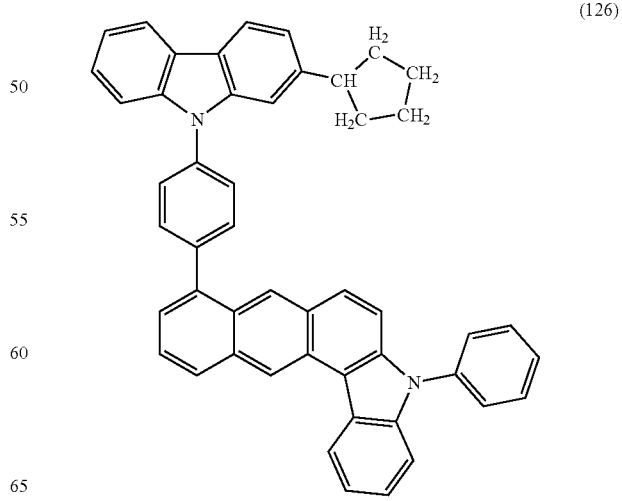

[Chemical Formulae 16]
(127)
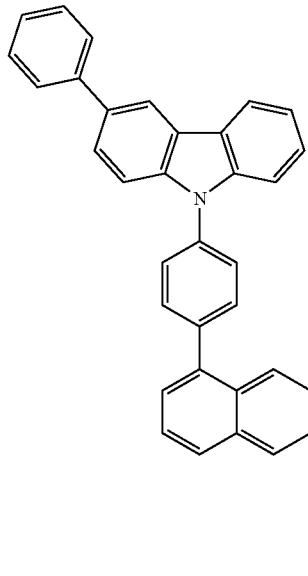
(128)
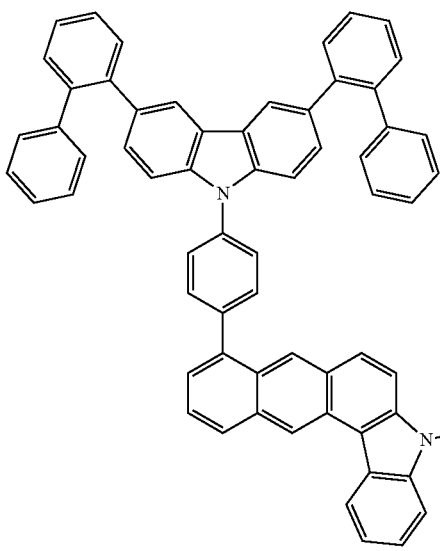
(129)
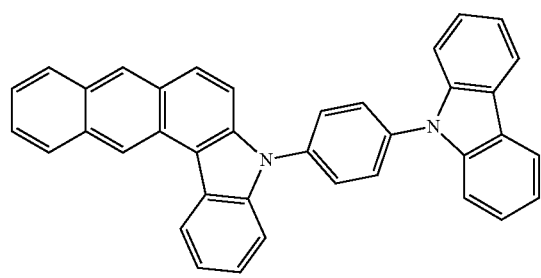
(130)
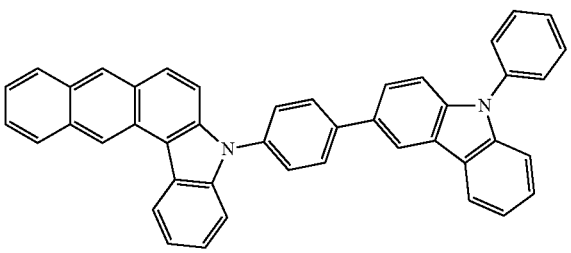
(131)
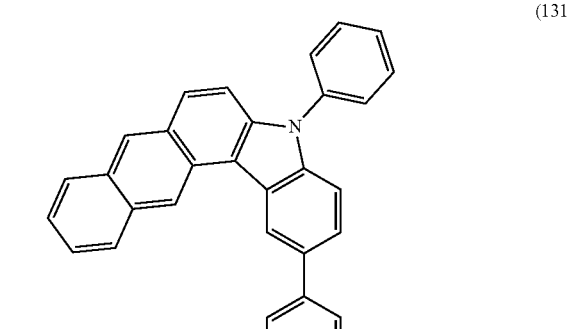
(132)
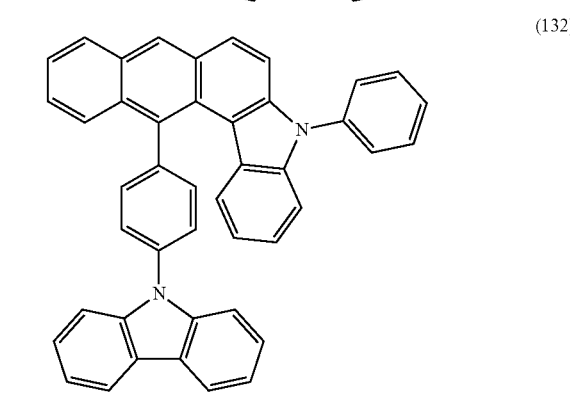
(133)

[Chemical Formulae 17]

(134)

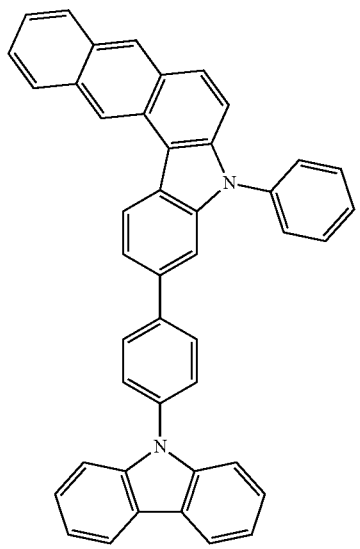

(135)

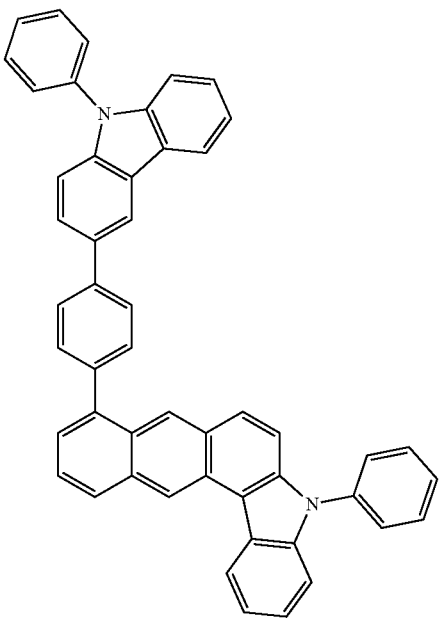

(136)

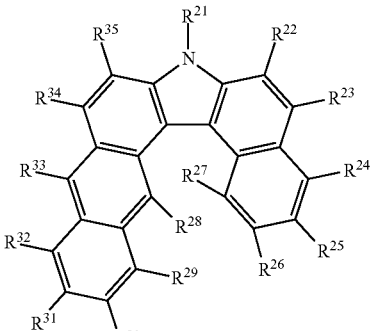

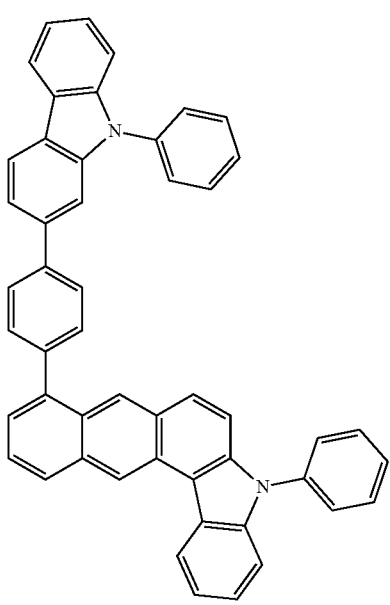

Example 3 of Organic Compound

The organic compound described in this embodiment is an organic compound represented by General Formula (G4) below.

[Chemical Formula 18]

(G4)

Example of any One of Substituents $R^{21}$ to $R^{35}$

In General Formula (G4) above, any one of substituents $R^{21}$ to $R^{35}$ is represented by General Formula (G3) below.

[Chemical Formula 19]

—Ar-A  (G3)

Example of Ar

In General Formula (G3) above, Ar represents a substituted or unsubstituted arylene group, and the arylene group has 6 to 13, inclusive, carbon atoms. When the arylene group has substituents, the substituents may be bonded to each other to form a ring. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

For example, any of the arylene groups represented by Structural Formulae (Ar-1) to (Ar-17) above can be used as Ar.

Example of A

In General Formula (G3) above, A represents a substituted or unsubstituted 9H-carbazolyl group or a substituted or unsubstituted anthryl group. Note that as a substituent, an aryl group having 6 to 13, inclusive, carbon atoms, an alkyl group having 1 to 6, inclusive, carbon atoms, or a cycloalkyl group having 6 to 10, inclusive, carbon atoms can be used. For example, a phenyl group, a biphenyl group, a naphthyl group, or a fluorenyl group can be used as the substituent. The aryl group may include one or two alkyl groups each having 1 to 6, inclusive, carbon atoms or one or two cycloalkyl groups each having 6 to 10, inclusive, carbon atoms. Alternatively, for example, a methyl group, an isopropyl group, or a tert-butyl group can be used as the substituent. Alternatively, a cyclohexyl group, an adamantyl group, or the like can be used as the substituent.

For example, any of the substituted or unsubstituted anthryl groups represented by Structural Formulae (A-1) to (A-9) above or any of the substituted or unsubstituted 9H-carbazolyl groups represented by Structural Formulae (A-10) to (A-16) above can be used as A.

<<Example of the Others of Substituents $R^{21}$ to $R^{35}$>>

Note that the others of the substituents $R^{21}$ to $R^{35}$ each independently represent hydrogen, an alkyl group, a cyclic alkyl group, or a substituted or unsubstituted aryl group. The number of carbon atoms is 1 or more and 6 or less when the substituent is an alkyl group, 3 or more and 7 or less when the substituent is a cyclic alkyl group, and 6 or more and 13 or less when the substituent is an aryl group.

The number of carbon atoms is 1 or more and 6 or less when the substituent is an alkyl group, and the number of carbon atoms is 3 or more and 7 or less when the substituent is a cyclic alkyl group. For example, any of the substituents represented by Structural Formulae (R-1) to (R-17) above can be used.

The number of carbon atoms is 6 or more and 13 or less when the substituent is an aryl group. For example, any of the substituents represented by Structural Formulae (R-18) to (R-32) above can be used.

<Specific Example of Organic Compound>

Specific examples of the organic compound having the above-described structure are shown below.

[Chemical Formulae 20]

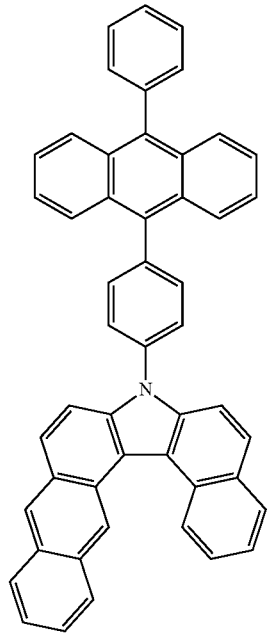

(137)

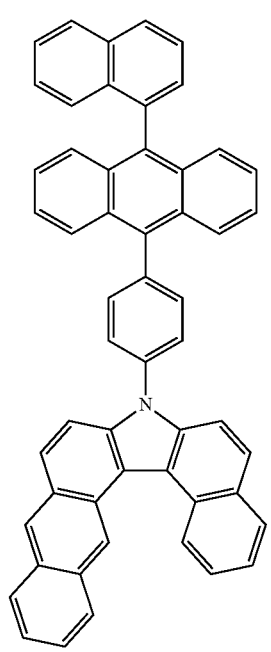

(138)

(139)
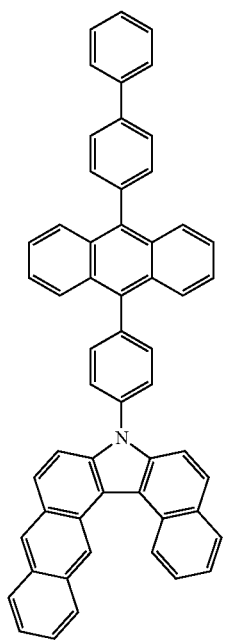
(140)
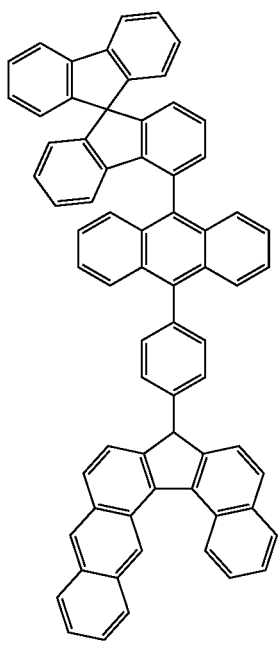
(141)
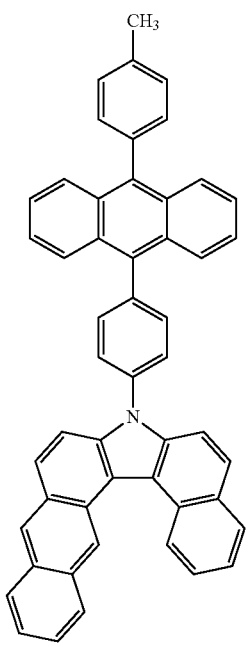
(142)
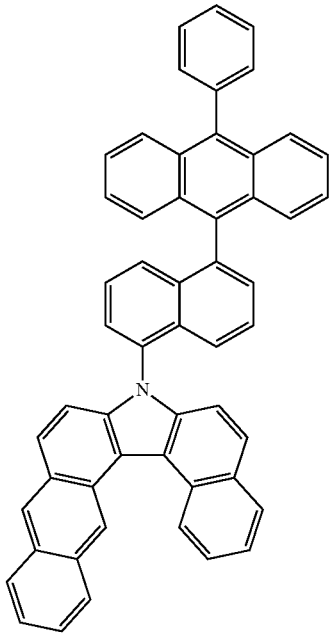

-continued
(143)
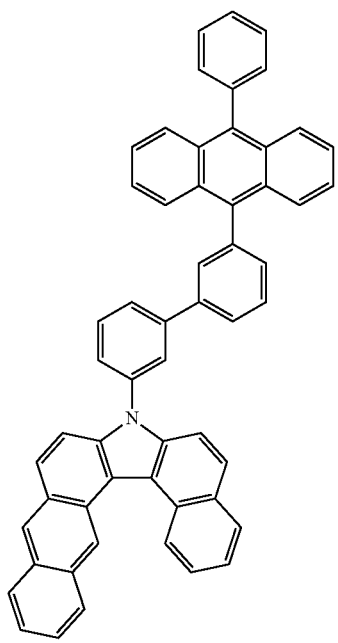
[Chemical Formulae 21]
(145)
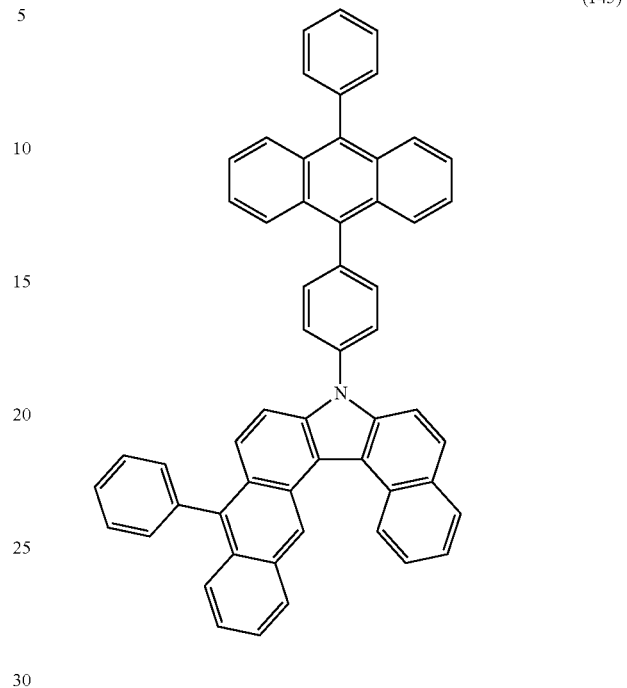
(144)
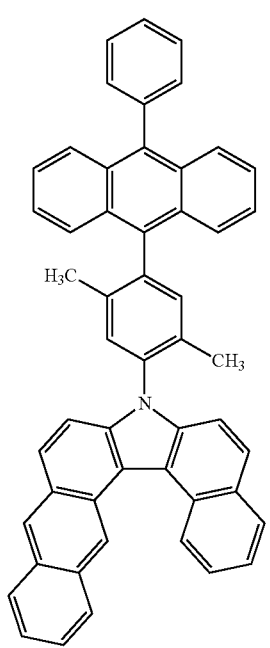
(146)
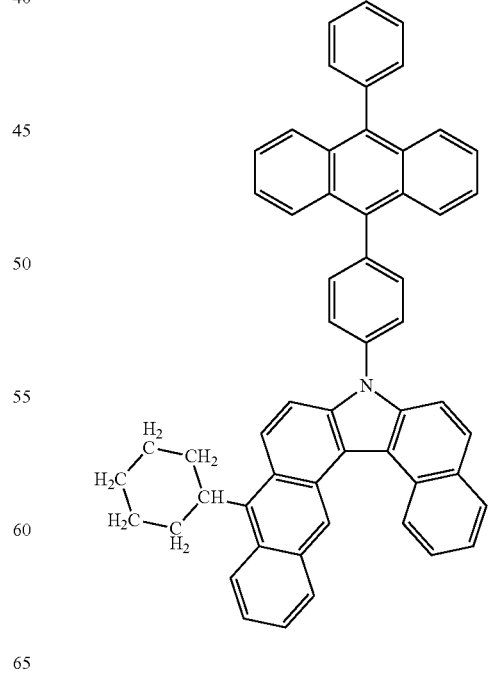

(147)
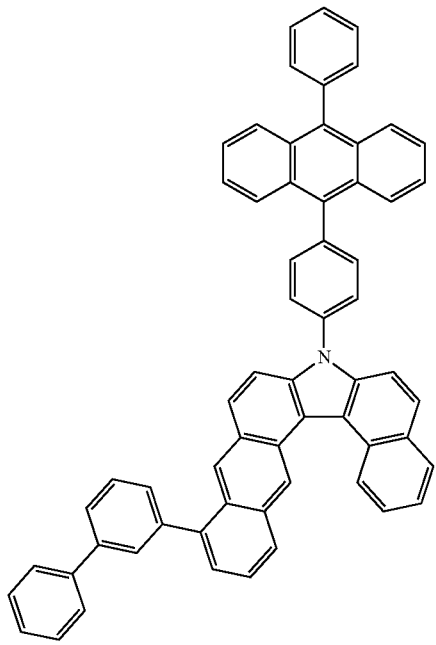
(148)
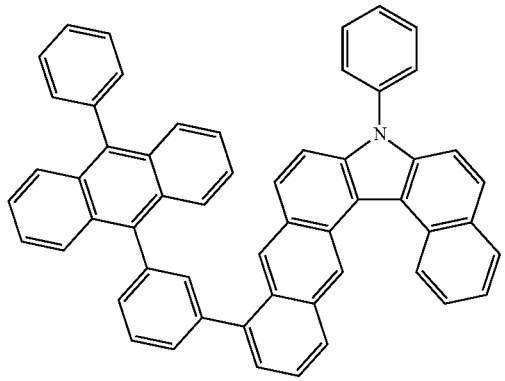
(149)
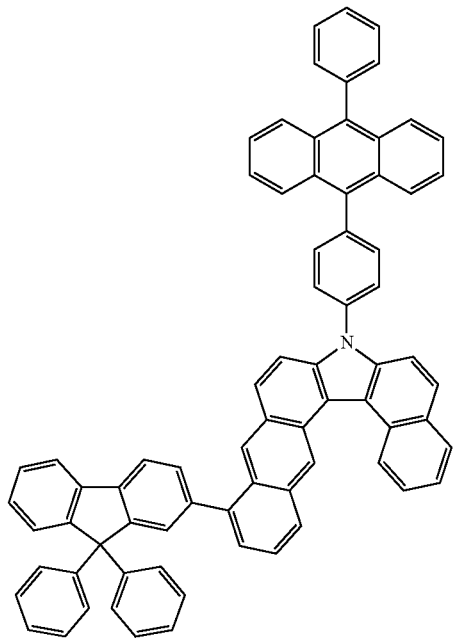
(150)
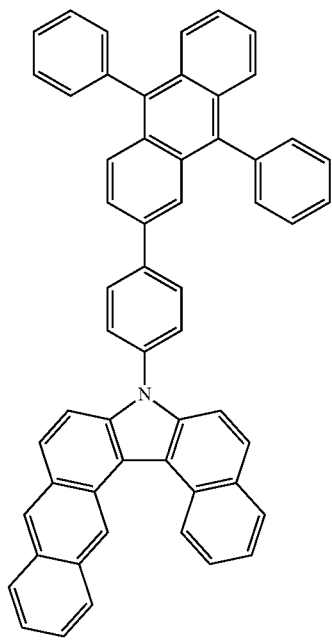

[Chemical Formulae 22]
(151) 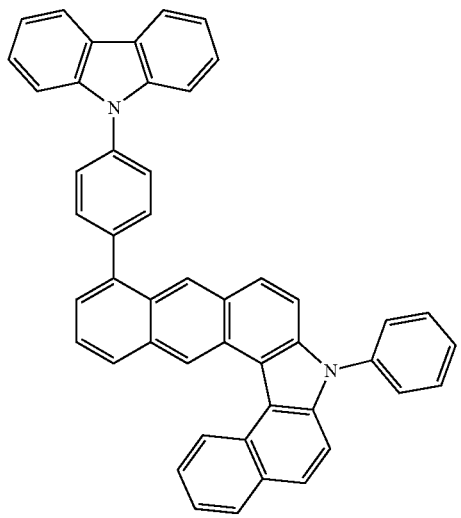
(152) 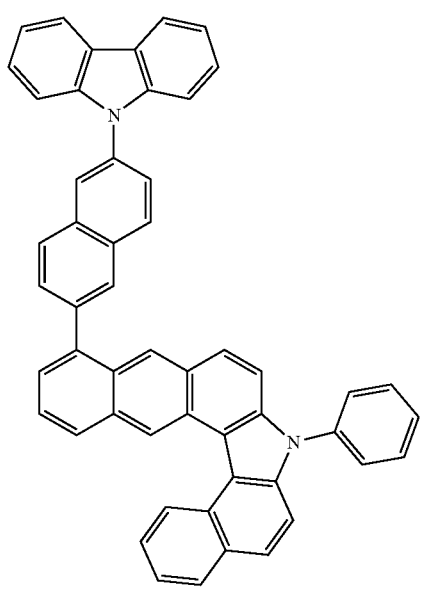
(153) 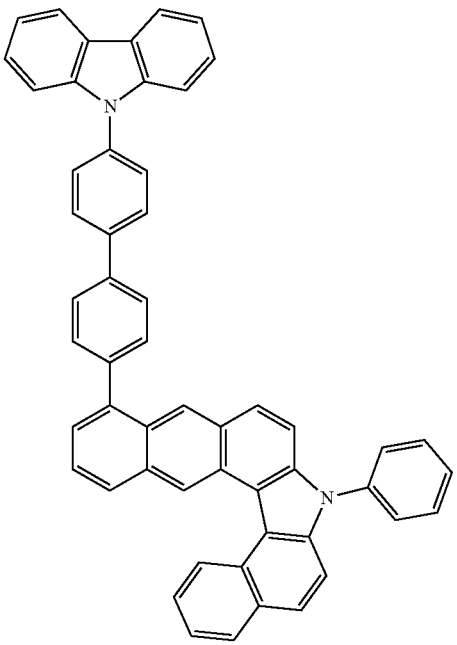
(154) 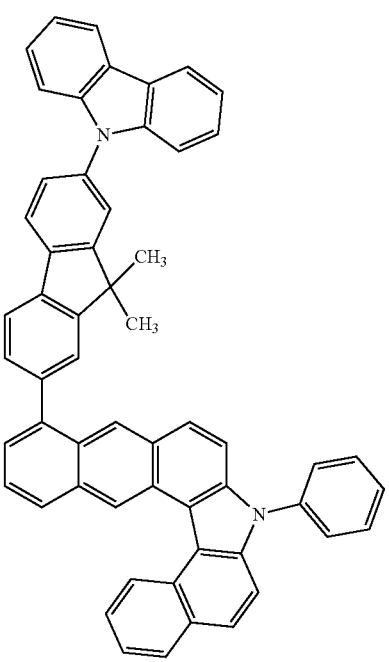

(155)
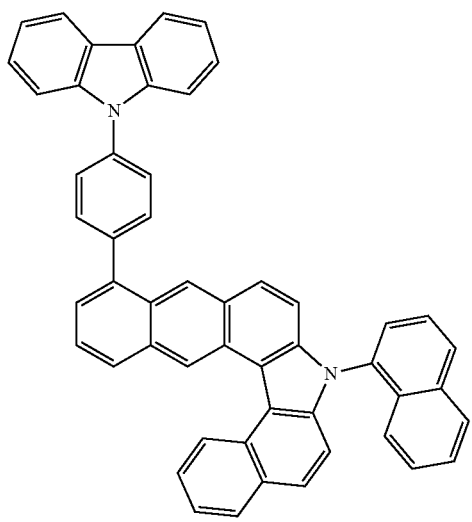
(156)
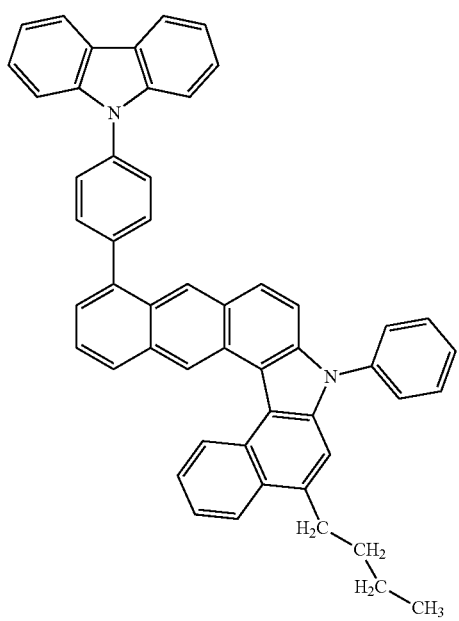
(157)
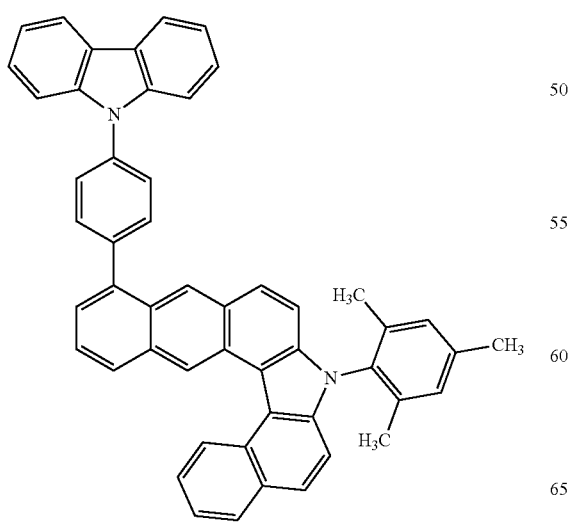
[Chemical Formulae 23]
(158)
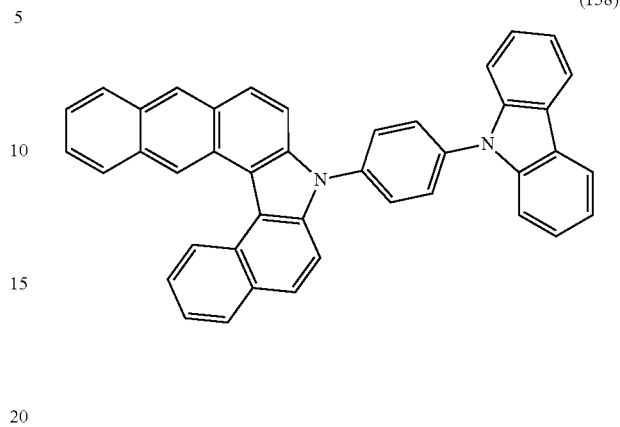
(159)
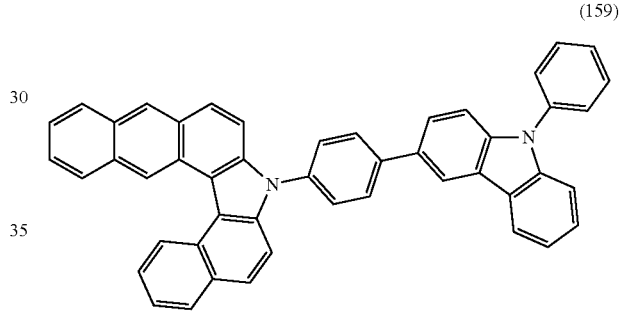
(160)
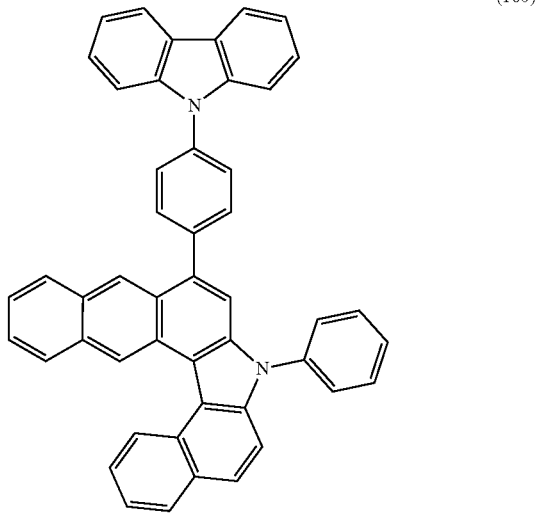

(161) 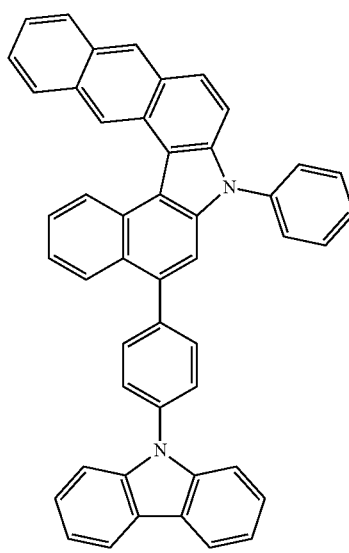

(162) 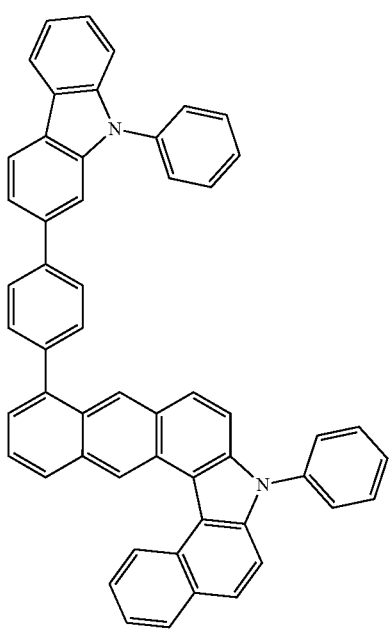

(163) 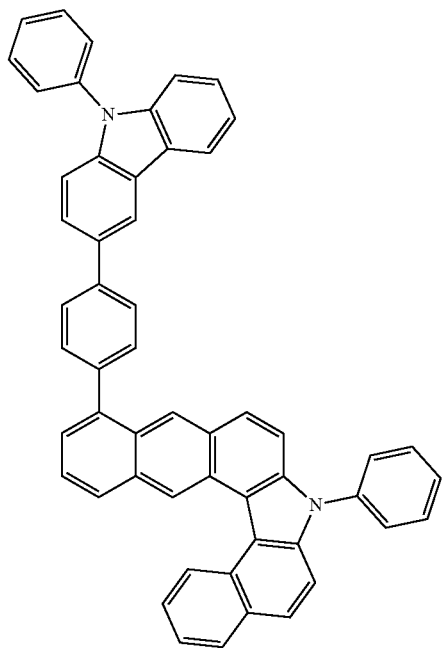

(164) 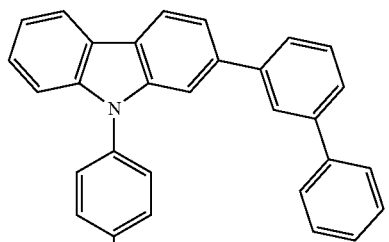

<Synthesis Method 1 of Organic Compound>

The organic compound represented by General Formula (G2) can be synthesized by Synthesis Schemes (A-1) to (A-3) below.

[Step 1]

As shown in Synthesis Scheme (A-1) below, a cross coupling reaction between a compound 1 and a compound 2 is caused to obtain a compound 3. Specifically, the compound 3 can be obtained by the Suzuki-Miyaura coupling reaction.

[Chemical Formulae 24]

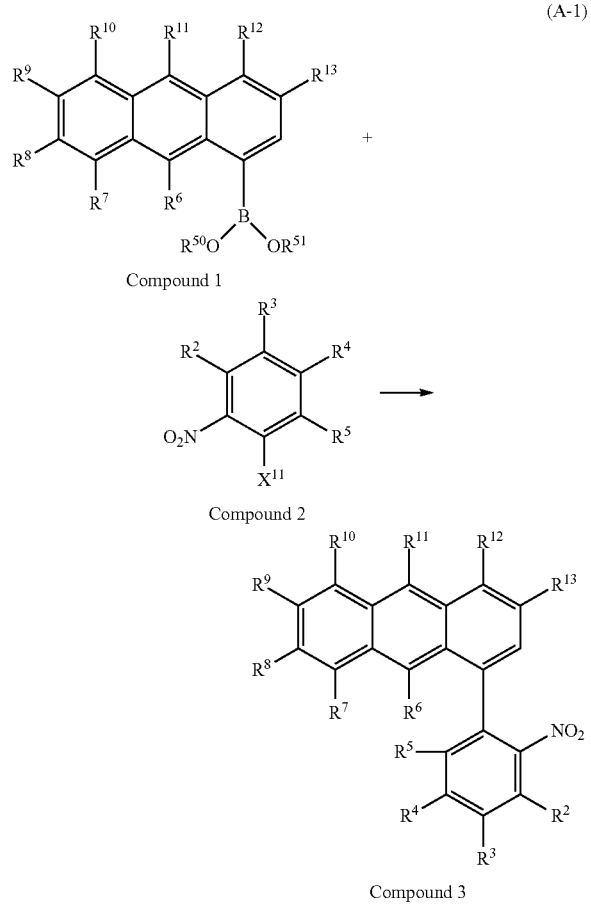

Compound 1

Compound 2

Compound 3

An organoboron compound of an anthracene derivative or boronic acid of an anthracene derivative can be used as the compound 1. Note that a substituent $R^{50}$ and a substituent $R^{51}$ may be bonded to each other to form a ring.

A halide of a nitrobenzene derivative or a nitrobenzene derivative having triflate as a substituent can be used as the compound 2. Note that $X^{11}$ represents halogen or a triflate group.

The substituents $R^2$ to $R^{13}$ each independently represent hydrogen, an alkyl group, a cyclic alkyl group, or a substituted or unsubstituted aryl group. The number of carbon atoms is 1 or more and 6 or less when the substituent is an alkyl group, 3 or more and 7 or less when the substituent is a cyclic alkyl group, and 6 or more and 13 or less when the substituent is an aryl group.

The substituents $R^2$ to $R^{13}$ may each have the substituent represented by General Formula (G3). Note that Ar represents a substituted or unsubstituted arylene group, and the arylene group has 6 to 13, inclusive, carbon atoms. In addition, A represents a substituted or unsubstituted 9H-carbazolyl group or a substituted or unsubstituted anthryl group.

[Chemical Formula 25]

—Ar-A (G3)

In Synthesis Scheme (A-1), for example, palladium(II) acetate, tetrakis(triphenylphosphine)palladium(0), or bis(triphenylphosphine)palladium(II) dichloride can be used as a palladium catalyst.

In addition, for example, tri(ortho-tolyl)phosphine, triphenylphosphine, or tricyclohexylphosphine can be used as a ligand of the palladium catalyst.

As a base, an organic base such as sodium tert-butoxide, an inorganic base such as potassium carbonate or sodium carbonate, or the like can be used.

As a reaction solvent, a mixed solvent of toluene and water, a mixed solvent of xylene and water, a mixed solvent of benzene and water, a mixed solvent of water and an ether such as ethylene glycol dimethyl ether, or the like can be used.

In addition, as the reaction solvent, a mixed solvent of toluene, water, and alcohol such as ethanol, a mixed solvent of xylene, water, and alcohol such as ethanol, a mixed solvent of benzene, water, and alcohol such as ethanol, or the like can be used. In particular, a mixed solvent of toluene and water, a mixed solvent of toluene, water, and ethanol, or a mixed solvent of water and an ether such as ethylene glycol dimethyl ether is preferred.

Note that the Suzuki-Miyaura coupling reaction between a halide of an anthracene derivative or an anthracene derivative having triflate as a substituent and an organoboron compound of a nitrobenzene derivative or boronic acid of a nitrobenzene derivative may be caused to obtain the compound 3.

A cross-coupling reaction using an organoaluminum, organozirconium, organozinc, or organotin compound or the like instead of the organoboron compound or boronic acid may be employed.

[Step 2]

As shown in Synthesis Scheme (A-2) below, the compound 3 is cyclized to obtain a compound 4. Specifically, the compound 3 is cyclized by the Cadogan reaction, whereby a naphtho[2,3-c]carbazole derivative (the compound 4) can be obtained.

[Chemical Formulae 26]

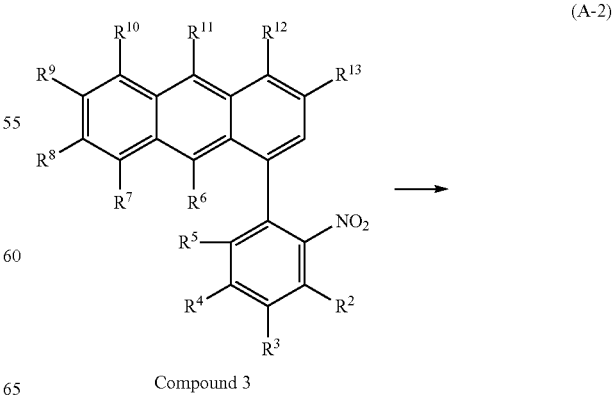

Compound 3

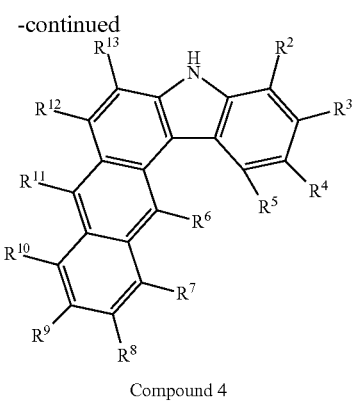

Compound 4

In Synthesis Scheme (A-2), for example, tri(ortho-tolyl)phosphine, triphenylphosphine, tricyclohexylphosphine, or triethoxyphosphine can be used.

Furthermore, for example, toluene, xylene, or o-dichlorobenzene can be used for a solvent.

A naphtho[2,3-c]carbazole ring may be synthesized by the Graebe-Ullmann method or the Fischer-Borsche method.

[Step 3]

As shown in Synthesis Scheme (A-3) below, a cross coupling reaction between the compound 4 and a compound 5 is caused to obtain a target substance. Specifically, a target compound (G2) can be obtained by the Ullmann coupling reaction.

In Synthesis Scheme (A-3), a copper compound or copper can be used for the Ullmann reaction. For example, copper (I) iodide or copper(II) acetate can be used as the copper compound.

As a base, an inorganic base such as potassium carbonate can be used, for example.

As a reaction solvent, 1,3-dimethyl-3,4,5,6-tetrahydro-2 (1H)-pyrimidinone (abbreviation: DMPU), toluene, xylene, benzene, or the like can be used. In the Ullmann reaction, the target substance can be obtained in a shorter time and in a higher yield when the reaction temperature is 100° C. or higher; therefore, it is preferable to use xylene or DMPU, which have high boiling temperatures. In particular, the reaction temperature is further preferably 150° C. or higher, and DMPU is more preferred.

Instead of the Ullmann reaction, the Hartwig-Buchwald reaction or the like can be employed.

<Synthesis Method 2 of Organic Compound>

The organic compound represented by General Formula (G4) can be synthesized by Synthesis Schemes (B-1) to (B-3) below.

[Step 1]

As shown in Synthesis Scheme (B-1) below, a cross coupling reaction between a compound 6 and a compound 7 is caused to obtain a compound 8. Specifically, the compound 8 can be obtained by the Suzuki-Miyaura coupling reaction.

[Chemical Formulae 27]

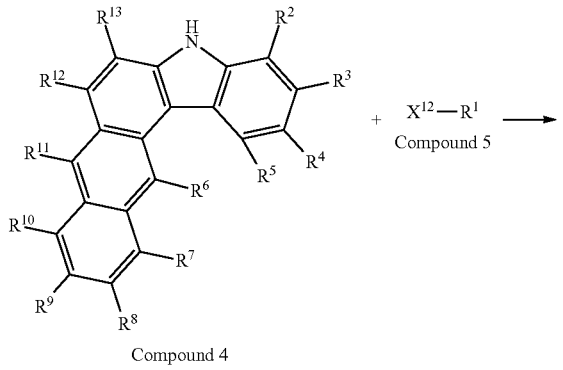

(A-3)

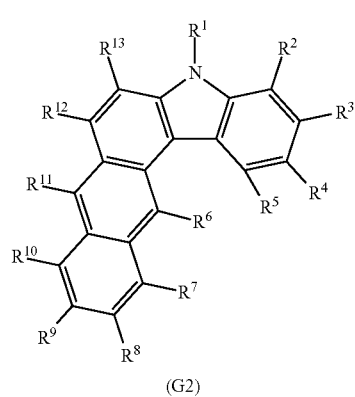

(G2)

A halogenated aromatic compound or an aromatic compound having triflate as a substituent can be used as the compound 5. Note that $X^{12}$ represents halogen or a triflate group.

[Chemical Formulae 28]

[Chemical Formulae 28]

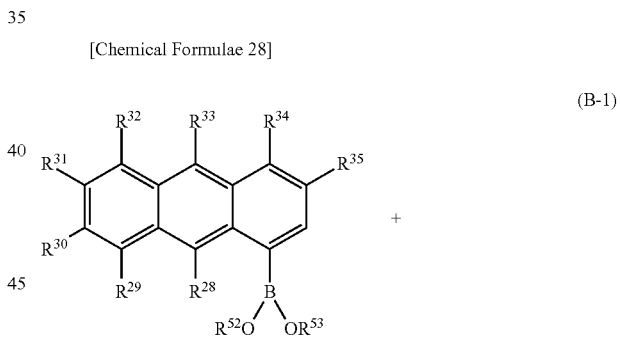

(B-1)

Compound 6

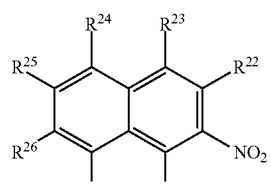

Compound 7

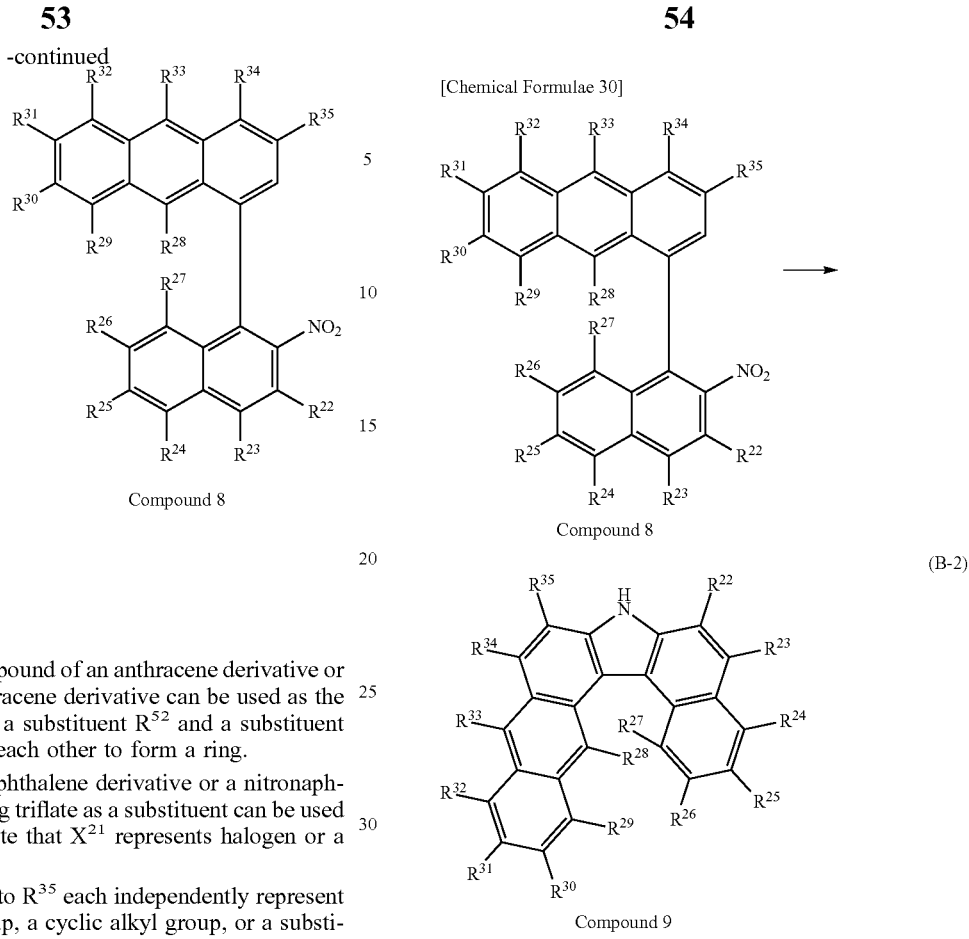

Compound 8

An organoboron compound of an anthracene derivative or boronic acid of an anthracene derivative can be used as the compound 6. Note that a substituent $R^{52}$ and a substituent $R^{53}$ may be bonded to each other to form a ring.

A halide of a nitronaphthalene derivative or a nitronaphthalene derivative having triflate as a substituent can be used as the compound 7. Note that $X^{21}$ represents halogen or a triflate group.

The substituents $R^{22}$ to $R^{35}$ each independently represent hydrogen, an alkyl group, a cyclic alkyl group, or a substituted or unsubstituted aryl group. The number of carbon atoms is 1 or more and 6 or less when the substituent is an alkyl group, 3 or more and 7 or less when the substituent is a cyclic alkyl group, and 6 or more and 13 or less when the substituent is an aryl group.

The substituents $R^{22}$ to $R^{35}$ may each have the substituent represented by General Formula (G3). Note that Ar represents a substituted or unsubstituted arylene group, and the arylene group has 6 to 13, inclusive, carbon atoms. In addition, A represents a substituted or unsubstituted 9H-carbazolyl group or a substituted or unsubstituted anthryl group.

[Chemical Formula 29]

—Ar-A    (G3)

Note that the method described in Step 1 of Synthesis method 1 of an organic compound can be applied to Synthesis Scheme (B-1).

Note that the Suzuki-Miyaura coupling reaction between a halide of an anthracene derivative or an anthracene derivative having triflate as a substituent and an organoboron compound of a nitronaphthalene derivative or boronic acid of a nitronaphthalene derivative may be caused to obtain the compound 8.

[Step 2]

As shown in Synthesis Scheme (B-2) below, the compound 8 is cyclized to obtain a compound 9. Specifically, the compound 8 is cyclized by the Cadogan reaction, whereby a benzo[c]naphtho[2,3-g]carbazole derivative (the compound 9) can be obtained.

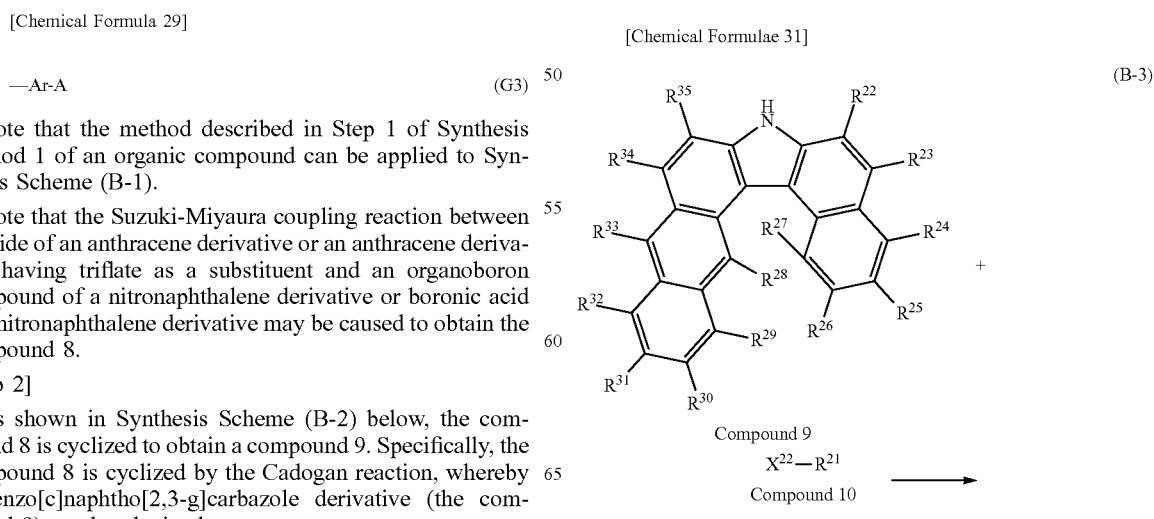

Note that the method described in Step 2 of Synthesis method 1 of an organic compound can be applied to Synthesis Scheme (B-2).

[Step 3]

As shown in Synthesis Scheme (B-3) below, a cross coupling reaction between the compound 9 and a compound 10 is caused to obtain a target substance. Specifically, a target compound (G4) can be obtained by the Ullmann coupling reaction.

-continued

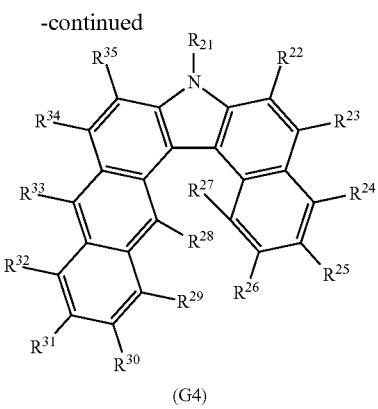

(G4)

A halogenated aromatic compound or an aromatic compound having triflate as a substituent can be used as the compound 10. Note that $X^{22}$ represents halogen or a triflate group.

Note that the method described in Step 3 of Synthesis method 1 of an organic compound can be applied to Synthesis Scheme (B-3).

Note that this embodiment can be combined with any of the other embodiments in this specification as appropriate.

Embodiment 2

Figure 1B:
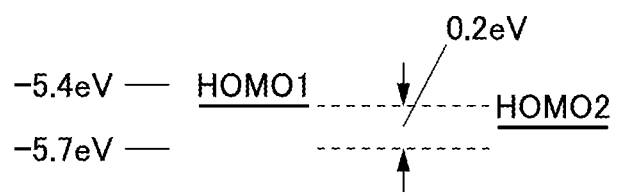

In this embodiment, a structure of a light-emitting device 150 of one embodiment of the present invention will be described with reference to FIGS. 1A and 1B.
<Structure Example of Light-Emitting Device 150>

The light-emitting device 150 described in this embodiment includes an electrode 101, an electrode 102, and a unit 103. The electrode 102 includes a region overlapping with the electrode 101 and the unit 103 includes a region between the electrode 101 and the electrode 102.
<Structure Example of Unit 103>

The unit 103 has a single-layer structure or a stacked-layer structure. The unit 103 includes a layer 111, a layer 112, and a layer 113, for example (see FIG. 1A).

The layer 111 includes a region between the layer 112 and the layer 113, the layer 112 includes a region between the electrode 101 and the layer 111, and the layer 113 includes a region between the electrode 102 and the layer 111.

The unit 103 can include, for example, a layer selected from functional layers such as a light-emitting layer, a hole-transport layer, an electron-transport layer, and a carrier-blocking layer. The unit 103 can include a layer selected from functional layers such as a hole-injection layer, an electron-injection layer, an exciton-blocking layer, and a charge-generation layer.
<Structure Example 1 of Layer 111>

A light-emitting material and a host material can be used for the layer 111, for example. The layer 111 can be referred to as a light-emitting layer. Note that the layer 111 is preferably provided in a region where holes and electrons are recombined. Thus, energy generated by recombination of carriers can be efficiently converted into light and emitted. Furthermore, the layer 111 is preferably provided to be distanced from a metal used for the electrode or the like. Thus, a quenching phenomenon caused by the metal used for the electrode or the like can be inhibited.

A carrier-transport material, e.g., a charge-transport material CTM can be used as the host material. Specifically, any of the organic compounds described in Embodiment 1 can be used as the charge-transport material CTM. As the host material, it is preferable to use a material having a wider bandgap than the light-emitting material contained in the layer 111, i.e., a material having a higher excitation energy from S0 to S1 than the light-emitting material contained in the layer 111. Thus, transfer of energy from excitons generated in the layer 111 to the host material can be suppressed.
<<Structure Example 2 of Layer 111>>

A fluorescent substance can be used as the light-emitting material, for example. Thus, energy generated by recombination of carriers can be released as light EL1 from the light-emitting material (see FIG. 1A).
[Fluorescent Substance]

A fluorescent substance can be used for the layer 111. For example, any of the organic compounds described in Embodiment 1 can also be used as the fluorescent substance. Moreover, fluorescent substances described below as examples can be used for the layer 111. Note that one embodiment of the present invention is not limited to this.

Specifically, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N'-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carb azol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenedi amine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI, 2-{2-tert-butyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02), or the like.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Structure Example 1 of Layer 113

An electron-transport material, a material having an anthracene skeleton, and a mixed material can be used for the layer 113, for example. The layer 113 can be referred to as an electron-transport layer. A material having a wider bandgap than the light-emitting material contained in the layer 111 is preferably used for the layer 113. Thus, transfer of energy from excitons generated in the layer 111 to the layer 113 can be suppressed.

[Electron-Transport Material]

As the electron-transport material, any of the organic compounds described in Embodiment 1, a metal complex, and an organic compound having a π-electron deficient heteroaromatic ring skeleton can be used. Each of the organic compounds described in Embodiment 1 has a high electron-transport property and can reduce the driving voltage of the light-emitting device, and thus is preferable.

As the electron-transport material, a material having an electron mobility higher than or equal to $1 \times 10^{-7}$ cm$^2$/Vs and lower than or equal to $5 \times 10^{-5}$ cm$^2$/Vs when the square root of the electric field strength [V/cm] is 600 can be suitably used. In this case, the electron-transport property in the electron-transport layer can be suppressed. Alternatively, the amount of electrons injected into the light-emitting layer can be controlled. Alternatively, the light-emitting layer can be prevented from having excess electrons.

As the metal complex, bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As the organic compound having a π-electron deficient heteroaromatic ring skeleton, a heterocyclic compound having a polyazole skeleton, a heterocyclic compound having a diazine skeleton, a heterocyclic compound having a pyridine skeleton, or a heterocyclic compound having a triazine skeleton can be used, for example. In particular, the heterocyclic compound having a diazine skeleton and the heterocyclic compound having a pyridine skeleton have favorable reliability and thus are preferable. In addition, the heterocyclic compound having a diazine (pyrimidine or pyrazine) skeleton has a high electron-transport property to contribute to a reduction in driving voltage.

As the heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II) can be used, for example.

As the heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDB q), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazolin (abbreviation: 4,8mDBtP2Bqn) can be used, for example.

As the heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As the heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used for the layer 113. In particular, an organic compound having both an anthracene skeleton and a heterocyclic skeleton can be suitably used.

For example, an organic compound having both an anthracene skeleton and a nitrogen-containing five-membered ring skeleton can be used. Alternatively, an organic compound having both an anthracene skeleton and a nitrogen-containing five-membered ring skeleton including two heteroatoms in a ring can be used. Specifically, a pyrazole ring, an imidazole ring, an oxazole ring, a thiazole ring, or the like can be suitably used as the heterocyclic skeleton.

For example, an organic compound having both an anthracene skeleton and a nitrogen-containing six-membered ring skeleton can be used. Alternatively, an organic compound having both an anthracene skeleton and a nitrogen-containing six-membered ring skeleton including two heteroatoms in a ring can be used. Specifically, a pyrazine ring, a pyrimidine ring, a pyridazine ring, or the like can be suitably used as the heterocyclic skeleton.

[Structure Example of Mixed Material]

A material in which a plurality of kinds of substances are mixed can be used for the layer 113. Specifically, a mixed material which includes an alkali metal, an alkali metal compound, or an alkali metal complex and an electron-transport substance can be used for the layer 113. Note that the electron-transport material preferably has a HOMO level of −6.0 eV or higher.

The mixed material can be suitably used for the layer 113 in combination with a structure using a composite material for a layer 104. For example, a composite material of an acceptor substance and a hole-transport material can be used for the layer 104. Specifically, a composite material of an acceptor substance and a substance having a relatively deep HOMO1, which is from −5.7 eV through −5.4 eV, can be used for the layer 104 (see FIG. 1B). In particular, the mixed material can be suitably used for the layer 113 in combination with the structure using the composite material for the layer 104. This leads to an increase in the reliability of the light-emitting device.

Furthermore, a structure using a hole-transport material for the layer 112 is preferably combined with the structure using the mixed material for the layer 113 and the composite material for the layer 104. For example, a substance having a HOMO2, which is differs by −0.2 eV to 0 eV, inclusive, from the relatively deep HOMO1, can be used for the layer 112 (see FIG. 1B). This leads to an increase in the reliability of the light-emitting device.

The concentration of the alkali metal, the alkali metal compound, or the alkali metal complex preferably differs in the thickness direction of the layer 113 (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As a metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

<<Structure Example of Layer 112>>

A hole-transport material can be used for the layer 112, for example. The layer 112 can be referred to as a hole-transport layer. A material having a wider bandgap than the light-emitting material contained in the layer 111 is preferably used for the layer 112. Thus, transfer of energy from excitons generated in the layer 111 to the layer 112 can be suppressed.

[Hole-Transport Material]

A material having a hole mobility of $1 \times 10^{-6}$ cm$^2$/Vs or higher can be suitably used as the hole-transport material. Any of the organic compounds described in Embodiment 1 can also be used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

As the compound having an aromatic amine skeleton, for example, 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: B SPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF) can be used.

As the compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP) can be used.

As the compound having a thiophene skeleton, for example, 4,4',4"-(benzene-1,3,5-triyl)tri(dibenzothiophene) (abbreviation: DBF3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV) can be used.

As the compound having a furan skeleton, for example, 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be used.

Note that this embodiment can be combined with any of the other embodiments in this specification as appropriate.

Embodiment 3

In this embodiment, a structure of the light-emitting device 150 of one embodiment of the present invention is described with reference to FIGS. 1A and 1B.

<Structure Example of Light-Emitting Device 150>

The light-emitting device 150 described in this embodiment includes the electrode 101, the electrode 102, the unit 103, and the layer 104. The electrode 102 includes a region overlapping with the electrode 101, and the unit 103 includes a region between the electrode 101 and the electrode 102. The layer 104 includes a region between the electrode 101 and the unit 103. For example, the structure described in Embodiment 2 can be employed for the unit 103.

<Structure Example of Electrode 101>

For example, a conductive material can be used for the electrode 101. Specifically, a metal, an alloy, a conductive compound, and a mixture of these, or the like can be used for the electrode 101. For example, a material having a work function higher than or equal to 4.0 eV can be suitably used.

For example, indium oxide-tin oxide (ITO: indium tin oxide), indium oxide-tin oxide containing silicon or silicon oxide, indium oxide-zinc oxide, or indium oxide containing tungsten oxide and zinc oxide (IWZO) can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

<<Structure Example of Layer 104>>

A hole-injection material can be used for the layer 104, for example. The layer 104 can be referred to as a hole-injection layer.

Specifically, an acceptor substance can be used for the layer 104. Alternatively, a material in which an acceptor substance and a hole-transport material are combined can be used for the layer 104. This can facilitate the injection of holes from the electrode 101, for example. In addition, the driving voltage of the light-emitting device can be reduced.
[Acceptor Substance]

An organic compound or an inorganic compound can be used as the acceptor substance. The acceptor substance can extract electrons from an adjacent hole-transport layer or a hole-transport material by the application of an electric field.

For example, a compound having an electron-withdrawing group (a halogen or cyano group) can be used as the acceptor substance. Note that an organic compound having an acceptor property is easily evaporated, which facilitates film deposition. Thus, the productivity of the light-emitting device can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the acceptor substance, a molybdenum oxide, a vanadium oxide, a ruthenium oxide, a tungsten oxide, a manganese oxide, or the like can be used.

It is possible to use any of the following materials: phthalocyanine-based complex compounds such as phthalocyanine (abbreviation: H$_2$Pc) and copper phthalocyanine (abbreviation: CuPc); compounds each having an aromatic amine skeleton such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); and the like.

In addition, high molecular compounds such as poly(3,4-ethylenedioxythiophene)/poly(styrenesulfonic acid) (abbreviation: PEDOT/PSS), and the like can be used.
[Structure Example 1 of Composite Material]

A material composed of two or more kinds of substances can be used as the hole-injection material. For example, an acceptor substance and a hole-transport material can be used for the composite material. Accordingly, not only a material having a high work function but also a material having a low work function can also be used for the electrode 101. Alternatively, a material used for the electrode 101 can be selected from a wide range of materials regardless of its work function.

For the hole-transport material in the composite material, for example, a compound having an aromatic amine skeleton, a carbazole derivative, an aromatic hydrocarbon, or a high molecular compound (such as an oligomer, a dendrimer, or a polymer) can be used. A material having a hole mobility of $1 \times 10^{-6}$ cm$^2$/Vs or higher can be suitably used as the hole-transport material in the composite material.

A substance having a relatively deep HOMO level can be suitably used for the hole-transport material in the composite material. Specifically, the HOMO level is preferably higher than or equal to −5.7 eV and lower than or equal to −5.4 eV. Accordingly, hole injection to the unit 103 can be facilitated. Hole injection to the layer 112 can be facilitated. The reliability of the light-emitting device can be increased.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As aromatic hydrocarbon having a vinyl skeleton, for example, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

Furthermore, a substance having any of a carbazole derivative, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With use of a substance including an N,N-bis(4-biphenyl)amino group, the reliability of the light-emitting device can be increased.

Specific examples of the hole-transport material in the composite material include N-(4-biphenyl)-6,N-diphenyl-benzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB 1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

[Structure Example 2 of Composite Material]

For example, a composite material including an acceptor substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104 can be reduced. A layer with a low refractive index can be formed inside the light-emitting device. The external quantum efficiency of the light-emitting device can be improved.

Note that this embodiment can be combined with any of the other embodiments in this specification as appropriate.

Embodiment 4

In this embodiment, a structure of the light-emitting device 150 of one embodiment of the present invention is described with reference to FIGS. 1A and 1B.

<Structure Example of Light-Emitting Device 150>

The light-emitting device 150 described in this embodiment includes the electrode 101, the electrode 102, the unit 103, and a layer 105. The electrode 102 includes a region overlapping with the electrode 101, and the unit 103 includes a region between the electrode 101 and the electrode 102. The layer 105 includes a region between the unit 103 and the electrode 102. For example, the structure described in Embodiment 2 can be employed for the unit 103.

<Structure Example of Electrode 102>

For example, a conductive material can be used for the electrode 102. Specifically, a metal, an alloy, a conductive compound, a mixture of these, or the like can be used for the electrode 102. For example, a material with a lower work function than the electrode 101 can be suitably used for the electrode 102. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 102.

Specifically, an element such as lithium (Li) or cesium (Cs), an element such as magnesium (Mg), calcium (Ca), or strontium (Sr), a metal such as europium (Eu) or ytterbium (Yb), or the like or an alloy containing any of these elements such as MgAg or AlLi can be used for the electrode 102.

<<Structure Example of Layer 105>>

An electron-injection material can be used for the layer 105, for example. The layer 105 can be referred to as an electron-injection layer.

Specifically, a donor substance can be used for the layer 105. Alternatively, a material in which a donor substance and an electron-transport material are combined can be used for the layer 105. Alternatively, electride can be used for the layer 105. This can facilitate the injection of electrons from the electrode 102, for example. Alternatively, not only a material having a low work function but also a material having a high work function can also be used for the electrode 102. Alternatively, a material used for the electrode 102 can be selected from a wide range of materials regardless of its work function. Specifically, Al, Ag, ITO, indium oxide-tin oxide containing silicon or silicon oxide, and the like can be used for the electrode 102. In addition, the driving voltage of the light-emitting device can be reduced.

[Donor Substance]

For example, an alkali metal, an alkaline earth metal, a rare earth metal, or a compound thereof (an oxide, a halide, a carbonate, or the like) can be used for the donor substance. Alternatively, an organic compound such as tetrathianaphthacene (abbreviation: TTN), nickelocene, or decamethylnickelocene can be used as the donor substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride (CaF$_2$) or the like can be used.

[Structure Example 1 of Composite Material]

A material composed of two or more kinds of substances can be used as the electron-injection material. For example, a donor substance and an electron-transport material can be used for the composite material.

[Electron-Transport Material]

For example, an electron-transport material capable of being used for the unit 103 can be used as the composite material.

[Structure Example 2 of Composite Material]

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or an alkaline earth metal at 50 wt % or higher can be suitably used. Alternatively, a composite material including an organic compound having a bipyridine skeleton can be suitably used. Thus, the refractive index of the layer 104 can be reduced. The external quantum efficiency of the light-emitting device can be improved.

[Electride]

For example, a substance obtained by adding electrons at high concentration to an oxide where calcium and aluminum are mixed can be used, for example, as the electron-injection material.

Note that this embodiment can be combined with any of the other embodiments in this specification as appropriate.

Embodiment 5

In this embodiment, a structure of the light-emitting device 150 of one embodiment of the present invention is described with reference to FIG. 2A.

Figure 2A:
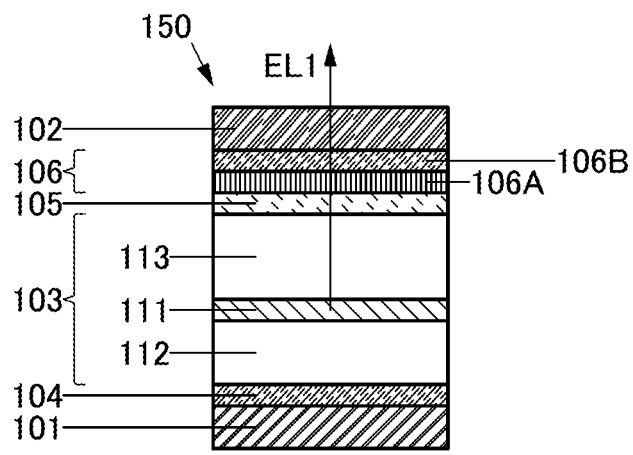
FIGS. 2A and 2B illustrate structures of a light-emitting device of an embodiment.

FIG. 2A is a cross-sectional view illustrating a structure of a light-emitting device of one embodiment of the present invention.

<Structure Example of Light-Emitting Device 150>

The light-emitting device 150 described in this embodiment includes the electrode 101, the electrode 102, the unit 103, and an intermediate layer 106 (see FIG. 2A). The electrode 102 includes a region overlapping with the electrode 101, and the unit 103 includes a region between the electrode 101 and the electrode 102. The intermediate layer 106 includes a region between the unit 103 and the electrode 102.

<<Structure Example of Intermediate Layer 106>>

The intermediate layer 106 includes a layer 106A and a layer 106B. The layer 106B includes a region between the layer 106A and the electrode 102.

<<Structure Example of Layer 106A>>

For example, an electron-transport material can be used for the layer 106A. The layer 106A can be referred to as an electron-relay layer. With the layer 106A, a layer that is on the anode side and in contact with the layer 106A can be distanced from a layer that is on the cathode side and in contact with the layer 106A. Interaction between the layer that is on the anode side and in contact with the layer 106A and the layer that is on the cathode side and in contact with the layer 106A can be reduced. Electrons can be smoothly supplied to the layer that is on the anode side and in contact with the layer 106A.

A substance whose LUMO level is positioned between the LUMO level of the acceptor substance included in the layer that is on the anode side and in contact with the layer 106A and the LUMO level of the substance included in the layer that is on the cathode side and in contact with the layer 106A can be suitably used for the layer 106A.

For example, a material having a LUMO level in a range higher than or equal to −5.0 eV, preferably higher than or equal to −5.0 eV and lower than or equal to −3.0 eV, can be used for the layer 106A.

Specifically, a phthalocyanine-based material can be used for the layer 106A. In addition, a metal complex having a metal-oxygen bond and an aromatic ligand can be used for the layer 106A.

<<Structure Example of Layer 106B>>

For example, a material that supplies electrons to the anode side and supplies holes to the cathode side when voltage is applied can be used for the layer 106B. Specifically, electrons can be supplied to the unit 103 that is positioned on the anode side. The layer 106B can be referred to as a charge-generation layer.

Specifically, a hole-injection material capable of being used for the layer 104 can be used for the layer 106B. For example, a composite material can be used for the layer 106B. Alternatively, for example, a stacked film in which a film including the composite material and a film including a hole-transport material are stacked can be used for the layer 106B.

Note that this embodiment can be combined with any of the other embodiments in this specification as appropriate.

Embodiment 6

In this embodiment, a structure of the light-emitting device 150 of one embodiment of the present invention is described with reference to FIG. 2B.

Figure 2B:
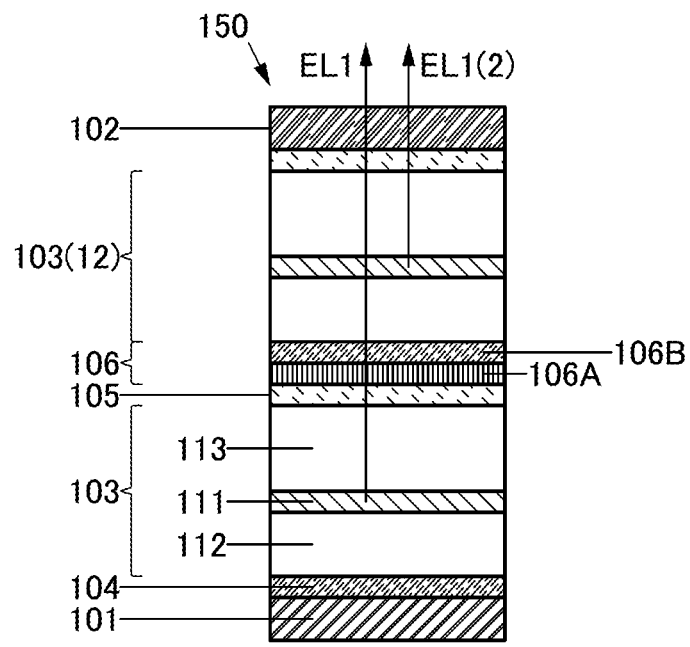

FIG. 2B is a cross-sectional view illustrating a structure of a light-emitting device of one embodiment of the present invention, which is different from that in FIG. 2A.

<Structure Example of Light-Emitting Device 150>

The light-emitting device 150 described in this embodiment includes the electrode 101, the electrode 102, the unit 103, the intermediate layer 106, and a unit 103(12) (see FIG. 2B). The electrode 102 includes a region overlapping with the electrode 101, the unit 103 includes a region between the electrode 101 and the electrode 102, and the intermediate layer 106 includes a region between the unit 103 and the electrode 102. The unit 103(12) includes a region between the intermediate layer 106 and the electrode 102, and the unit 103(12) has a function of emitting light EL1(2).

A structure including the intermediate layer 106 and a plurality of units is referred to as a stacked light-emitting device or tandem light-emitting device in some cases. This structure enables high luminance emission while the current density is kept low. Reliability can be improved. The driving voltage can be reduced in comparison with that of the light-emitting device with the same luminance. The power consumption can be reduced.

<<Structure Example of Unit 103(12)>>

The structure that can be employed for the unit 103 can also be employed for the unit 103(12). In other words, the light-emitting device 150 includes a plurality of units that are stacked. Note that the number of stacked units is not limited to two and may be three or more.

The same structure as the unit 103 can be employed for the unit 103(12). Alternatively, a structure different from the unit 103 can be employed for the unit 103(12).

For example, a structure which exhibits a different emission color from that of the unit 103 can be employed for the unit 103(12). Specifically, the unit 103 emitting red light and green light and the unit 103(12) emitting blue light can be employed. With this structure, a light-emitting device emitting light of a desired color can be provided. A light-emitting device emitting white light can be provided, for example.

<<Structure Example of Intermediate Layer 106>>

The intermediate layer 106 has a function of supplying electrons to one of the unit 103 and the unit 103(12) and supplying holes to the other. For example, the intermediate layer 106 described in Embodiment 5 can be used.

<Fabrication Method of Light-Emitting Device 150>

For example, each of the electrode 101, the electrode 102, the unit 103, the intermediate layer 106, and the unit 103(12) can be formed by a dry process, a wet process, an evaporation method, a droplet discharging method, a coating method, or a printing method. A formation method may differ between components of the device.

Specifically, the light-emitting device 150 can be manufactured with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. Specifically, an indium oxide-zinc oxide film can be formed by a sputtering method using a target obtained by adding indium zinc to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 7

In this embodiment, a structure of a functional panel 700 of one embodiment of the present invention will be described with reference to FIG. 3.

<STRUCTURE EXAMPLE OF FUNCTIONAL PANEL 700>

Figure 3:
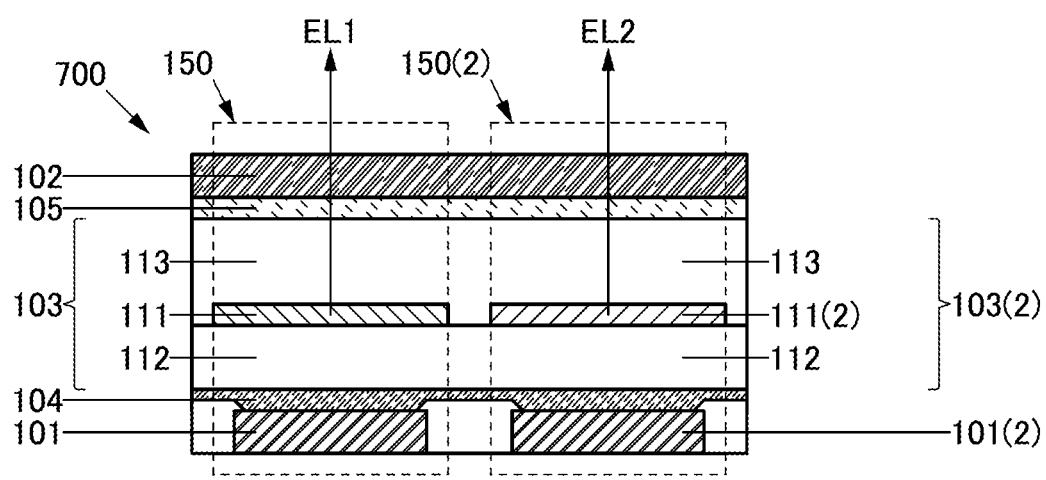
FIG. 3 illustrates a structure of a functional panel of an embodiment.

The functional panel 700 described in this embodiment includes the light-emitting device 150 and a light-emitting device 150(2) (FIG. 3).

For example, the light-emitting device described in any one of Embodiments 2 to 6 can be used as the light-emitting device 150.

<Structure Example of Light-Emitting Device 150(2)>

The light-emitting device 150(2) described in this embodiment includes an electrode 101(2), the electrode 102, and a unit 103(2) (see FIG. 3). The electrode 102 includes a region overlapping with the electrode 101(2), and the unit 103(2) includes a region between the electrode 101(2) and the electrode 102.

The electrode 101(2) can have a potential that is the same as or different from that of the electrode 101. By supplying a different potential, the light-emitting device 150(2) can be driven under conditions different from those for the light-emitting device 150. Note that a material that can be used for the electrode 101 can be used for the electrode 101(2).

The light-emitting device 150(2) includes the layer 104 and the layer 105. The layer 104 includes a region between the electrode 101(2) and the unit 103(2), and the layer 105 includes a region between the unit 103(2) and the electrode 102. Note that a component of the light-emitting device 150 can be used as a component of the light-emitting device 150(2). Thus, the components can be common. The fabrication process can be simplified.

<Structure Example of Unit 103(2)>

The unit 103(2) has a single-layer structure or a stacked-layer structure. The unit 103(2) includes a layer 111(2), the layer 112, and the layer 113, for example (see FIG. 3).

The layer 111(2) includes a region between the layer 112 and the layer 113, the layer 112 includes a region between the electrode 101(2) and the layer 111, and the layer 113 includes a region between the electrode 102 and the layer 111.

The unit 103(2) can include, for example, a layer selected from functional layers such as a light-emitting layer, a hole-transport layer, an electron-transport layer, and a carrier-blocking layer. The unit 103(2) can include a layer selected from functional layers such as a hole-injection layer, an electron-injection layer, an exciton-blocking layer, and a charge-generation layer.

<<Structure Example 1 of Layer 111(2)>>

Either a structure containing a light-emitting material or a structure containing a light-emitting material and a host material can be employed for the layer 111(2), for example. The layer 111(2) can be referred to as a light-emitting layer. Note that the layer 111(2) is preferably provided in a region where holes and electrons are recombined. Thus, energy generated by recombination of carriers can be efficiently converted into light and emitted. Furthermore, the layer 111(2) is preferably provided to be distanced from a metal used for the electrode or the like. Thus, a quenching phenomenon caused by the metal used for the electrode or the like can be inhibited.

For example, a light-emitting material different from the light-emitting material used for the layer 111 can be used for the layer 111(2). Specifically, a light-emitting material, whose emission color is different from the emission color of the light-emitting material used for the layer 111, can be used for the layer 111(2). Thus, light-emitting devices with different hues can be provided. A plurality of light-emitting devices with different hues can be used to perform additive color mixing. Alternatively, it is possible to express a color of a hue that an individual light-emitting device cannot display.

For example, a light-emitting device that emits blue light, a light-emitting device that emits green light, and a light-emitting device that emits red light can be provided in the functional panel 700. Alternatively, a light-emitting device that emits white light, a light-emitting device that emits yellow light, and a light-emitting device that emits infrared rays can be provided in the functional panel 700.

<<STRUCTURE EXAMPLE 2 OF LAYER 111(2)>>

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as light EL2 from the light-emitting material (see FIG. 3).

[Fluorescent Substance]

For example, a fluorescent substance that can be used for the layer 111 can be used for the layer 111(2). Note that one embodiment of the present invention is not limited to this.

[Phosphorescent Substance]

A phosphorescent substance can be used for the layer 111(2). For example, phosphorescent substances described below as examples can be used for the layer 111(2). Note that one embodiment of the present invention is not limited to this.

Any of the following can be used for the layer 111(2): an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato]iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$] iridium(III) picolinate (abbreviation: FIrpic), bis{2-[3',5'-bis(trifluoromethyl)phenyl]pyridinato-N,$C^{2'}$}iridium(III) picolinate (abbreviation: Ir(CF$_3$ppy)$_2$(pic)), bis[2-(4',6'-difluorophenyl)pyridinato-N,$C^{2'}$]iridium(III) acetylacetonate (abbreviation: FIracac), or the like can be used.

These substances are compounds exhibiting blue phosphorescence and having an emission wavelength peak at 440 nm to 520 nm.

[Phosphorescent Substance (Green)]

As an organometallic iridium complex having a pyrimidine skeleton or the like, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis(4,6-diphenylpyrimidinato)iridium(III) (abbreviation: [Ir(dppm)$_2$(acac)]), or the like can be used.

As an organometallic iridium complex having a pyrazine skeleton or the like, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-d$_3$-methyl-8-(2-pyridinyl-κN)benzofuro[2,3-b]pyridine-κC]bis[2-(5-d$_3$-methyl-2-pyridinyl-κ$N^2$)phenyl-κC]iridium(III) (abbreviation: [Ir(5mppy-d$_3$)$_2$(mbfpypy-d$_3$)]), [2-d$_3$-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d$_3$)]), or the like can be used.

Examples of a rare earth metal complex are tris(acetylacetonato) (monophenanthroline)terbium(III) (abbreviation: Tb(acac)$_3$(Phen)), and the like.

These are compounds that mainly exhibit green phosphorescence and have an emission wavelength peak at 500 nm to 600 nm. Note that an organometallic iridium complex having a pyrimidine skeleton has distinctively high reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), bis[4,6-di(naphthalen-1-yl)pyrimidinato](dipivaloylmethanato)iridium(III) (abbreviation: Ir(d1pm)$_2$(dpm)), or the like can be used.

As an organometallic iridium complex having a pyrazine skeleton or the like, (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: Ir(tppr)$_2$(dpm)), (acetylacetonato)bis[2,3-bis(4-fluorophenyl)quinoxalinato]iridium(III) (abbreviation: [Ir(Fdpq)$_2$(acac)]), or the like can be used.

As an organometallic iridium complex having a pyridine skeleton or the like, tris(1-phenylisoquinolinato-N,$C^{2'}$)

iridium(III) (abbreviation: [Ir(piq)₃]), bis(1-phenylisoquinolinato-N,C²')iridium(III) acetylacetonate (abbreviation: [Ir(piq)₂(acac)]), or the like can be used.

As a rare earth metal complex or the like, tris(1,3-diphenyl-1,3-propanedionato) (monophenanthroline)europium(III) (abbreviation: Eu(DBM)₃(Phen)), tris[1-(2-thenoyl)-3,3,3-trifluoroacetonato] (monophenanthroline)europium(III) (abbreviation: Eu(TTA)₃(Phen)), or the like can be used.

As a platinum complex or the like, 2,3,7,8,12,13,17,18-octaethyl-21H,23H-porphyrin platinum(II) (abbreviation: PtOEP) or the like can be used.

These compounds emit red phosphorescence having an emission peak at 600 nm to 700 nm. Furthermore, the organometallic iridium complexes having a pyrazine skeleton can provide red light emission with chromaticity favorably used for display devices.

[Substance Exhibiting Thermally Activated Delayed Fluorescence (TADF)]

A TADF material can be used for the layer 111(2). For example, any of the TADF materials given below can be used as the light-emitting material. Note that one embodiment of the present invention is not limited to this.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Specifically, the following materials whose structural formulae are shown below can be used: a protoporphyrin-tin fluoride complex (SnF₂(Proto IX)), a mesoporphyrin-tin fluoride complex (SnF2(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), an octaethylporphyrin-platinum chloride complex (PtCl₂OEP), and the like.

[Chemical Formulae 32]

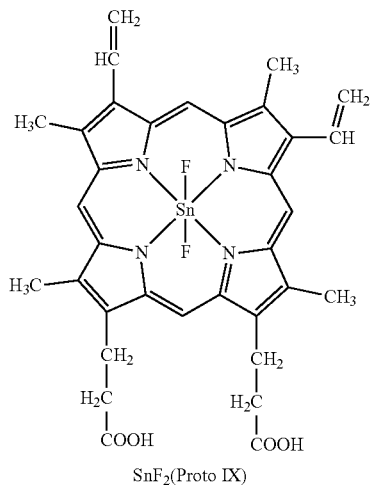

SnF₂(Proto IX)

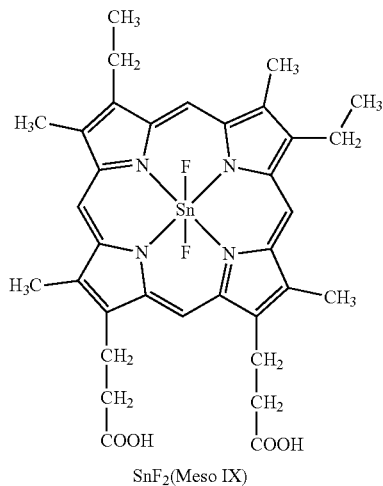

SnF₂(Meso IX)

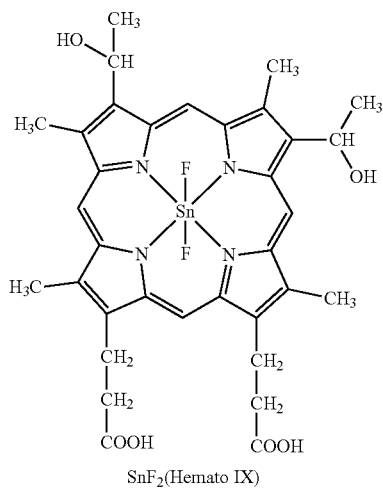

SnF₂(Hemato IX)

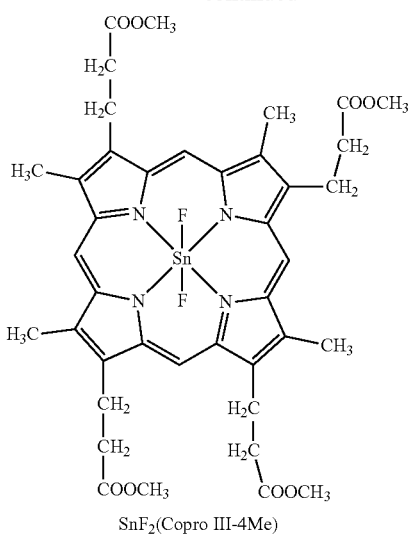

SnF₂(Copro III-4Me)

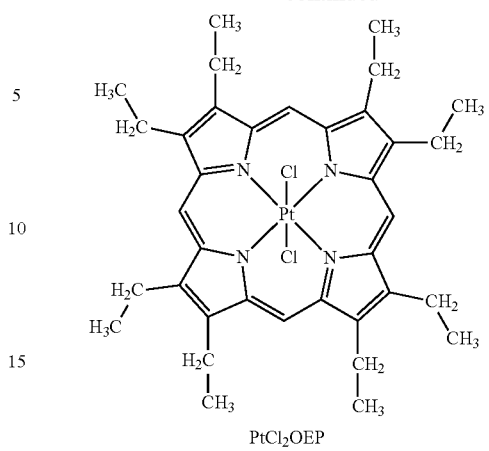

PtCl₂OEP

Furthermore, a heterocyclic compound including one or both of a π-electron rich heteroaromatic ring and a π-electron deficient heteroaromatic ring can be used, for example, for the TADF material.

Specifically, the following compounds whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

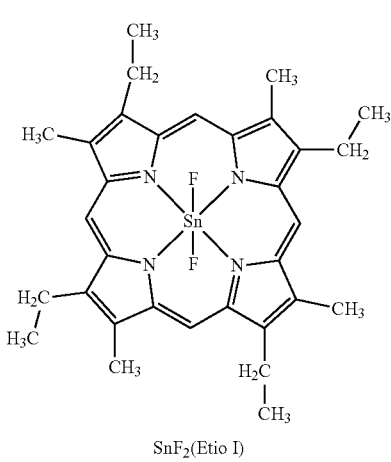

SnF₂(OEP)

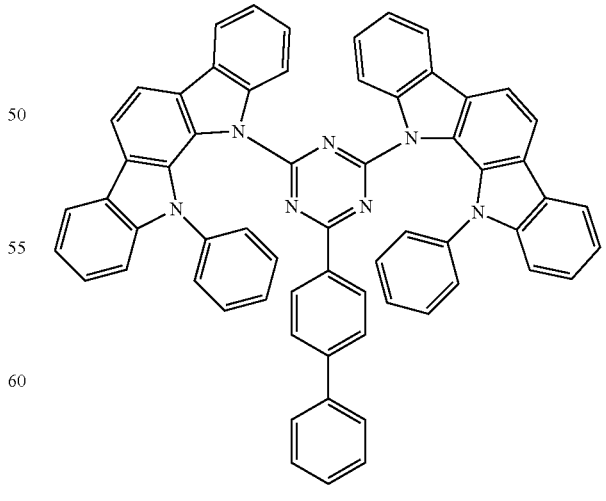

[Chemical Formulae 33]

PIC-TRZ

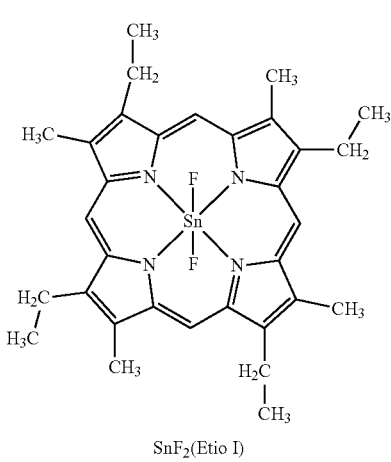

SnF₂(Etio I)

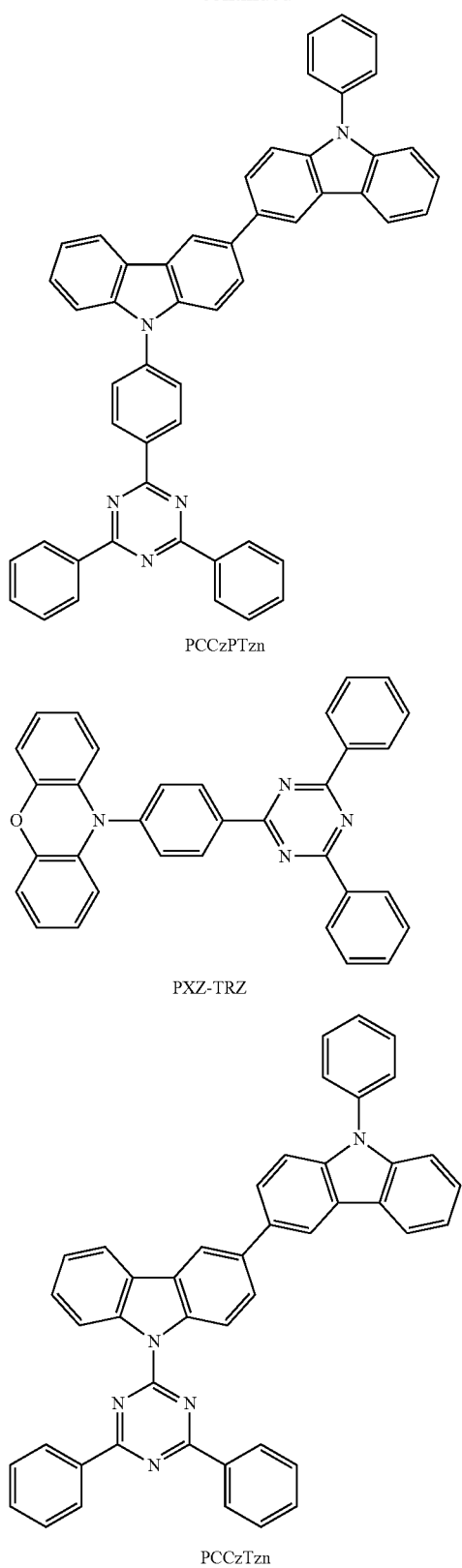

PCCzPTzn

PXZ-TRZ

PCCzTzn

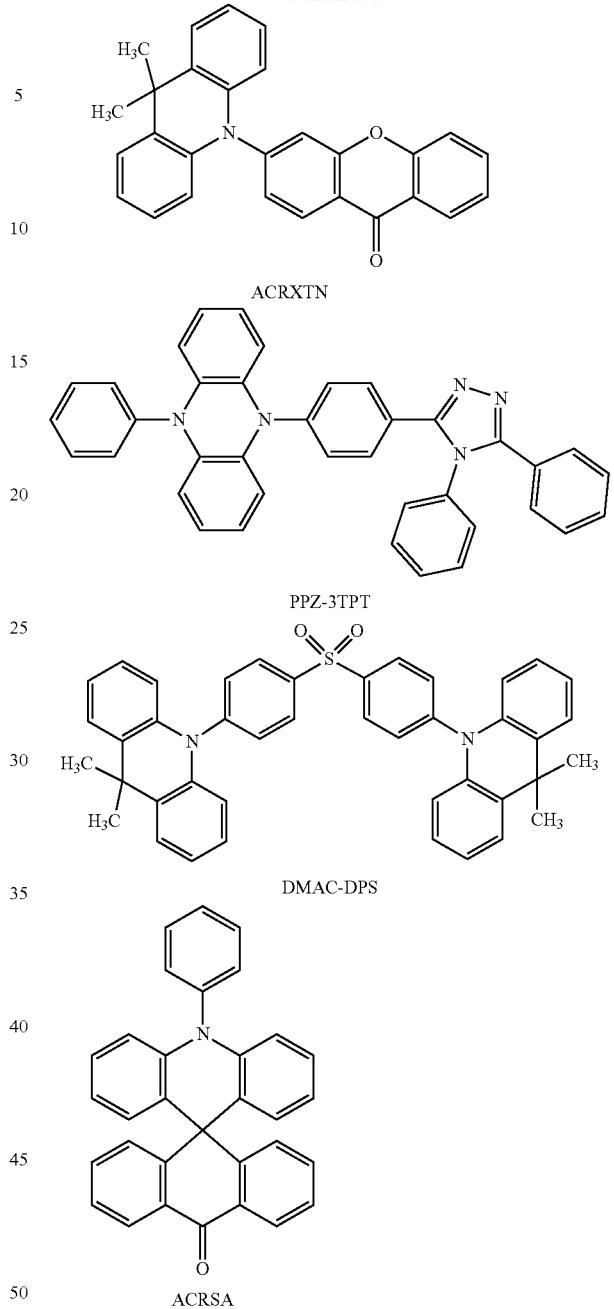

ACRXTN

PPZ-3TPT

DMAC-DPS

ACRSA

Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

<<Structure Example 3 of Layer 111(2)>>

A carrier-transport material can be used as the host material. For example, a hole-transport material, an electron-transport material, a TADF material, a material having an anthracene skeleton, or a mixed material can be used as the host material. A material having a wider bandgap than the light-emitting material contained in the layer 111(2) is preferably used as the host material. Thus, transfer of energy from excitons generated in the layer 111(2) to the host material can be suppressed.

[Hole-Transport Material]

A material having a hole mobility of $1\times10^{-6}$ cm$^2$/Vs or higher can be suitably used as the hole-transport material.

For example, a hole-transport material that can be used for the layer 112 can be used for the layer 111. Specifically, a hole-transport material that can be used for the hole-transport layer can be used for the layer 111.

[Electron-Transport Material]

For example, an electron-transport material that can be used for the layer 113 can be used for the layer 111. Specifically, an electron-transport material that can be used for the electron-transport layer can be used for the layer 111.

[Material Having Anthracene Skeleton]

An organic compound having an anthracene skeleton can be used as the host material. An organic compound having an anthracene skeleton is particularly preferable in the case where a fluorescent substance is used as a light-emitting material. Thus, a light-emitting device with high emission efficiency and high durability can be achieved.

Among the organic compounds having an anthracene skeleton, an organic compound having a diphenylanthracene skeleton, in particular, a substance having a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferably used as the host material.

Examples of the substances that can be used include 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-βNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 3-[4-(1-naphthyl)-phenyl]-9-phenyl-9H-carbazole (abbreviation: PCPN), and the like.

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10, inclusive, carbon atoms, a substituted or unsubstituted cycloalkyl group having 3 to 10, inclusive, carbon atoms, and a trialkylsilyl group having 3 to 10, inclusive, carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier-transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

[Structure Example 1 of Mixed Material]

A material in which a plurality of kinds of substances are mixed can be used as the host material. For example, a material which includes an electron-transport material and a hole-transport material can be used as the mixed material. In the mixed material, the weight ratio of the hole-transport material to the electron-transport material can be 1:19 to 19:1. Thus, the carrier-transport property of the layer 111(2) can be easily adjusted and a recombination region can be easily controlled.

[Structure Example 2 of Mixed Material]

In addition, a material mixed with a phosphorescent substance can be used as the host material. When a fluorescent substance is used as the light-emitting substance, a phosphorescent substance can be used as an energy donor for supplying excitation energy to the fluorescent substance.

A mixed material containing a material to form an exciplex can be used as the host material. For example, a material in which an emission spectrum of a formed exciplex overlaps with a wavelength of the absorption band on the lowest energy side of the light-emitting substance can be used as the host material. This enables smooth energy transfer and improves emission efficiency. The driving voltage can be suppressed.

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The LUMO level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to a longer wavelength side than the emission spectra of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the hole-transport material, the electron-transport material, and the mixed film of the materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

Note that this embodiment can be combined with any of the other embodiments in this specification as appropriate.

Embodiment 8

In this embodiment, a structure of the functional panel 700 of one embodiment of the present invention will be described with reference to FIGS. 4A to 4C.

<Structure Example 1 of Functional Panel 700>

Figure 4A:
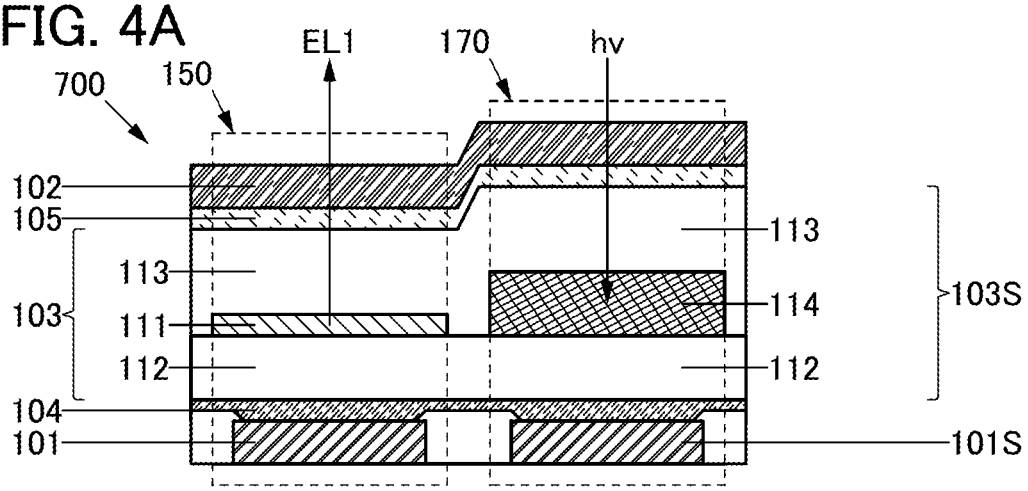
FIGS. 4A to 4C illustrate structures of a functional panel of an embodiment.
Figure 4B:
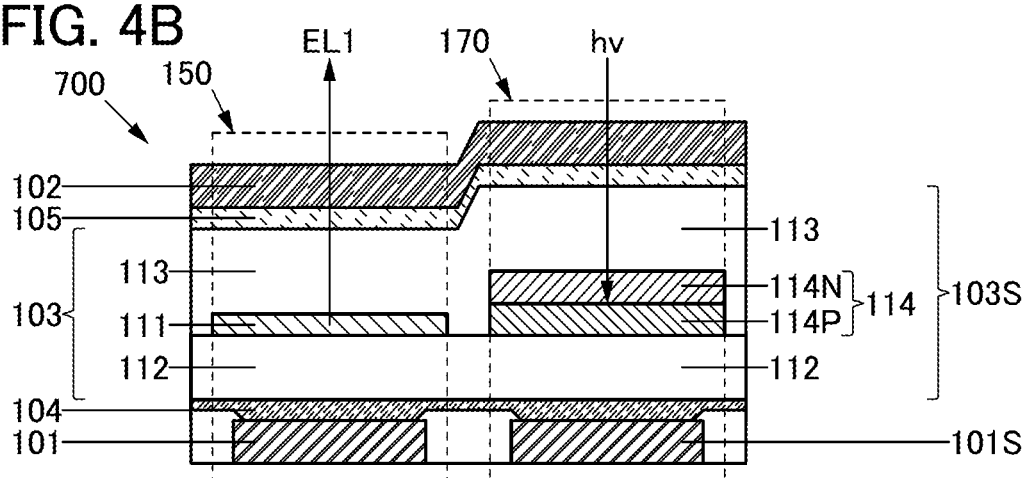

The functional panel 700 described in this embodiment includes the light-emitting device 150 and an optical device 170 (see FIG. 4A).

For example, the light-emitting device described in any one of Embodiments 2 to 6 can be used as the light-emitting device 150.

<Structure Example of Optical Device 170>

The optical device 170 described in this embodiment includes an electrode 101S, the electrode 102, and a unit 103S. The electrode 102 includes a region overlapping with the electrode 101S, and the unit 103S includes a region between the electrode 101S and the electrode 102.

The optical device 170 includes the layer 104 and the layer 105. The layer 104 includes a region between the electrode 101S and the unit 103S, and the layer 105 includes a region between the unit 103S and the electrode 102. Note that a component of the light-emitting device 150 can be used as a component of the optical device 170. Thus, the components can be common. The fabrication process can be simplified.

<Structure Example 1 of Unit 103S>

The unit 103S has a single-layer structure or a stacked-layer structure. The unit 103S includes a layer 114, the layer 112, and the layer 113, for example (see FIG. 4A).

The layer 114 includes a region between the layer 112 and the layer 113, the layer 112 includes a region between the electrode 101S and the layer 114, and the layer 113 includes a region between the electrode 102 and the layer 114.

The unit 103S can include, for example, a layer selected from functional layers such as a photoelectric conversion layer, a hole-transport layer, an electron-transport layer, and a carrier-blocking layer. The unit 103S can include a layer selected from functional layers such as an exciton-blocking layer and a charge-generation layer.

The unit 103S absorbs light hv, supplies electrons to one electrode, and supplies holes to the other. For example, the unit 103S supplies holes to the electrode 101S and supplies electrons to the electrode 102.

<<Structure Example of Layer 112>>

A hole-transport material can be used for the layer 112, for example. The layer 112 can be referred to as a hole-transport layer. For example, the structure described in Embodiment 2 can be employed for the layer 112.

<<Structure Example of Layer 113>>

An electron-transport material, a material having an anthracene skeleton, and a mixed material can be used for the layer 113, for example. For example, the structure described in Embodiment 2 can be employed for the layer 113.

<<Structure Example 1 of Layer 114>>

For example, an electron-accepting material and an electron-donating material can be used for the layer 114. Specifically, a material that can be used for an organic solar cell can be used for the layer 114. In addition, the layer 114 can be referred to as a photoelectric conversion layer. The layer 114 absorbs the light hv, supplies electrons to one electrode, and supplies holes to the other. For example, the layer 114 supplies holes to the electrode 101S and supplies electrons to the electrode 102.

[Example of Electron-Accepting Material]

As the electron-accepting material, a fullerene derivative or a non-fullerene electron acceptor can be used, for example.

As the electron-accepting material, a C70 fullerene, a $C_{70}$ fullerene, [6,6]-phenyl-$C_{71}$-butyric acid methyl ester (abbreviation: PC71BM), [6,6]-phenyl-$C_{61}$-butyric acid methyl ester (abbreviation: PC61BM), 1',1''',4',4'''-tetrahydro-di[1,4]methanonaphthaleno[1,2:2',3',56,60:2'',3''][5,6]fullerene-$C_{60}$ (abbreviation: ICBA), or the like can be used.

As the non-fullerene electron acceptor, a perylene derivative, a compound having a dicyanomethyleneindanone group, or the like can be used. For example, N,N'-dimethyl-3,4,9,10-perylenedicarboximide (abbreviation: Me-PTCDI) can be used. In addition, any of the organic compounds described in Embodiment 1 can also be used for an active layer. For example, photoelectric conversion of ultraviolet light can be performed.

[Example of Electron-Donating Material]

As the electron-donating material, a phthalocyanine compound, a tetracene derivative, a quinacridone derivative, or a rubrene derivative can be used, for example.

As the electron-donating material, copper(II) phthalocyanine (abbreviation: CuPc), tin(II) phthalocyanine (SnPc), zinc phthalocyanine (ZnPc), tetraphenyldibenzoperiflanthene (DBP), rubrene, or the like can be used.

<<Structure Example 2 of Layer 114>>

The layer 114 can have a single-layer structure or a stacked-layer structure, for example. Specifically, the layer 114 can have a bulk heterojunction structure. Alternatively, the layer 114 can have a heterojunction structure.

[Structure Example of Mixed Material]

A mixed material containing an electron-accepting material and an electron-donating material can be used for the layer 114, for example. Note that a structure in which such a mixed material containing an electron-accepting material and an electron-donating material is used for the layer 114 can be referred to as a bulk heterojunction structure.

Specifically, a mixed material containing a $C_{70}$ fullerene and DBP can be used for the layer 114.

[Example of Heterojunction Structure]

A layer 114N and a layer 114P can be used for the layer 114. The layer 114N includes a region between one electrode and the layer 114P, and the layer 114P includes a region between the layer 114N and the other electrode. For example, the layer 114N includes a region between the electrode 102 and the layer 114P, and the layer 114P includes a region between the layer 114N and the electrode 101S (see FIG. 4B).

An n-type semiconductor can be used for the layer 114N. For example, Me-PTCDI can be used for the layer 114N.

A p-type semiconductor can be used for the layer 114P. For example, rubrene can be used for the layer 114P.

Note that the optical device 170 in which the layer 114P is in contact with the layer 114N can be referred to as a pn-junction photodiode.

<Structure Example 2 of Unit 103S>

Figure 4C:
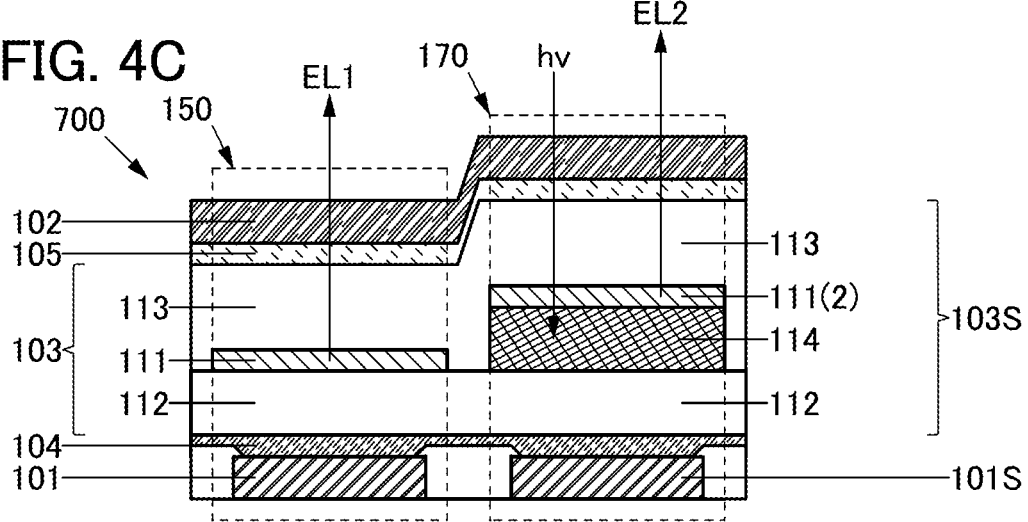

The unit 103S includes the layer 111(2), and the layer 111(2) includes a region between the layer 114 and the layer 113 (see FIG. 4C).

Structure example 2 of the unit 103S is different from Structure example 1 of the unit 103S in that the layer 111(2) is provided. Different parts will be described in detail below, and the above description is referred to for parts having the same structure as the above.

<<Structure Example of Layer 111(2)>>

Either a structure containing a light-emitting material or a structure containing a light-emitting material and a host material can be employed for the layer 111(2), for example. The layer 111(2) can be referred to as a light-emitting layer. Note that the layer 111(2) is preferably provided in a region where holes and electrons are recombined. Thus, energy generated by recombination of carriers can be efficiently converted into light and emitted. Furthermore, the layer 111(2) is preferably provided to be distanced from a metal used for the electrode or the like. Thus, a quenching phenomenon caused by the metal used for the electrode or the like can be inhibited.

Specifically, the structure described in Embodiment 2 can be employed for the layer 111(2). In particular, the structure that emits light with a wavelength which is hardly absorbed by the layer 114 can be suitably employed for the layer 111(2). Accordingly, the light EL2 emitted from the layer 111(2) can be extracted with high efficiency.

Note that this embodiment can be combined with any of the other embodiments in this specification as appropriate.

Embodiment 9

In this embodiment, a light-emitting apparatus including the light-emitting device described in any one of Embodiments 2 to 6 will be described.

Figure 5A:
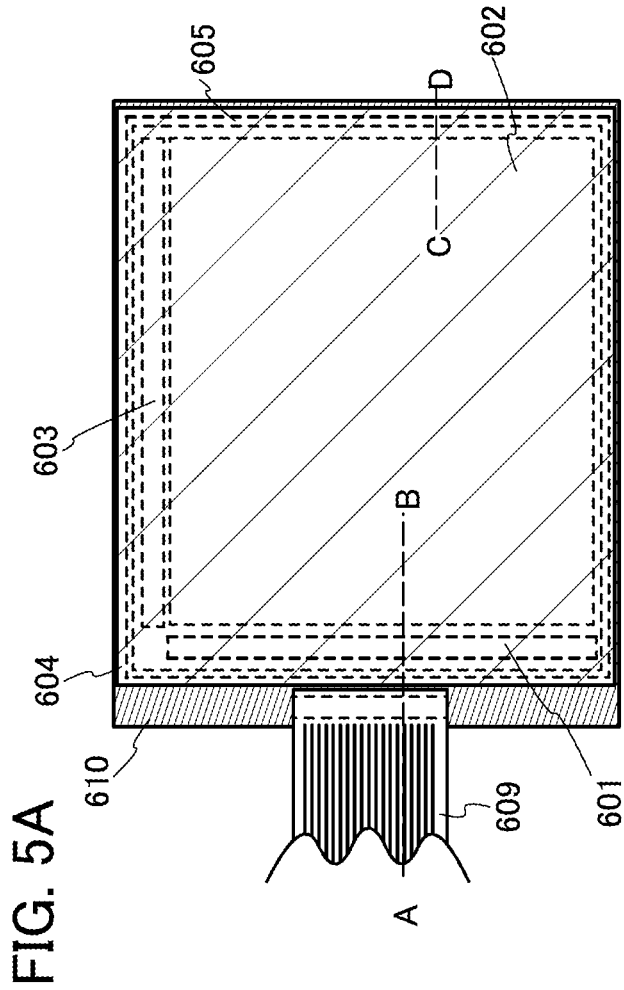
FIGS. 5A and 5B are conceptual diagrams of an active matrix light-emitting apparatus.
Figure 5B:
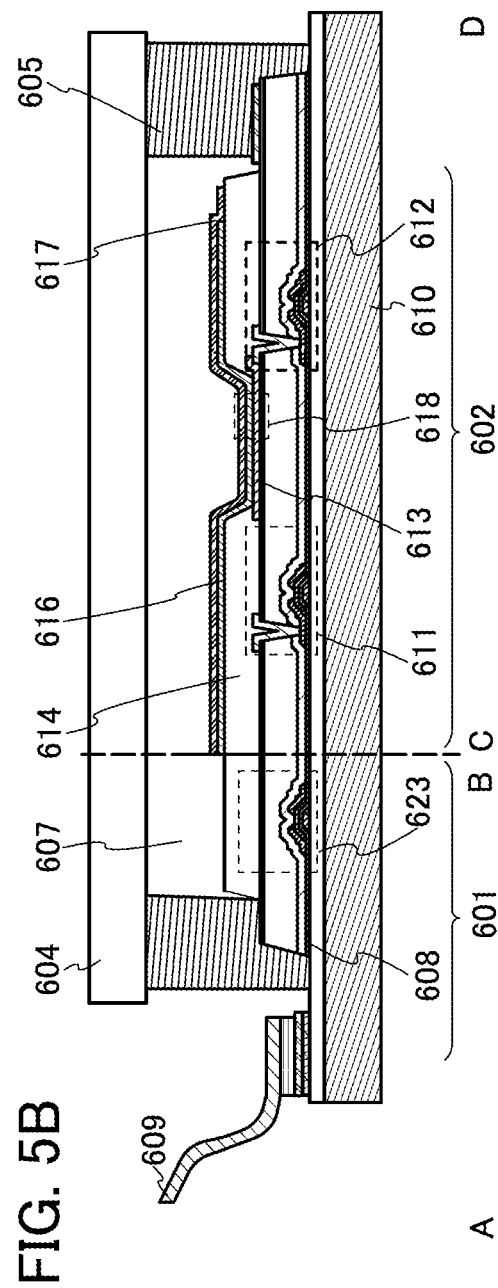

In this embodiment, the light-emitting apparatus fabricated using the light-emitting device described in any one of Embodiments 2 to 6 is described with reference to FIGS. 5A and 5B. Note that FIG. 5A is a top view of the light-emitting apparatus and FIG. 5B is a cross-sectional view taken along the lines A-B and C-D in FIG. 5A. This light-emitting apparatus includes a driver circuit portion (a source line driver circuit 601), a pixel portion 602, and another driver circuit portion (a gate line driver circuit 603), which are to control light emission of the light-emitting device and illustrated with dotted lines. Reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 5B. The driver circuit portions and the pixel portion are formed over an element substrate 610; here, the source line driver circuit 601, which is a driver circuit portion, and one pixel in the pixel portion 602 are illustrated.

The element substrate 610 may be a substrate formed of glass, quartz, an organic resin, a metal, an alloy, or a semiconductor or a plastic substrate formed of fiber reinforced plastics (FRP), poly(vinyl fluoride) (PVF), polyester, an acrylic resin, or the like.

The structures of transistors used in pixels or driver circuits are not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, or gallium nitride can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. It is preferable that a semiconductor having crystallinity be used, in which case deterioration of the transistor characteristics can be suppressed.

Here, an oxide semiconductor is preferably used for semiconductor devices such as the transistors provided in the pixels or driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the source line driver circuit 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside.

The pixel portion 602 includes a plurality of pixels each including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve coverage with an EL layer or the like which is formed later, the insulator 614 is formed to have a curved surface with curvature at its upper or lower end portion. For example, in the case where a positive photosensitive acrylic resin is used for a material of the insulator 614, only the upper end portion of the insulator 614 preferably has a surface with a curvature radius (greater than or equal to 0.2 μm and less than or equal to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, or a stack of three layers of a titanium nitride film, a film containing aluminum as its main component, and a titanium nitride film can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any one of Embodiments 2 to 6. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in any one of Embodiments 2 to 6. In the light-emitting apparatus of this embodiment, the pixel portion, which includes a plurality of light-emitting devices, may include both the light-emitting device described in any one of Embodiments 2 to 6 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is preferable that such a material not be permeable to moisture and oxygen as much as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 5A and 5B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, or indium oxide; a material containing aluminum nitride, hafnium nitride, silicon nitride, tantalum nitride, titanium nitride, niobium nitride, molybdenum nitride, zirconium nitride, or gallium nitride; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, or an oxide containing yttrium and zirconium can be used.

The protective film is preferably formed using a deposition method with favorable step coverage. One such method is an atomic layer deposition (ALD) method. A material that can be formed by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus fabricated using the light-emitting device described in any one of Embodiments 2 to 6 can be obtained.

The light-emitting apparatus in this embodiment is fabricated using the light-emitting device described in any one of Embodiments 2 to 6 and thus can have favorable characteristics. Specifically, since the light-emitting device described in any one of Embodiments 2 to 6 has high emission efficiency, the light-emitting apparatus can achieve low power consumption.

FIGS. 6A and 6B each illustrate an example of a light-emitting apparatus that includes a light-emitting device exhibiting white light emission, coloring layers (color filters), and the like to display a full-color image. In FIG. 6A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition 1025, an EL layer 1028, a second electrode 1029 of the light-emitting devices, a sealing substrate 1031, a sealing material 1032, and the like are illustrated.

In FIG. 6A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 6A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 6B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 7:
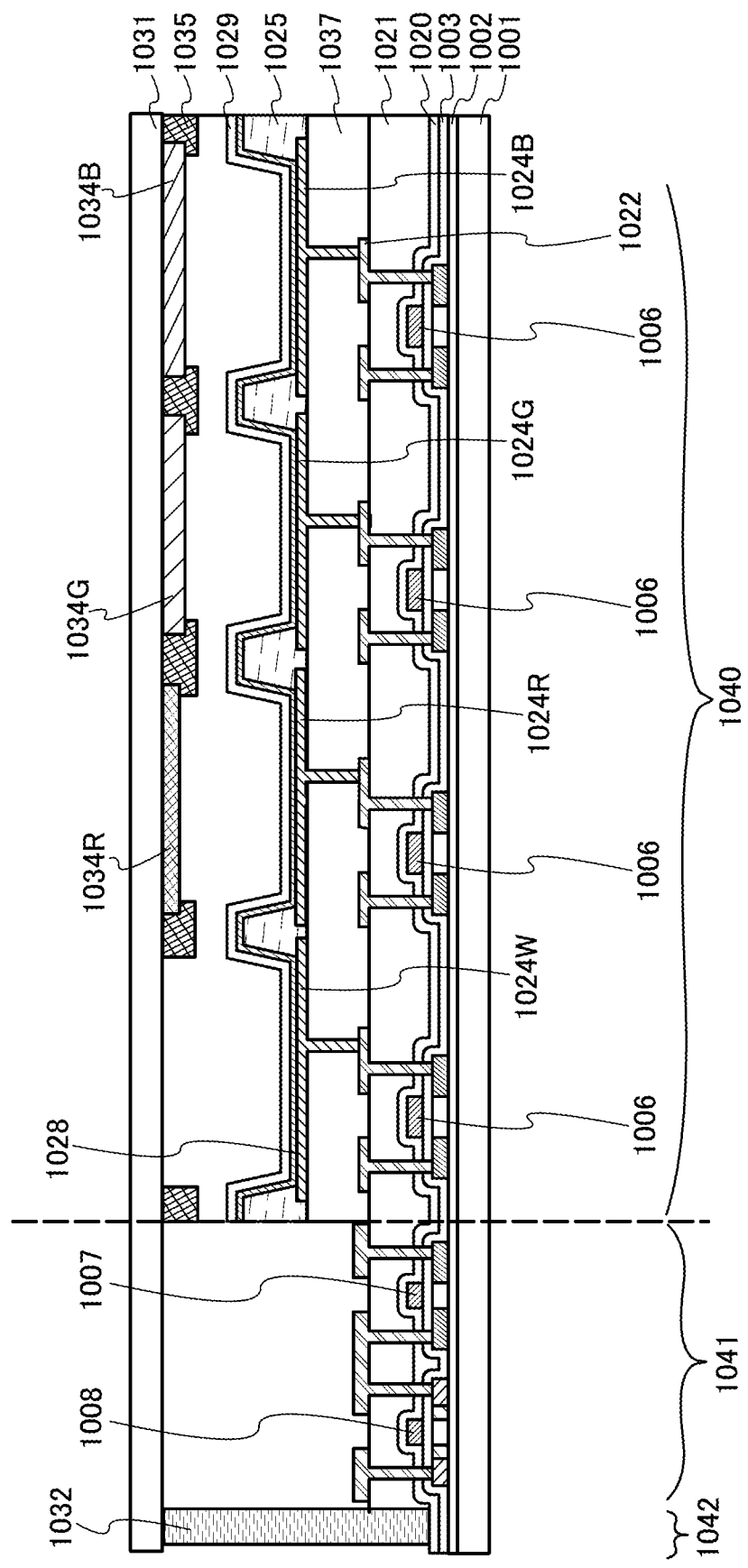
FIG. 7 is a conceptual diagram of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 7 is a cross-sectional view of a light-emitting apparatus having a top emission structure. In this case, a substrate which does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024W, 1024R, 1024G, and 1024B of the light-emitting devices each serve as an anode here, but may serve as a cathode. Furthermore, in the case of the top-emission light-emitting apparatus illustrated in FIG. 7, the first electrodes are preferably reflective electrodes. The EL layer 1028 is formed to have a structure similar to the structure of the unit 103, which is described in any one of Embodiments 2 to 6, with which white light emission can be obtained.

In the case of a top emission structure as illustrated in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) or the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with use of a reflective electrode as the first electrode and a semi-transmissive and semi-reflective electrode as the second electrode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity higher than or equal to 40% and lower than or equal to 100%, preferably higher than or equal to 70% and lower than or equal to 100%, and a resistivity of $1 \times 10^{-2}$ Ωcm or lower. In addition, the semi-transmissive and semi-reflective electrode has a visible light reflectivity higher than or equal to 20% and lower than or equal to 80%, preferably higher than or equal to 40% and lower than or equal to 70%, and a resistivity of $1 \times 10^{-2}$ Ωcm or lower.

Light emitted from the light-emitting layer included in the EL layer is reflected and resonated by the reflective electrode and the semi-transmissive and semi-reflective electrode.

In the light-emitting device, by changing thickness of the transparent conductive film, the composite material, the carrier-transport material, or the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is fabricated using the light-emitting device described in any one of Embodiments 2 to 6 and thus can have favorable characteristics. Specifically, since the light-emitting device described in any one of Embodiments 2 to 6 has high emission efficiency, the light-emitting apparatus can achieve low power consumption.

Figure 8A:
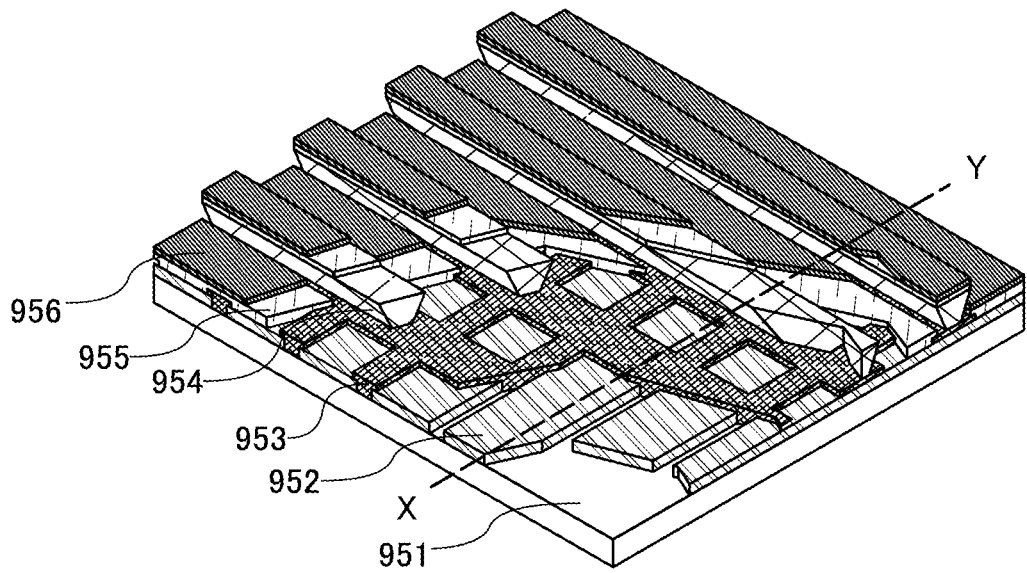
FIGS. 8A and 8B are conceptual diagrams of a passive matrix light-emitting apparatus.
Figure 8B:
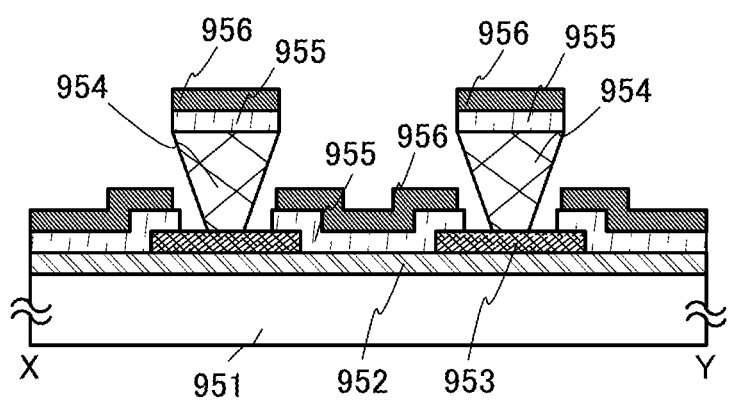

An active matrix light-emitting apparatus is described above, whereas a passive matrix light-emitting apparatus is described below. FIGS. 8A and 8B illustrate a passive matrix light-emitting apparatus manufactured using the present invention. Note that FIG. 8A is a perspective view of the light-emitting apparatus, and FIG. 8B is a cross-sectional view taken along the line X-Y in FIG. 8A. In FIGS. 8A and 8B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in any one of Embodiments 2 to 6; thus, the light-emitting apparatus can have high reliability or low power consumption.

Since many minute light-emitting devices arranged in a matrix in the light-emitting apparatus described above can each be controlled, the light-emitting apparatus can be suitably used as a display device for displaying images.

This embodiment can be freely combined with any of the other embodiments.

Embodiment 10

Figure 9A:
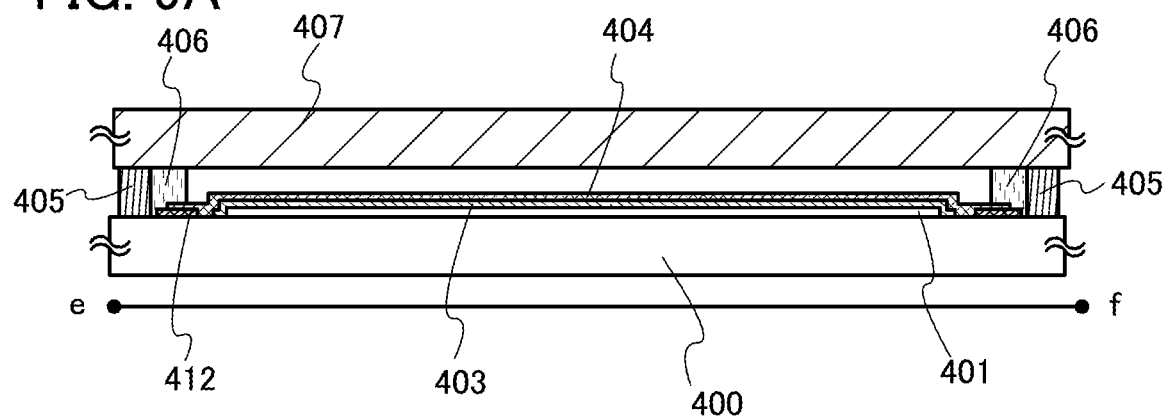
FIGS. 9A and 9B illustrate a lighting device.
Figure 9B:
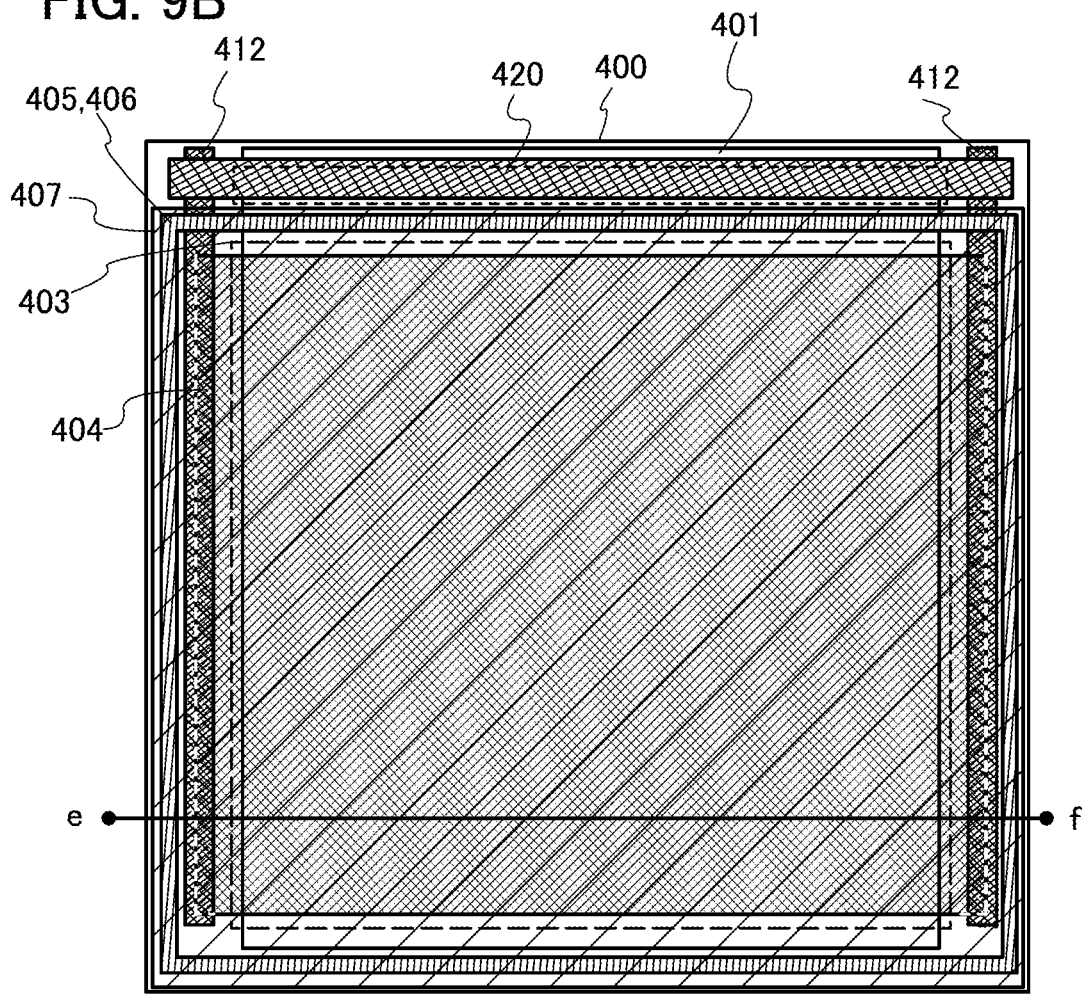

In this embodiment, an example in which the light-emitting device described in any one of Embodiments 2 to 6 is used for a lighting device will be described with reference to FIGS. 9A and 9B. FIG. 9B is a top view of the lighting device, and FIG. 9A is a cross-sectional view taken along the line e-f in FIG. 9B.

In the lighting device in this embodiment, a first electrode 401 is formed over a substrate 400 which is a support and has a light-transmitting property. The first electrode 401 corresponds to the electrode 101 in any one of Embodiments 2 to 6. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the unit 103 in any one of Embodiments 2 to 6. Refer to the descriptions for the structure.

The second electrode 404 is formed to cover the EL layer 403. The second electrode 404 corresponds to the electrode 102 in any one of Embodiments 2 to 6. The second electrode 404 is formed using a material having high reflectance when light is extracted from the first electrode 401 side. The second electrode 404 is connected to the pad 412, whereby voltage is applied.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can be a lighting device with low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 9B) can be mixed with a desiccant that enables moisture to be adsorbed, which results in improved reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting device described in any one of Embodiments 2 to 6, and thus can be a lighting device with low power consumption.

Embodiment 11

In this embodiment, examples of electronic devices each including the light-emitting device described in any one of Embodiments 2 to 6 will be described. The light-emitting device described in any one of Embodiments 2 to 6 has high emission efficiency and low power consumption. As a result, the electronic devices described in this embodiment can each include a light-emitting portion having low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 10A:
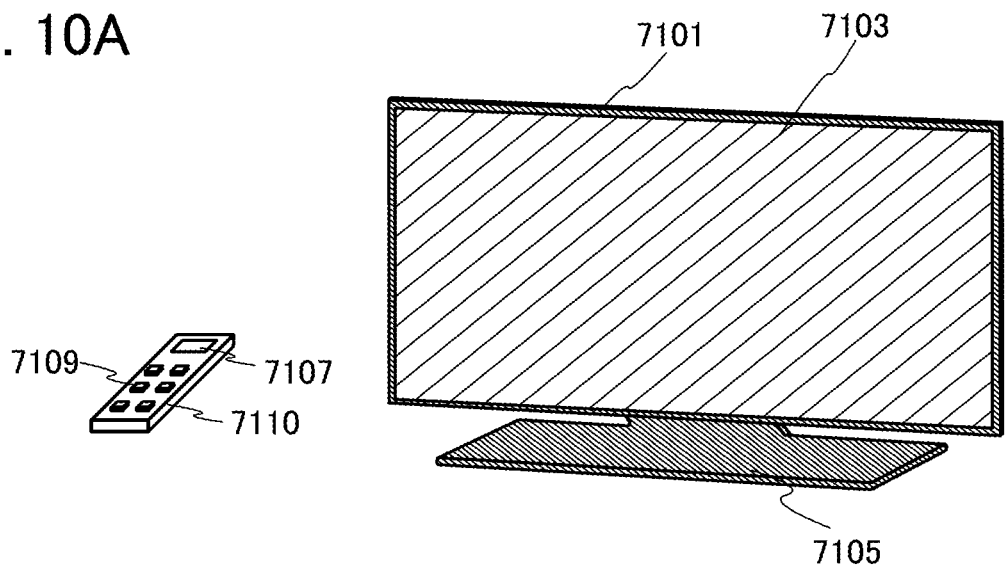
FIGS. 10A to 10D illustrate electronic devices.

FIG. 10A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in any one of Embodiments 2 to 6 are arranged in a matrix.

The television device can be operated with an operation switch of the housing 7101 or a separate remote controller 7110. With operation keys 7109 of the remote controller 7110, channels or volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, or the like. With use of the receiver, a general television broadcast can be received. Moreover, when the television device is connected to a communication network with or without wires via the modem, one-way (from a sender to a receiver) or two-way (between a sender and a receiver or between receivers) data communication can be performed.

Figure 10B:
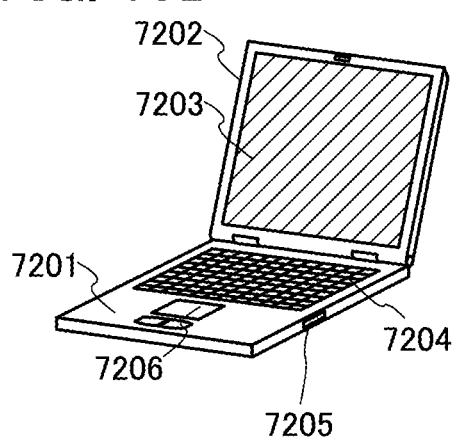
Figure 10C:
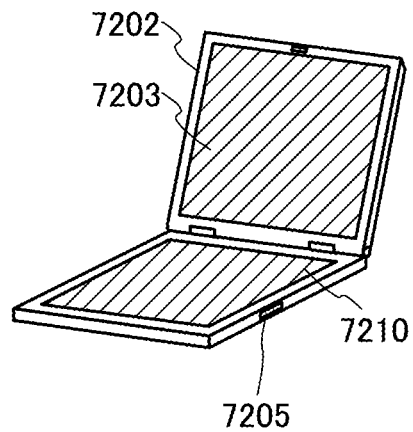

FIG. 10B illustrates a computer, which includes a main body 7201, a housing 7202, a display portion 7203, a keyboard 7204, an external connection port 7205, a pointing device 7206, and the like. Note that this computer is fabricated using the light-emitting devices described in any one of Embodiments 2 to 6 and arranged in a matrix in the display portion 7203. The computer illustrated in FIG. 10B may have a structure illustrated in FIG. 10C. A computer illustrated in FIG. 10C is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 10D:
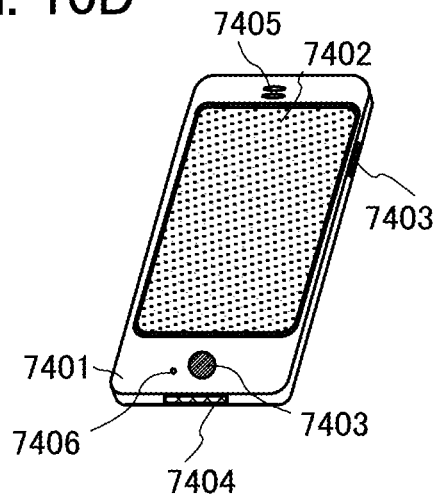

FIG. 10D shows an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in any one of Embodiments 2 to 6 and arranged in a matrix.

When the display portion 7402 of the portable terminal illustrated in FIG. 10D is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Figure 11A:
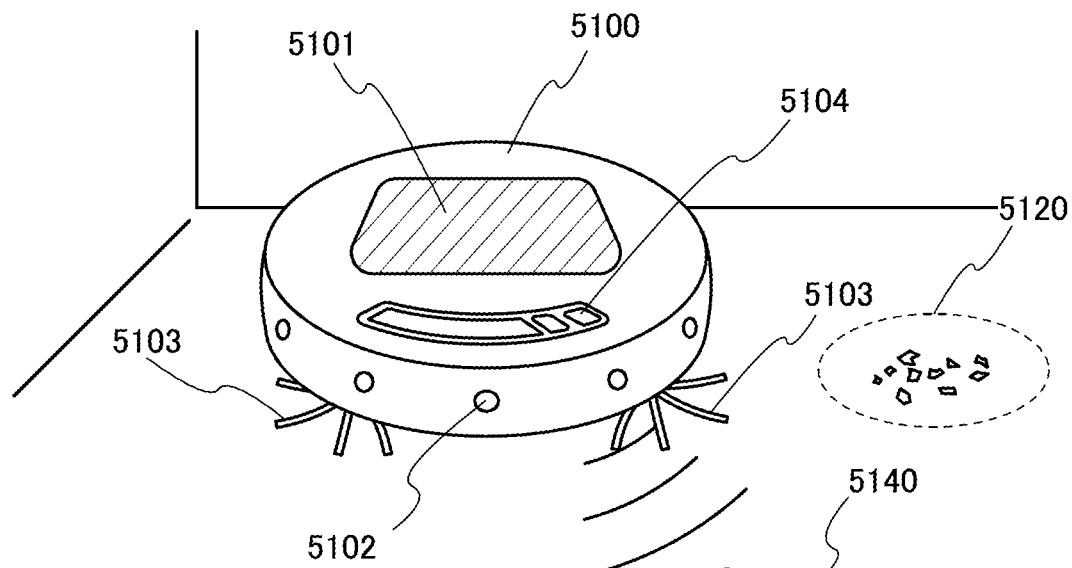
FIGS. 11A to 11C illustrate electronic devices.

FIG. 11A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, or the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 11B:
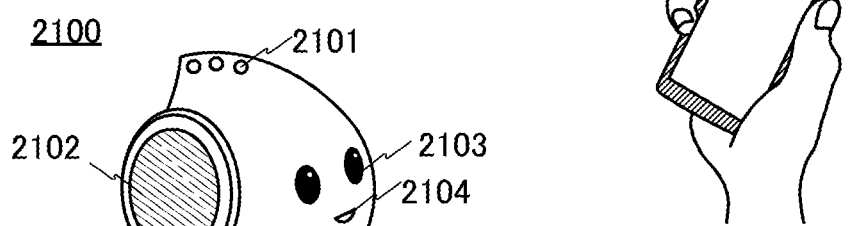

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 11C:
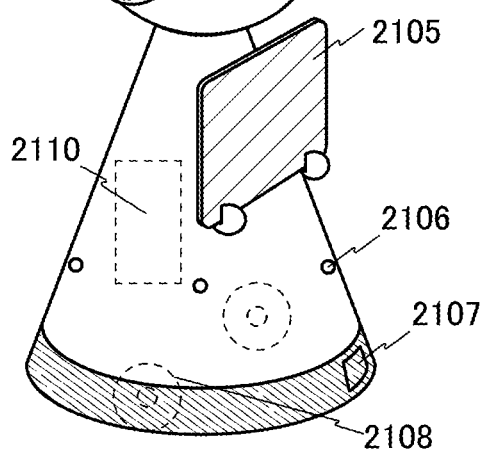
Figure 11C:
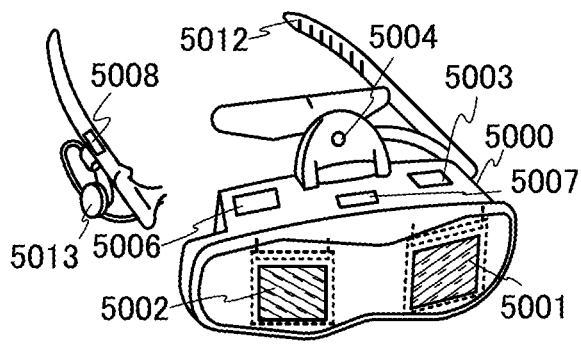

FIG. 11C shows an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, a display portion 5002, a support 5012, and an earphone 5013.

The light-emitting apparatus of one embodiment of the present invention can be used for the display portion 5001 and the display portion 5002.

Figure 12:
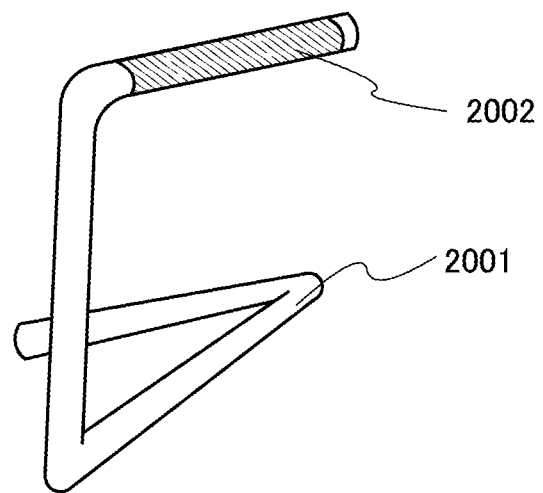
FIG. 12 illustrates a lighting device.

FIG. 12 shows an example in which the light-emitting device described in any one of Embodiments 2 to 6 is used for a table lamp which is a lighting device. The table lamp illustrated in FIG. 12 includes a housing 2001 and a light source 2002, and the lighting device described in Embodiment 10 may be used for the light source 2002.

Figure 13:
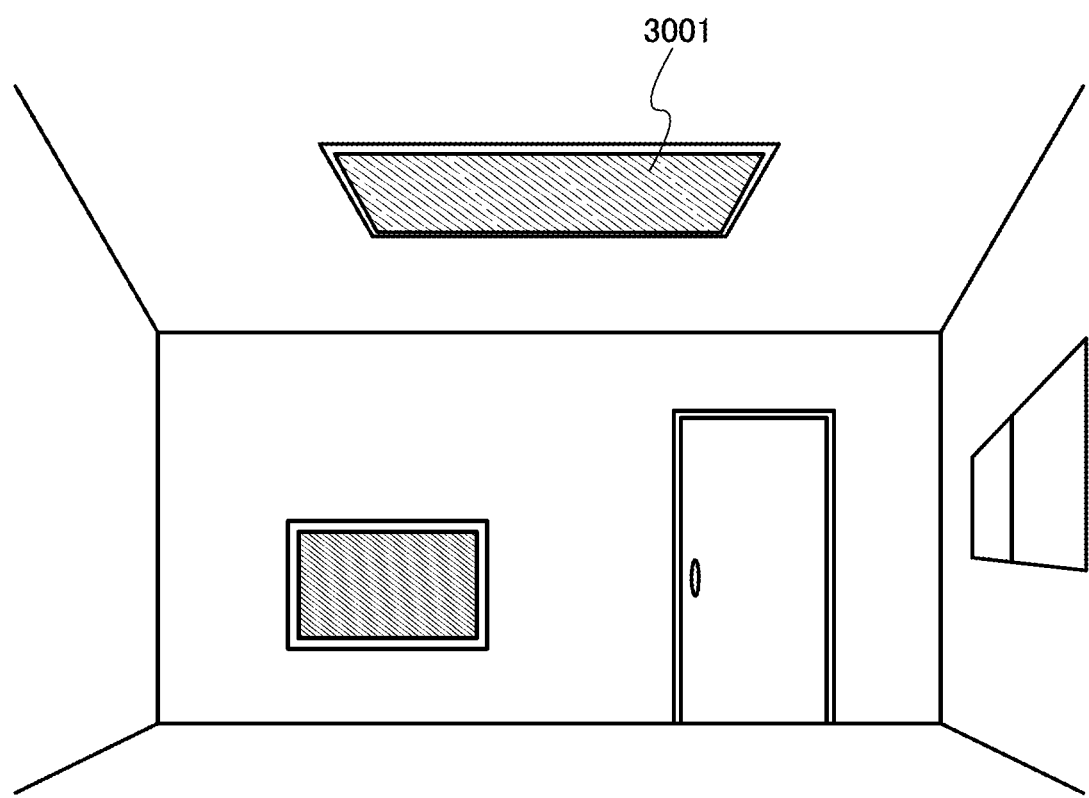
FIG. 13 illustrates a lighting device.

FIG. 13 shows an example in which the light-emitting device described in any one of Embodiments 2 to 6 is used for an indoor lighting device 3001. Since the light-emitting device described in any one of Embodiments 2 to 6 has high emission efficiency, the lighting device can have low power consumption. Furthermore, since the light-emitting device described in any one of Embodiments 2 to 6 can have a large area, the light-emitting device can be used for a large-area lighting device. Furthermore, since the light-emitting device described in any one of Embodiments 2 to 6 is thin, the light-emitting device can be used for a lighting device having a reduced thickness.

Figure 14:
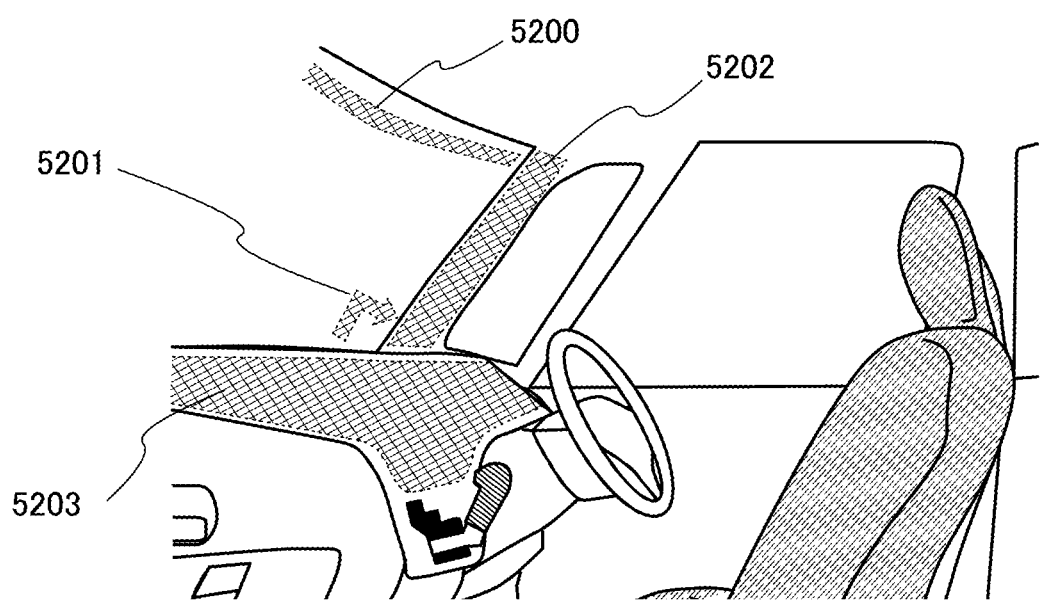
FIG. 14 illustrates in-vehicle display devices and lighting devices.

The light-emitting device described in any one of Embodiments 2 to 6 can also be used for an automobile windshield or an automobile dashboard. FIG. 14 illustrates one mode in which the light-emitting device described in any one of Embodiments 2 to 6 is used for an automobile windshield or an automobile dashboard. Display regions 5200 to 5203 each include the light-emitting device described in any one of Embodiments 2 to 6.

The display regions 5200 and 5201 are display devices which are provided in the automobile windshield and in which the light-emitting device described in any one of Embodiments 2 to 6 is incorporated. The light-emitting device described in any one of Embodiments 2 to 6 can be formed into what is called a see-through display device, through which the opposite side can be seen, by including a first electrode and a second electrode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in any one of Embodiments 2 to 6 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide a variety of kinds of information by displaying navigation data, speed, a tachometer, a mileage, a fuel level, a gearshift state, air-condition setting, and the like. The content or layout of the display can be changed freely by a user as appropriate. Note that such information can also be displayed on the display regions 5200 to 5202. The display regions 5200 to 5203 can also be used as lighting devices.

Figure 15A:
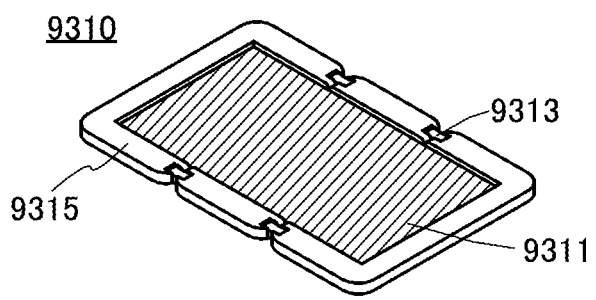
FIGS. 15A to 15C illustrate an electronic device.
Figure 15B:
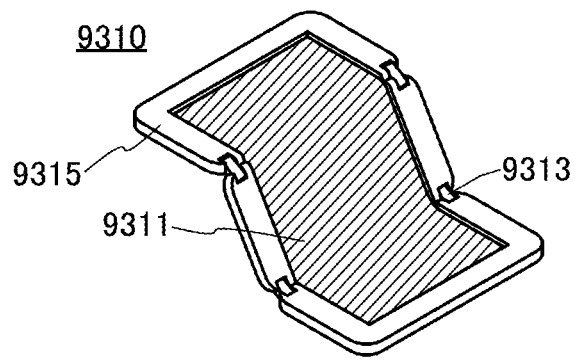
Figure 15C:
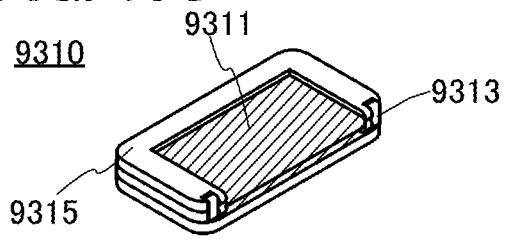

FIGS. 15A to 15C illustrate a foldable portable information terminal 9310. FIG. 15A illustrates the portable information terminal 9310 that is opened. FIG. 15B illustrates the portable information terminal 9310 that is being opened or being folded. FIG. 15C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state.

The light-emitting apparatus of one embodiment of the present invention can be used for the display panel 9311.

Note that the structure described in this embodiment can be combined with any of the structures described in Embodiments 2 to 6 as appropriate.

As described above, the application range of the light-emitting apparatus including the light-emitting device described in any one of Embodiments 2 to 6 is wide, and thus the light-emitting apparatus can be applied to electronic devices in a variety of fields. By using the light-emitting device described in any one of Embodiments 2 to 6, an electronic device with low power consumption can be obtained.

Note that this embodiment can be combined with any of the other embodiments in this specification as appropriate.

Example 1

Synthesis Example 1

In this example, physical properties of the organic compound of one embodiment of the present invention and a method for synthesizing the organic compound will be described with reference to FIG. 16, FIG. 17, and FIGS. 18A and 18B. Specifically, physical properties of 5-[4-(10-phenyl-9-anthryl)phenyl]-5H-naphtho[2,3-c]carbazole (abbreviation: cNCzPA) represented by Structural Formula (100) in Embodiment 1 and a method for synthesizing cNCzPA will be described. The structural formula of cNCzPA is shown below.

[Chemical Formula 34]

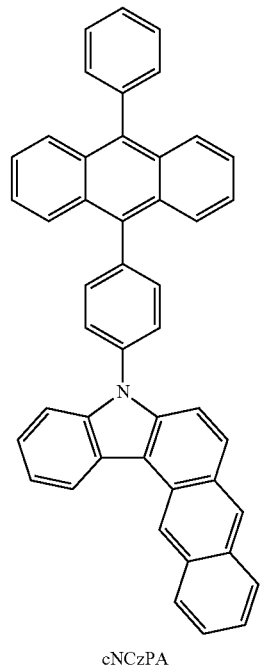

cNCzPA

Figure 16:
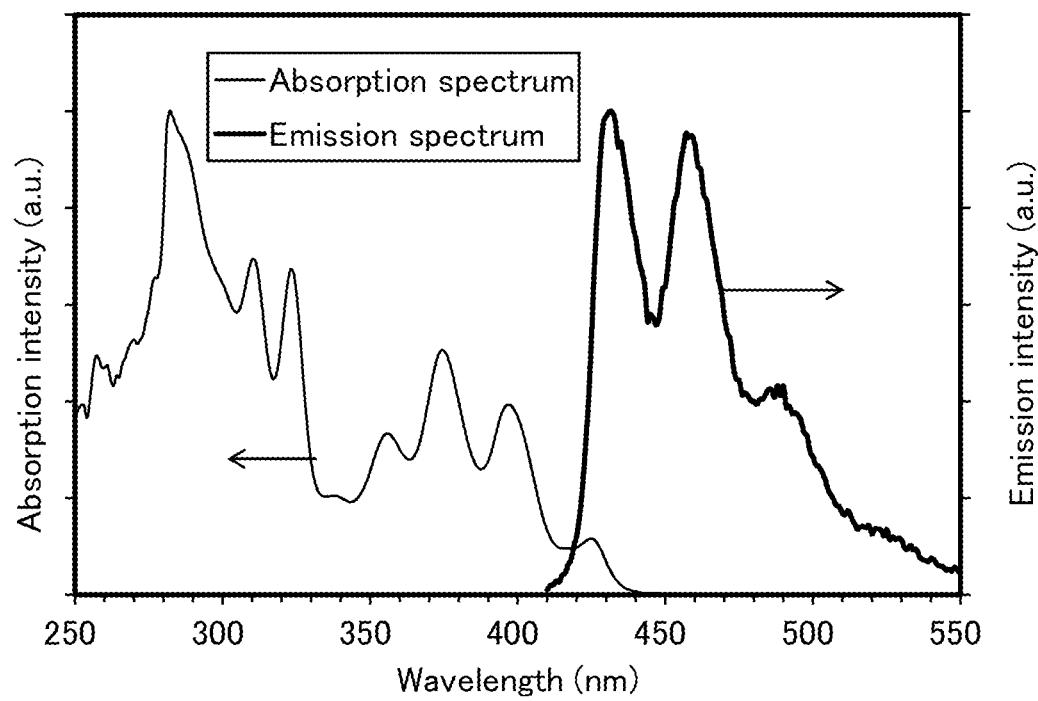
FIG. 16 shows an absorption spectrum and an emission spectrum of cNCzPA in a toluene solution.

FIG. 16 shows an absorption spectrum and an emission spectrum of cNCzPA in a toluene solution.

Figure 17:
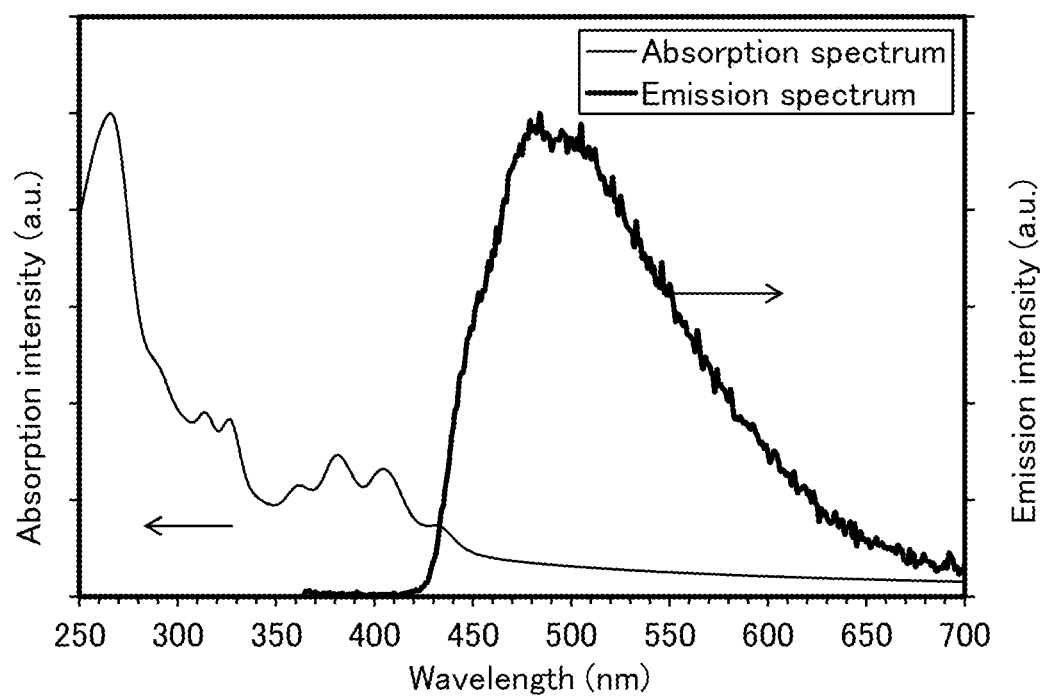
FIG. 17 shows an absorption spectrum and an emission spectrum of a thin film of cNCzPA.

FIG. 17 shows an absorption spectrum and an emission spectrum of a solid thin film of cNCzPA.

Figure 18A:
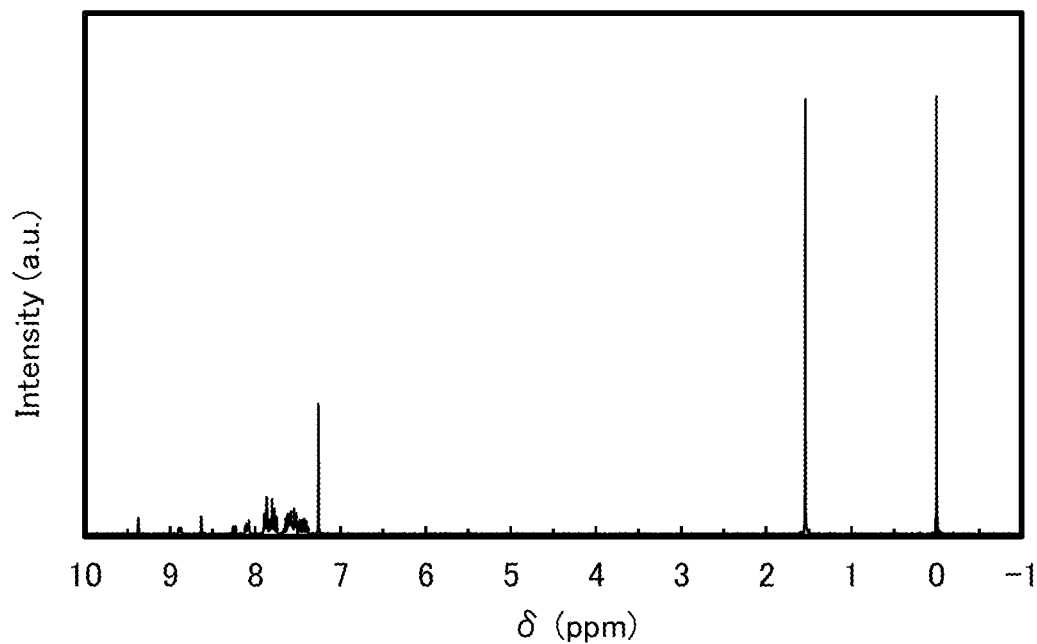
FIGS. 18A and 18B show $^1$H NMR spectra of cNCzPA.
Figure 18B:
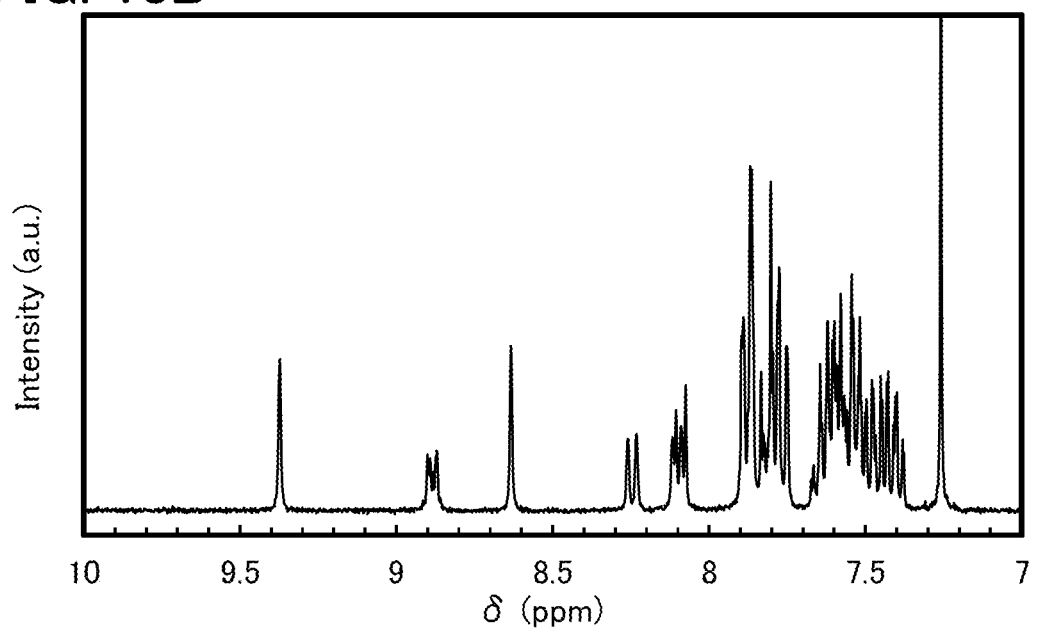

FIGS. 18A and 18B show $^1$H NMR spectra of cNCzPA.

<Measurement Apparatus and Fabrication Method of Measurement Sample>

The absorption spectrum of cNCzPA in the toluene solution was measured with an ultraviolet-visible light spectrophotometer (V550, manufactured by JASCO Corporation), and the absorption spectrum derived from toluene was subtracted.

The absorption spectrum of the solid thin film sample was measured with an ultraviolet-visible light spectrophotometer (V550, manufactured by JASCO Corporation), and the absorption spectrum derived from a quartz substrate was subtracted. Note that the solid thin film sample was formed over the quartz substrate by a vacuum evaporation method.

The emission spectrum was measured with a fluorescence spectrophotometer (FS920, manufactured by Hamamatsu Photonics K.K.).

A method for calculating the HOMO level and the LUMO level of the organic compound on the basis of a cyclic voltammetry (CV) measurement will be described below.

An electrochemical analyzer (ALS model 600A or 600C, produced by BAS Inc.) was used as the measurement apparatus.

A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L.

A platinum electrode (PTE platinum electrode, produced by BAS Inc.) was used as a working electrode, another platinum electrode (Pt counter electrode for VC-3 (5 cm), produced by BAS Inc.) was used as an auxiliary electrode, and an Ag/Ag$^+$ electrode (RE7 reference electrode for non-aqueous solvent, produced by BAS Inc.) was used as a reference electrode.

Note that the measurement was performed at room temperature (20° C. to 25° C.). In addition, the scan speed in the CV measurement was fixed to 0.1 V/sec, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave.

Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

Furthermore, CV measurement was repeated 100 times, and the oxidation-reduction wave in the hundredth cycle was compared with the oxidation-reduction wave in the first cycle to examine the electrical stability of the compound.

<Physical Properties>

The absorption spectrum of cNCzPA in the toluene solution had peaks at around 425 nm, 397 nm, 374 nm, 356 nm, 323 nm, and 310 nm, and the emission spectrum of cNCzPA in the toluene solution had peaks at 432 nm and 458 nm (see FIG. 16). Note that light with a wavelength of 397 nm was used as excitation light.

The absorption spectrum of the solid thin film of cNCzPA had peaks at around 432 nm, 404 nm, 381 nm, 362 nm, 343 nm, 326 nm, and 314 nm, and the emission spectrum of the solid thin film of cNCzPA had peaks at around 453 nm, 480 nm, and 504 nm (see FIG. 17). Note that light with a wavelength of 400 nm was used as excitation light. In a region with a wavelength longer than around 450 nm and even in a region with a wavelength shorter than around 450 nm, the intensity of the absorption spectrum of the solid thin film sample includes the intensity derived from the reflection by the substrate.

The measurement result of the oxidation potential Ea [V] revealed that the HOMO level of cNCzPA is −5.56 eV In contrast, the measurement result of the reduction potential Ec [V] revealed that the LUMO level of cNCzPA is −2.72 eV.

When the oxidation-reduction wave was repeatedly measured, in the Ea measurement, the peak intensity of the oxidation-reduction wave in the hundredth cycle was maintained to be 95% of that of the oxidation-reduction wave in the first cycle, and in the Ec measurement, the peak intensity of the oxidation-reduction wave in the hundredth cycle was maintained to be 89% of that of the oxidation-reduction wave in the first cycle.

These results revealed that cNCzPA has a high light-transmitting property in a visible light region. Moreover, it was found from the emission spectrum of the solid thin film that cNCzPA is suitably used as a host material for a material that emits fluorescence having a longer wavelength than blue light. Furthermore, it was found that aggregation of the thin film of cNCzPA is not easily caused even under the air and the thin film suffers only a small change in shape and has high film quality. It was also found that cNCzPA has extremely high resistance to oxidation and reduction.

<Synthesis Method>

A method for synthesizing cNCzPA will be described. Synthesis Scheme (SC1) is shown below.

[Chemical Formulae 35]

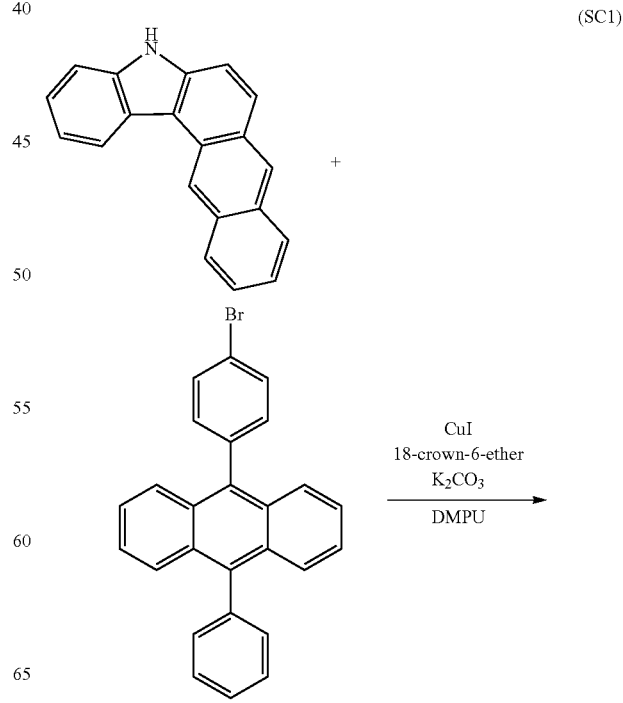

-continued

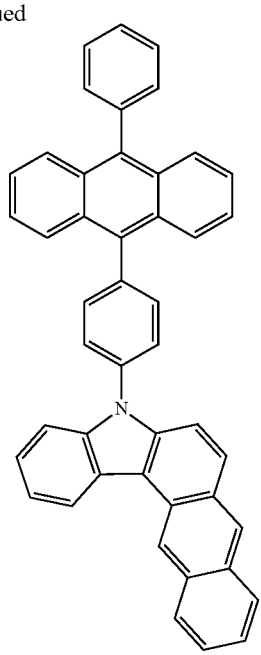

Into a 50-mL three-necked flask, 0.79 g (3.0 mmol) of 5H-naphtho[2,3-c]carbazole, 1.2 g (3.0 mmol) of 9-(4-bromophenyl)-10-phenylanthracene, 0.20 g (1.1 mmol) of copper(I) iodide, 0.34 g (1.3 mmol) of 18-crown-6-ether, 0.75 g (5.4 mmol) of potassium carbonate, and 2 mL of 1,3-dimethyl-3,4,5,6-tetrahydro-2(1H)-pyrimidinone were put. The mixture was stirred under a nitrogen stream at 180° C. for 24 hours.

After the stirring, the mixture was cooled to 100° C., and toluene was added thereto. The organic layer was washed with water, a saturated aqueous solution of sodium hydrogen carbonate, and saturated saline, and the organic layer was dried with magnesium sulfate. The mixture was gravity filtered, and the filtrate was concentrated to give an oily substance.

The obtained oily substance was purified by silica gel column chromatography (toluene:hexane=1:4) and recrystallized with toluene to give 1.2 g of a pale yellow powder, which was the target substance, in a yield of 68%.

By a train sublimation method, 1.2 g of the obtained powder of 5-[4-(10-phenyl-9-anthryl)phenyl]-5H-naphtho[2,3-c]carbazole was purified. In the purification by sublimation, 5-[4-(10-phenyl-9-anthryl)phenyl]-5H-naphtho[2,3-c]carbazole was heated at 310° C. for 17 hours under a pressure of 3.5 Pa with the argon flow rate of 5.0 mL/min. After the purification by sublimation, 1.1 g of a pale yellow powder of 5-[4-(10-phenyl-9-anthryl)phenyl]-5H-naphtho[2,3-c]carbazole was obtained in a yield of 91%.

[$^1$H NMR]

FIGS. 18A and 18B show the $^1$H NMR spectra of the obtained compound in a CDCl$_3$ solution. In addition, numerical data is shown below. This indicates that 5-[4-(10-phenyl-9-anthryl)phenyl]-5H-naphtho[2,3-c]carbazole was obtained in this synthesis example.

$^1$H NMR (CDCl$_3$, 300 MHz): δ=7.38-7.67 (m, 13H), 7.75-7.90 (m, 10H), 8.08-8.12 (m, 2H), 8.25 (d, J=7.8 Hz, 1H), 8.63 (s, 1H), 8.87-8.90 (m, 1H), 9.37 (s, 1H).

Synthesis Example 2

In this example, physical properties of the organic compound of one embodiment of the present invention and a method for synthesizing the organic compound will be described with reference to FIG. 19, FIG. 20, and FIGS. 21A and 21B. Specifically, physical properties of 3-[4-(10-phenyl-9-anthryl)phenyl]-3H-benzo[c]naphtho[2,3-g] carbazole (abbreviation: cgBNCzPA) represented by Structural Formula (119) in Embodiment 1 and a method for synthesizing cgBNCzPA will be described. The structural formula of cgBNCzPA is shown below.

[Chemical Formula 36]

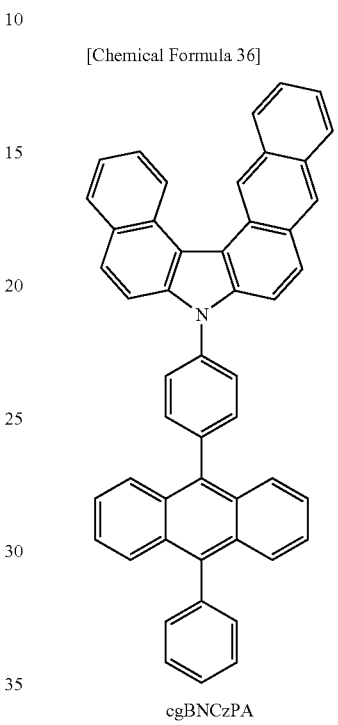

cgBNCzPA

Figure 19:
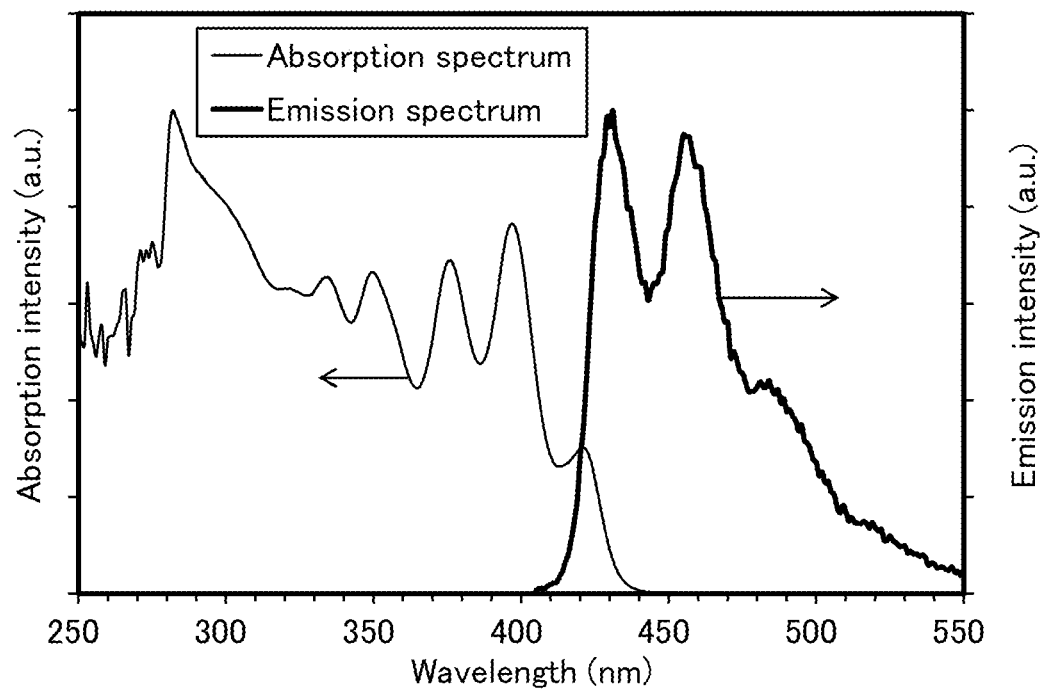
FIG. 19 shows an absorption spectrum and an emission spectrum of cgBNCzPA in a toluene solution.

FIG. 19 shows an absorption spectrum and an emission spectrum of cgBNCzPA in a toluene solution.

Figure 20:
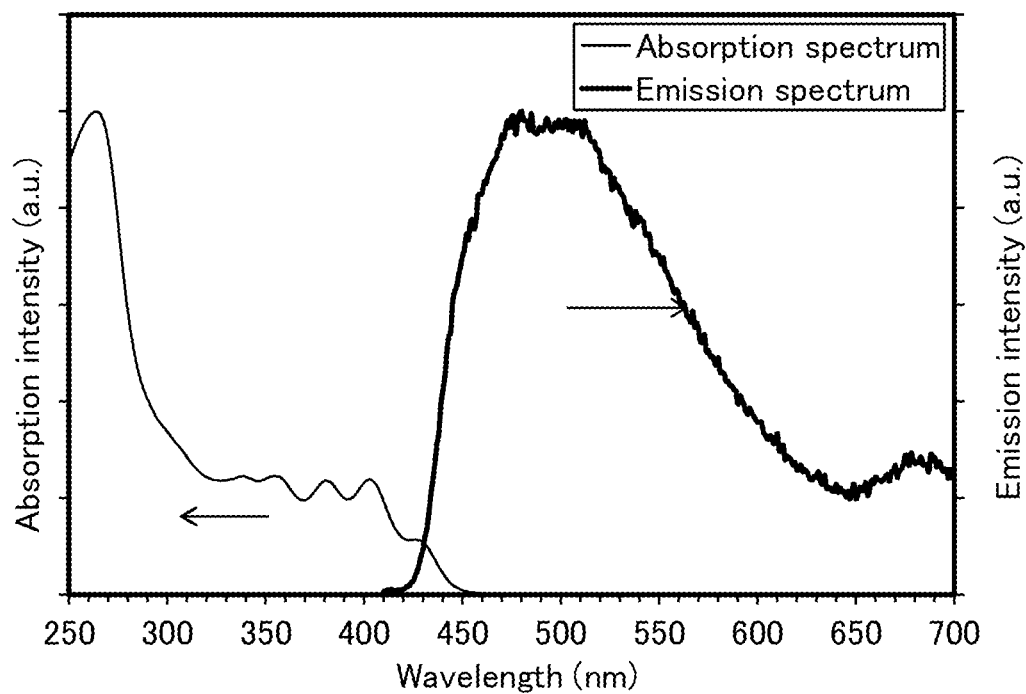
FIG. 20 shows an absorption spectrum and an emission spectrum of a thin film of cgBNCzPA.

FIG. 20 shows an absorption spectrum and an emission spectrum of a solid thin film of cgBNCzPA.

Figure 21A:
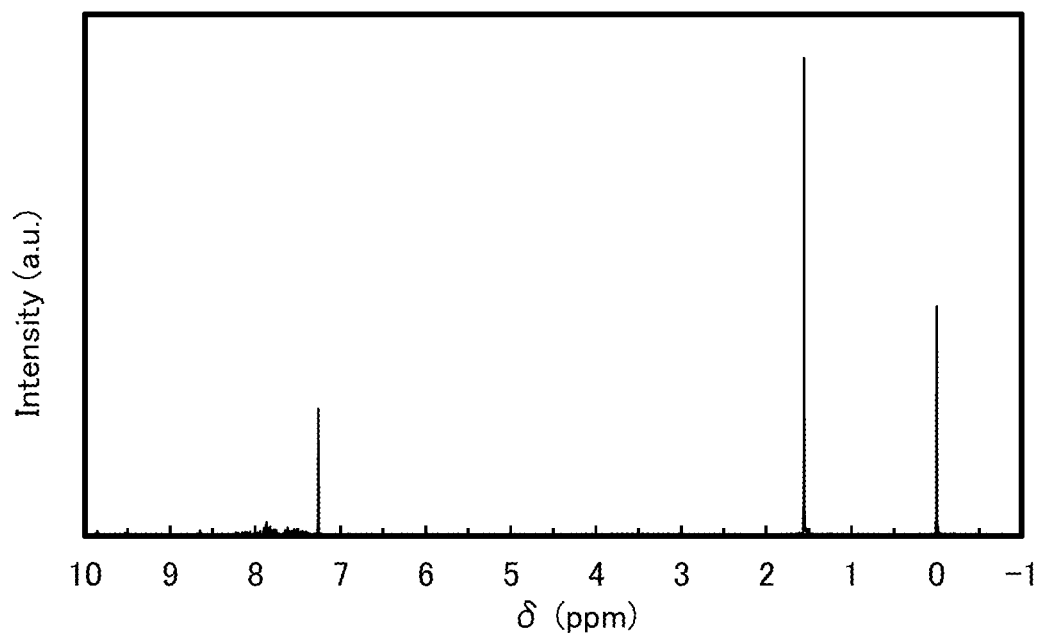
FIGS. 21A and 21B show $^1$H NMR spectra of cgBNCzPA.
Figure 21B:
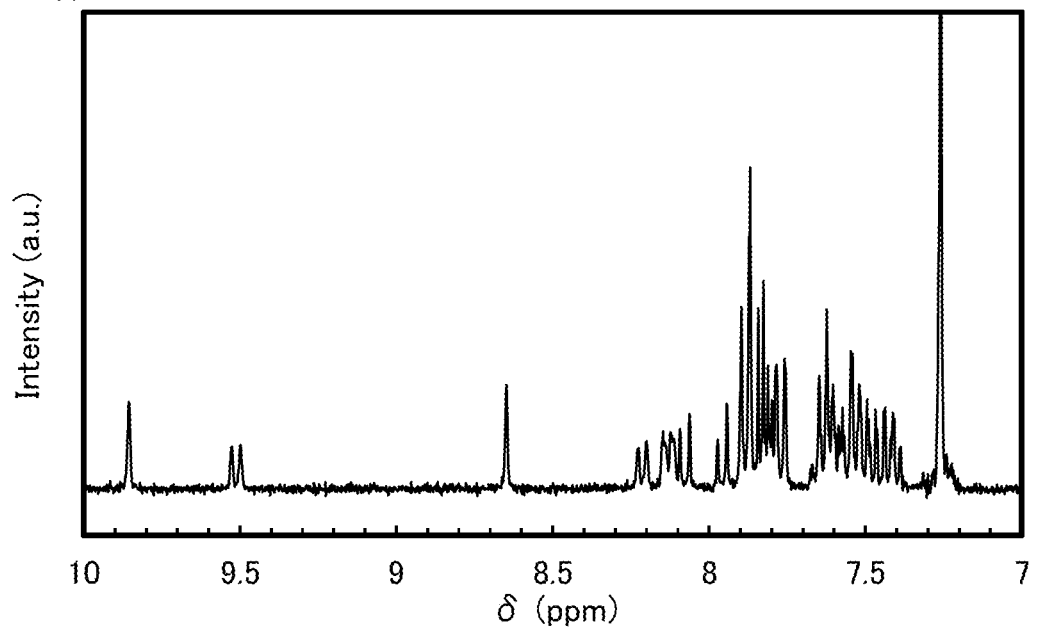

FIGS. 21A and 21B show $^1$H NMR spectra of cgBNCzPA.

<Measurement Apparatus and Fabrication Method of Measurement Sample>

The absorption spectrum of cgBNCzPA in the toluene solution was measured with an ultraviolet-visible light spectrophotometer (V550, manufactured by JASCO Corporation), and the absorption spectrum derived from toluene was subtracted.

The absorption spectrum of the solid thin film sample was measured with a spectrophotometer (U-4100 Spectrophotometer, manufactured by Hitachi High-Technologies Corporation), and the absorption spectrum and reflection derived from a quartz substrate was subtracted. Note that the solid thin film sample was formed over the quartz substrate by a vacuum evaporation method.

The emission spectrum was measured with a fluorescence spectrophotometer (FS920, manufactured by Hamamatsu Photonics K.K.).

The HOMO level and the LUMO level of the organic compound were calculated on the basis of a cyclic voltammetry (CV) measurement.

<Physical Properties>

The absorption spectrum of cgBNCzPA in the toluene solution had peaks at around 421 nm, 397 nm, 376 nm, and 350 nm, and the emission spectrum of cgBNCzPA in the toluene solution had peaks at 430 nm, 456 nm, and 484 nm (see FIG. 19). Note that light with a wavelength of 397 nm was used as excitation light.

The absorption spectrum of the solid thin film of cgBNCzPA had peaks at around 430 nm, 403 nm, 380 nm, 353 nm, 336 nm, and 302 nm, and the emission spectrum of the solid thin film of cgBNCzPA had peaks at around 487 nm and 680 nm (see FIG. 20). Note that light with a wavelength of 400 nm was used as excitation light.

The measurement result of the oxidation potential Ea [V] revealed that the HOMO level of cgBNCzPA is −5.56 eV. In contrast, the measurement result of the reduction potential Ec [V] revealed that the LUMO level of cgBNCzPA is −2.73 eV.

When the oxidation-reduction wave was repeatedly measured, in the Ea measurement, the peak intensity of the oxidation-reduction wave in the hundredth cycle was maintained to be 92% of that of the oxidation-reduction wave in the first cycle.

These results revealed that cgBNCzPA has a high light-transmitting property in a visible light region. Moreover, it was found from the emission spectrum of the solid thin film that cgBNCzPA is suitably used as a host material for a material that emits fluorescence having a longer wavelength than blue light. Furthermore, it was found that aggregation of the thin film of cgBNCzPA is not easily caused even under the air and the thin film suffers only a small change in shape and has high film quality. It was also found that cgBNCzPA has an extremely high resistance to oxidation.

Synthesis Method

A method for synthesizing cgBNCzPA will be described. Synthesis Schemes (SC2) to (SC4) are shown below.

Step 1: Synthesis of 1-(2-nitro-1-naphthyl)anthracene

Into a 200-mL three-necked flask, 2.5 g (7.7 mmol) of 2-nitro-1-triflatenaphthalene, 2.5 g (8.3 mmol) of 2-(1-anthryl)-4,4,5,5-tetramethyl-1,3,2-dioxaborolane, 1.6 g (15 mmol) of sodium carbonate, and 70 mL of toluene were put. The mixture was degassed by being stirred under reduced pressure, and the air in the flask was replaced with nitrogen. Then, 0.56 g (0.48 mmol) of tetrakis(triphenylphosphine)palladium(0) was added to the mixture, and the mixture was stirred at 130° C. under a nitrogen stream for 17 hours.

After the stirring, water was added to the obtained mixture and an aqueous layer was subjected to extraction with toluene. The obtained solution of the extract and the organic layer were combined and washed with saturated saline, and the organic layer was dried with magnesium sulfate.

The obtained mixture was gravity filtered, and the filtrate was concentrated to give an oily substance. A toluene solution of the obtained oily substance was suction-filtered through Celite and alumina, and the filtrate was concentrated, whereby an oily substance was obtained. The oily substance was purified by silica gel column chromatography (toluene:hexane=1:1) to give 1.7 g of a pale yellow solid, which was the target substance, in a yield of 61%.

[Chemical Formulae 37]

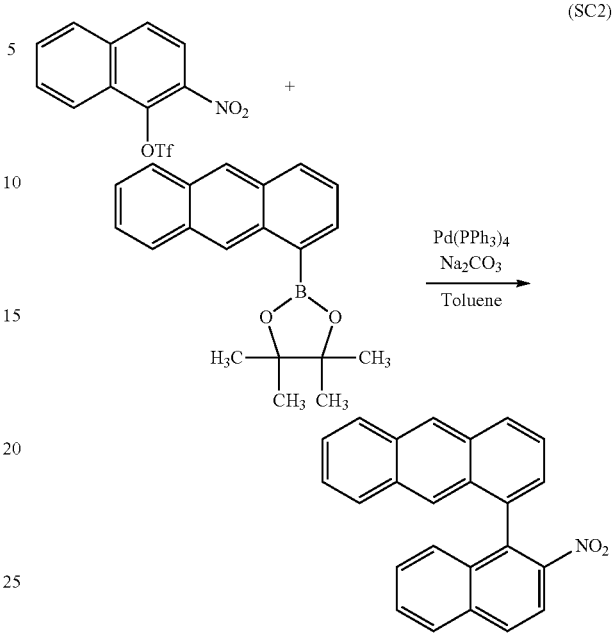

Step 2: Synthesis of 3H-benzo[c]naphtho[2,3-g]carbazole

Into a 100-mL three-necked flask, 1.8 g (5.1 mmol) of 1-(2-nitro-1-naphthyl)anthracene synthesized in Step 1 above, 5.5 g (21 mmol) of triphenylphosphine, and 40 mL of 1,2-dichlorobenzene were put. The solution was stirred under a nitrogen stream at 180° C. for 20 hours.

After the stirring, water was added to the obtained solution and an aqueous layer was subjected to extraction with toluene. The obtained solution of the extract and the organic layer were combined and washed with saturated saline, and the organic layer was dried with magnesium sulfate.

The obtained mixture was gravity filtered, and the filtrate was concentrated to give an oily substance. The obtained oily substance was purified by silica gel column chromatography (hexane:toluene=1:2) to give an oily substance. Hexane was added to the obtained oily substance, the mixture was irradiated with ultrasonic waves, and the precipitated solid was collected by suction filtration, whereby 1.3 g of a yellow powder, which was the target substance, was obtained in a yield of 78%.

[Chemical Formulae 38]

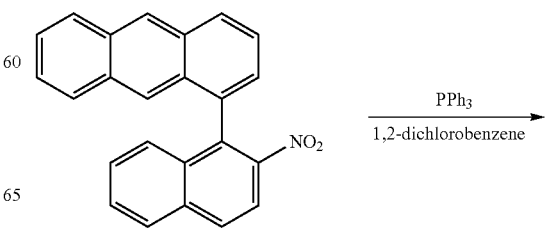

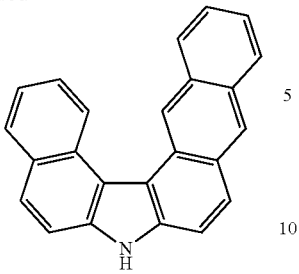

Step 3: Synthesis of 3-[4-(10-phenyl-9-anthryl)phenyl]-3H-benzo[c]naphtho[2,3-g]carbazole Into a 50-mL three-necked flask, 1.0 g (2.5 mmol) of 9-(4-bromophenyl)-10-phenylanthracene, 0.79 g (2.5 mmol) of 3H-benzo[c]naphtho[2,3-g]carbazole synthesized in Step 2 above, 0.52 g (3.8 mmol) of potassium carbonate, 0.26 g (1.0 mmol) of 18-crown-6-ether, 4 mL of 1,3-dimethyl-3,4,5,6-tetrahydro-2(1H)-pyrimidinone (DMPU), and 0.13 g (0.67 mmol) of copper(I) iodide were put. The mixture was stirred under a nitrogen stream at 180° C. for 28 hours.

After the stirring, the mixture was cooled to 80° C., water was added thereto, and an aqueous layer was subjected to extraction with toluene. The obtained solution of the extract was washed with saturated saline, and the organic layer was dried with magnesium sulfate.

The obtained mixture was gravity filtered, and the filtrate was concentrated to give an oily substance. The oily substance was purified by silica gel column chromatography (toluene:hexane=1:3) and recrystallized with toluene/hexane to give 0.79 g of a yellow powder, which was the target substance, in a yield of 49%.

[Chemical Formulae 39]

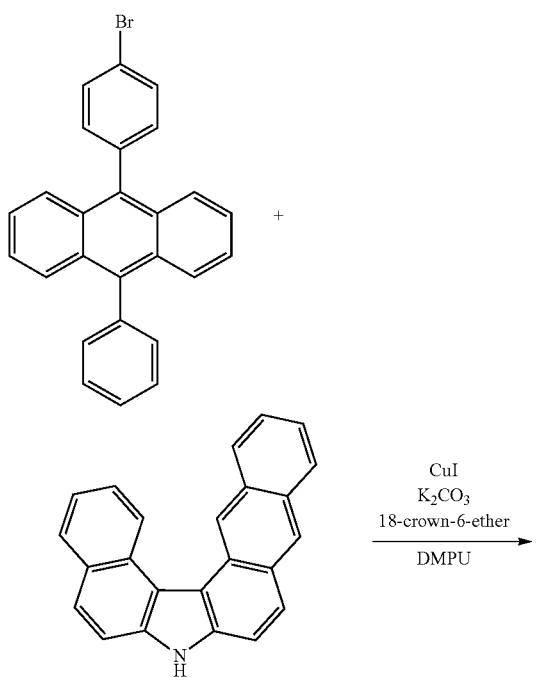

(SC4)

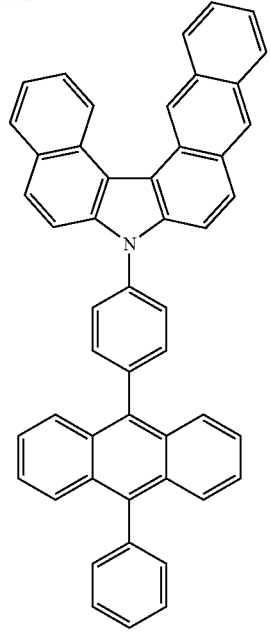

By a train sublimation method, 0.75 g of the obtained powder of 3-[4-(10-phenyl-9-anthryl)phenyl]-3H-benzo[c]naphtho[2,3-g]carbazole was purified. In the purification by sublimation, 3-[4-(10-phenyl-9-anthryl)phenyl]-3H-benzo[c]naphtho[2,3-g]carbazole was heated at 350° C. for 17 hours under a pressure of 3.5 Pa with the argon flow rate of 15 mL/min. After the purification by sublimation, 0.62 g of a pale yellow powder of 3-[4-(10-phenyl-9-anthryl)phenyl]-3H-benzo[c]naphtho[2,3-g]carbazole was obtained in a yield of 83%.

[$^1$H NMR]

FIGS. 21A and 21B show the $^1$H NMR spectra of the obtained compound in a $CDCl_3$ solution. In addition, numerical data is shown below. This indicates that cgBNCzPA was obtained in this synthesis example.

$^1$H NMR ($CDCl_3$, 300 MHz): δ=7.39-7.65 (m, 12H), 7.76-7.90 (m, 11H), 7.96 (d, J=9.0 Hz, 1H), 8.06-8.15 (m, 3H), 8.21 (d, J=7.8 Hz, 1H), 8.65 (s, 1H), 9.51 (d, J=8.4 Hz, 1H), 9.86 (s, 1H).

Synthesis Example 3

In this example, physical properties of the organic compound of one embodiment of the present invention and a method for synthesizing the organic compound will be described with reference to FIG. 22, FIG. 23, and FIGS. 24A and 24B. Specifically, physical properties of 9-[4-(carbazol-9-yl)phenyl]-5-phenylnaphtho[2,3-c]carbazole (abbreviation: 9CzPPcNC) represented by Structural Formula (135) in Embodiment 1 and a method for synthesizing 9CzPPcNC will be described. The structural formula of 9CzPPcNC is shown below.

[Chemical Formula 40]

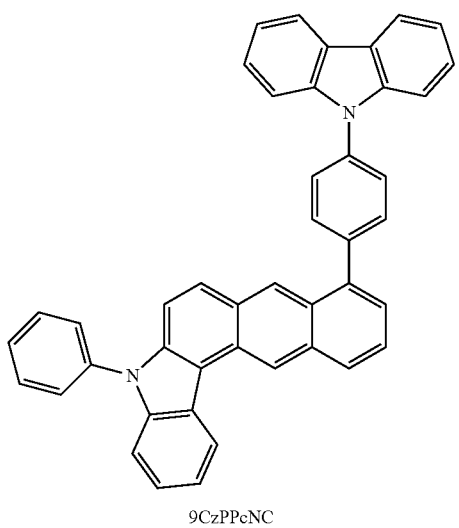

9CzPPcNC

Figure 22:
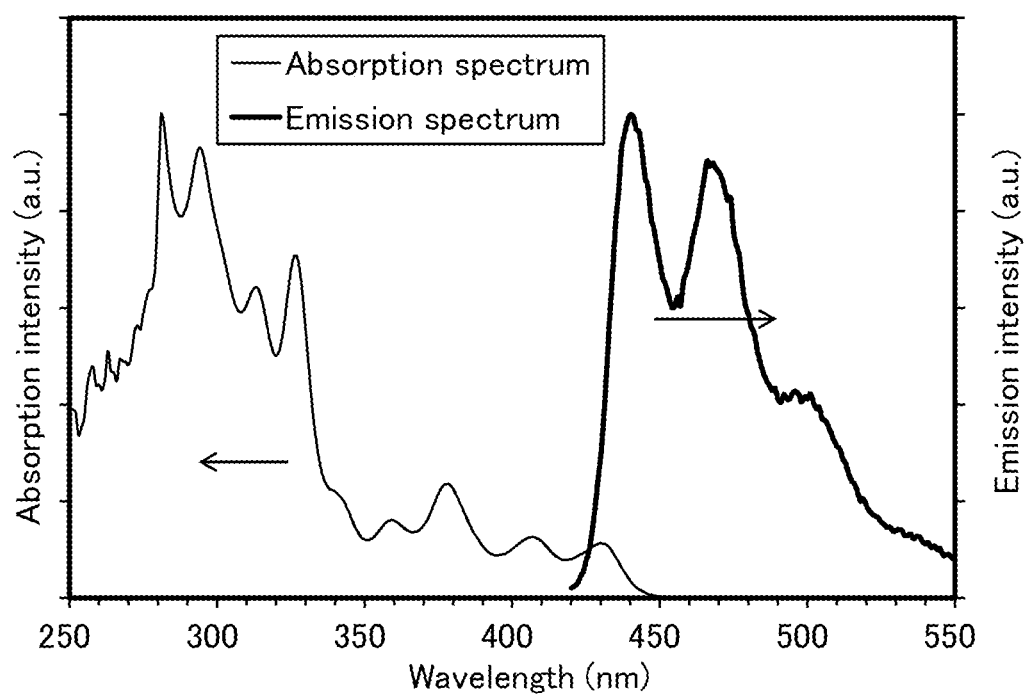
FIG. 22 shows an absorption spectrum and an emission spectrum of 9CzPPcNC in a toluene solution.

FIG. 22 shows an absorption spectrum and an emission spectrum of 9CzPPcNC in a toluene solution.

Figure 23:
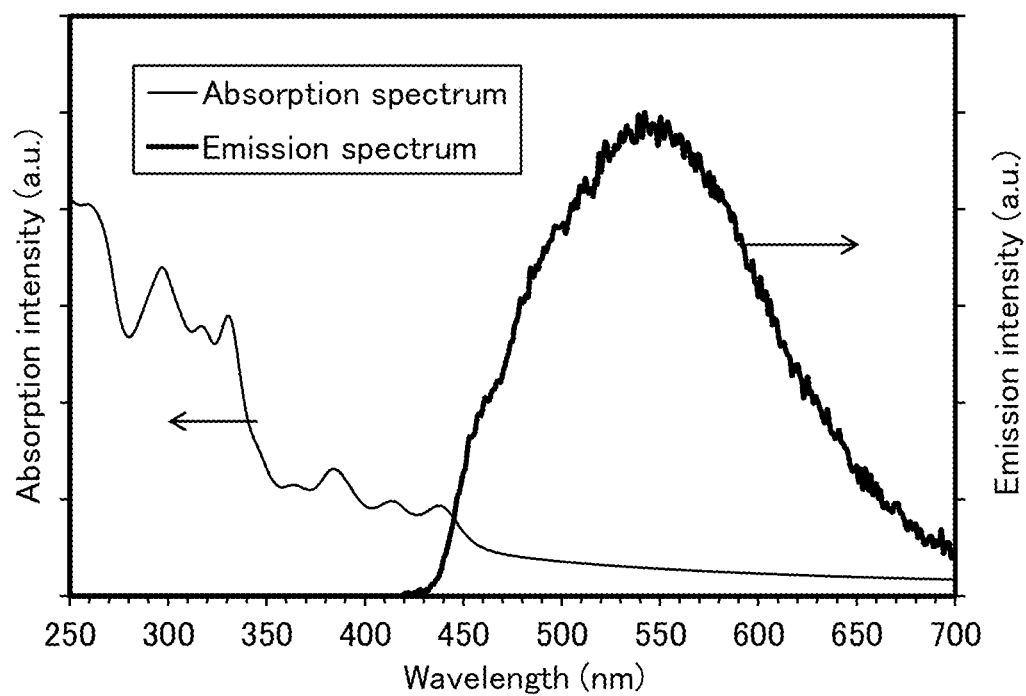
FIG. 23 shows an absorption spectrum and an emission spectrum of a thin film of 9CzPPcNC.

FIG. 23 shows an absorption spectrum and an emission spectrum of a solid thin film of 9CzPPcNC.

Figure 24A:
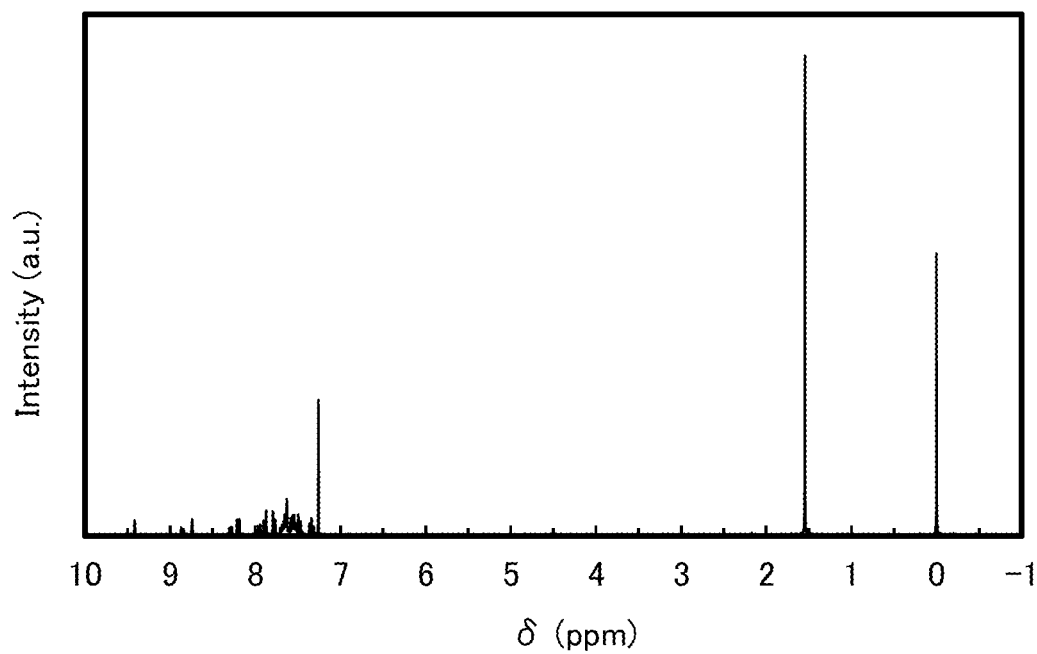
FIGS. 24A and 24B show $^1$H NMR spectra of 9CzPPcNC.
Figure 24B:
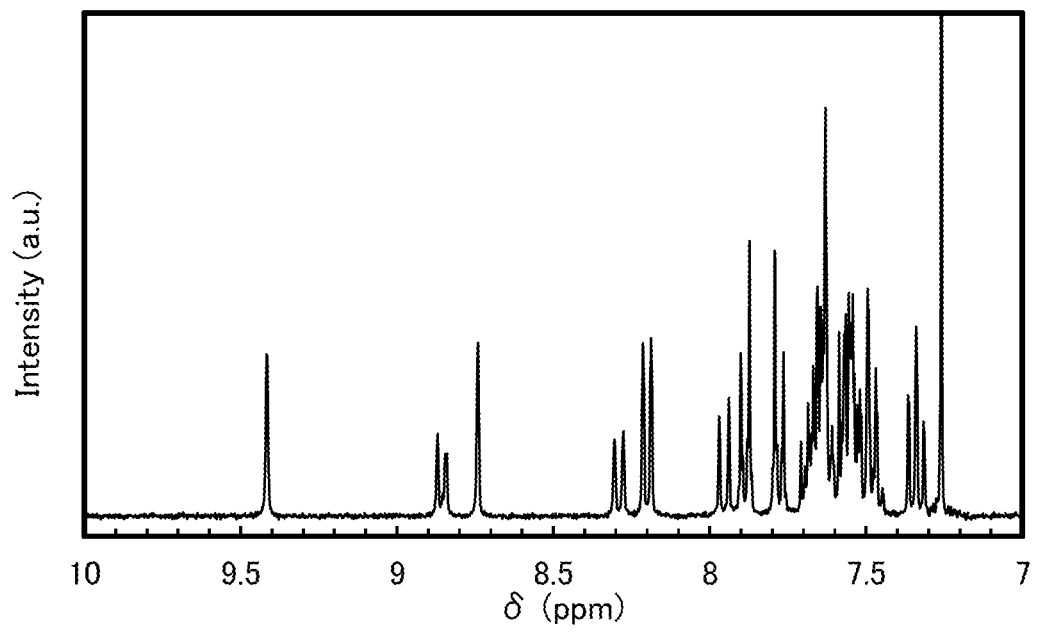

FIGS. 24A and 24B show $^1$H NMR spectra of 9CzPPcNC.

<Measurement Apparatus and Fabrication Method of Measurement Sample>

The absorption spectrum of 9CzPPcNC in the toluene solution was measured with an ultraviolet-visible light spectrophotometer (V550, manufactured by JASCO Corporation), and the absorption spectrum derived from toluene was subtracted.

The absorption spectrum of the solid thin film sample was measured with an ultraviolet-visible light spectrophotometer (V550, manufactured by JASCO Corporation), and the absorption spectrum derived from a quartz substrate was subtracted. Note that the solid thin film sample was formed over the quartz substrate by a vacuum evaporation method.

The emission spectrum was measured with a fluorescence spectrophotometer (FS920, manufactured by Hamamatsu Photonics K.K.).

The HOMO level and the LUMO level of the organic compound were calculated on the basis of a cyclic voltammetry (CV) measurement.

<Physical Properties>

The absorption spectrum of 9CzPPcNC in the toluene solution had peaks at around 430 nm, 407 nm, 378 nm, 359 nm, 327 nm, and 313 nm, and the emission spectrum of 9CzPPcNC in the toluene solution had peaks at 440 nm, 467 nm, and 498 nm (see FIG. 22). Note that light with a wavelength of 408 nm was used as excitation light.

The absorption spectrum of the solid thin film of 9CzPPcNC had peaks at around 438 nm, 414 nm, 384 nm, 364 nm, 347 nm, 330 nm, and 317 nm, and the emission spectrum of the solid thin film of 9CzPPcNC had a peak at around 545 nm (see FIG. 23). Note that light with a wavelength of 414 nm was used as excitation light. In a region with a wavelength longer than around 450 nm and even in a region with a wavelength shorter than around 450 nm, the intensity of the absorption spectrum of the solid thin film sample includes the intensity derived from the reflection by the substrate.

The measurement result of the oxidation potential Ea [V] revealed that the HOMO level of 9CzPPcNC is −5.58 eV In contrast, the measurement result of the reduction potential Ec [V] revealed that the LUMO level of 9CzPPcNC is −2.69 eV.

Thus, it was found from the emission spectrum of the solid thin film that 9CzPPcNC is suitably used as a host material for a material that emits green fluorescence and fluorescence having a longer wavelength than green fluorescence. It was found that aggregation of the thin film of 9CzPPcNC is not easily caused even under the air and the thin film suffers only a small change in shape and has high film quality.

Synthesis Method

A method for synthesizing 9CzPPcNC will be described. Synthesis Schemes (SC5) to (SC9) are shown below.

Step 1: Synthesis of 2-(5-[4-(carbazol-9-yl)phenyl]-1-anthryl)-4,4,5,5-tetramethyl-1,3,2-dioxaborolane Into a 200-mL three-necked flask, 2.5 g (8.7 mmol) of 4-(carbazol-9-yl)phenylboronic acid, 3.1 g (9.3 mmol) of 1,5-dibromoanthracene, 0.27 g (0.89 mmol) of tris(2-methylphenyl)phosphine, 2.5 g (18 mmol) of potassium carbonate, 85 mL of toluene, 9 mL of ethanol, and 9 mL of water were put. The mixture was degassed by being stirred under reduced pressure, and the air in the flask was replaced with nitrogen. Then, 44 mg (0.20 mmol) of palladium(II) acetate was added to the mixture, and the mixture was stirred at 80° C. under a nitrogen stream for 7 hours.

After the stirring, water and toluene were added to the obtained mixture, and the precipitated solid was removed by suction filtration. An aqueous layer of the mixture was subjected to extraction with toluene, the solution of the extract and the organic layer were combined and washed with saturated saline, and the organic layer was dried with magnesium sulfate.

The obtained mixture was gravity filtered, and the filtrate was concentrated to give a solid. A toluene solution of the obtained solid was suction-filtered through Celite and alumina, and the filtrate was concentrated, whereby a solid was obtained. Methanol was added to the solid, the mixture was irradiated with ultrasonic waves, and the precipitated solid was collected, whereby a crude product of 9-[4-(5-bromo-1-anthryl)phenyl]carbazole, which was the intermediate, was obtained. The synthesis scheme of the above step is shown below.

[Chemical Formulae 41]

(SC5)

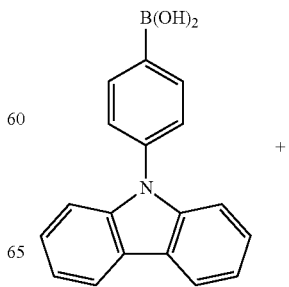

+

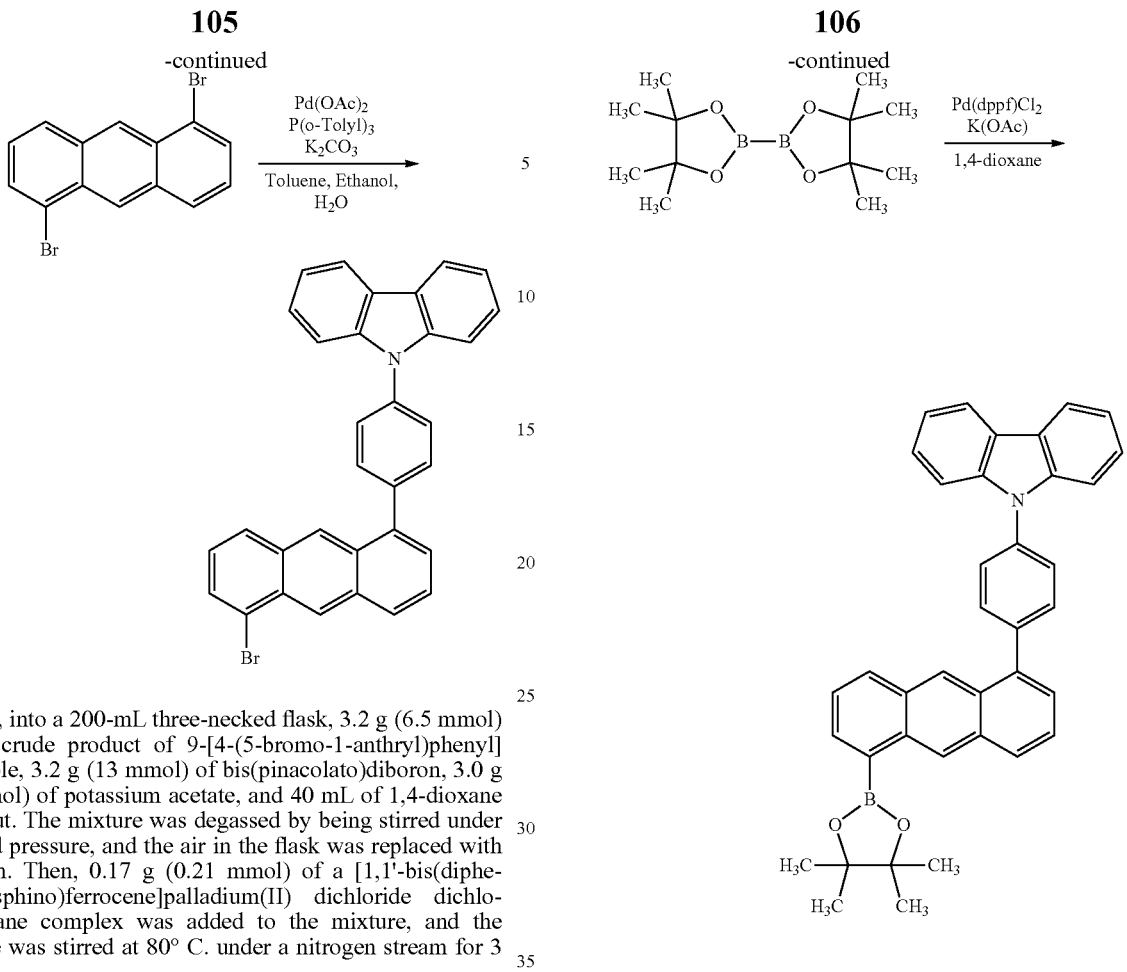

Next, into a 200-mL three-necked flask, 3.2 g (6.5 mmol) of the crude product of 9-[4-(5-bromo-1-anthryl)phenyl]carbazole, 3.2 g (13 mmol) of bis(pinacolato)diboron, 3.0 g (31 mmol) of potassium acetate, and 40 mL of 1,4-dioxane were put. The mixture was degassed by being stirred under reduced pressure, and the air in the flask was replaced with nitrogen. Then, 0.17 g (0.21 mmol) of a [1,1'-bis(diphenylphosphino)ferrocene]palladium(II) dichloride dichloromethane complex was added to the mixture, and the mixture was stirred at 80° C. under a nitrogen stream for 3 hours.

After the stirring, water was added to the mixture and an aqueous layer was subjected to extraction with toluene. The obtained solution of the extract and the organic layer were combined and washed with saturated saline, and the organic layer was dried with magnesium sulfate.

The mixture was gravity filtered, and the filtrate was concentrated to give a solid. The obtained solid was purified by silica gel column chromatography (toluene:hexane=1:1) to give 1.8 g of a pale yellow oily substance, which was the target substance, in a yield of 38%. The synthesis scheme of the above step is shown below.

[Chemical Formulae 42]

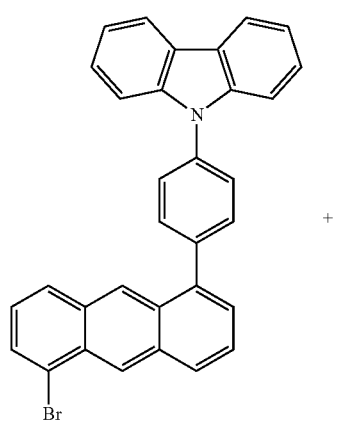

(SC6)

+

Step 2: Synthesis of 9-{4-[5-(2-nitrophenyl)-1-anthryl]phenyl}carbazole

Into a 200-mL three-necked flask, 1.8 g (3.3 mmol) of 2-(5-[4-(carbazol-9-yl)phenyl]-1-anthryl)-4,4,5,5-tetramethyl-1,3,2-dioxaborolane synthesized in Step 1 above, 0.86 g (4.3 mmol) of 1-bromo-2-nitrobenzene, 0.12 g (0.87 mmol) of tris(2-methylphenyl) phosphine, 0.96 g (6.9 mmol) of potassium carbonate, 35 mL of toluene, 3.5 mL of ethanol, and 3.5 mL of water were put. The mixture was degassed by being stirred under reduced pressure, and the air in the flask was replaced with nitrogen. Then, 28 mg (93 μmol) of palladium(II) acetate was added to the mixture, and the mixture was stirred at 80° C. under a nitrogen stream for 7 hours.

After the stirring, water was added to the obtained mixture and an aqueous layer was subjected to extraction with toluene. The obtained solution of the extract and the organic layer were combined and washed with saturated saline, and the organic layer was dried with magnesium sulfate.

The obtained mixture was gravity filtered, and the filtrate was concentrated to give an oily substance. A toluene solution of the obtained oily substance was suction-filtered through Celite and alumina, and the filtrate was concentrated, whereby an oily substance was obtained. Hexane/ethanol was added to the oily substance, the mixture was irradiated with ultrasonic waves, and the precipitated solid was collected, whereby 1.4 g of a solid, which was the target substance, was obtained in a yield of 76%. The synthesis scheme of Step 2 is shown below.

[Chemical Formulae 43]

(SC7)

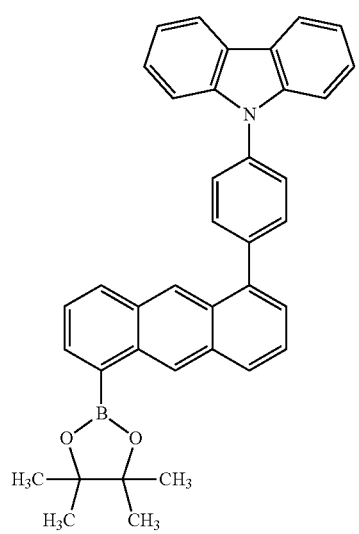

+

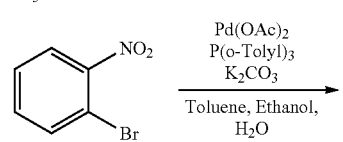

Pd(OAc)$_2$
P(o-Tolyl)$_3$
K$_2$CO$_3$
———————
Toluene, Ethanol,
H$_2$O

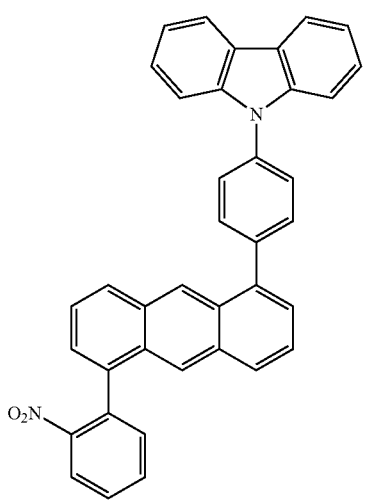

Step 3: Synthesis of 9-[4-(carbazol-9-yl)phenyl]naphtho[2,3-c]carbazole

Into a 200-mL three-necked flask, 1.4 g (2.5 mmol) of 9-{4-[5-(2-nitrophenyl)-1-anthryl]phenyl}carbazole synthesized in Step 2 above, 1.4 g (5.3 mmol) of triphenylphosphine, and 30 mL of 1,2-dichlorobenzene were put. The solution was stirred under a nitrogen stream at 180° C. for 27 hours.

After the stirring, the solvent was distilled off under reduced pressure. The obtained solid was purified by silica gel column chromatography (hexane:toluene=1:1) to give 0.47 g of a yellow powder, which was the target substance, in a yield of 37%. The synthesis scheme of Step 3 is shown below.

[Chemical Formulae 44]

(SC8)

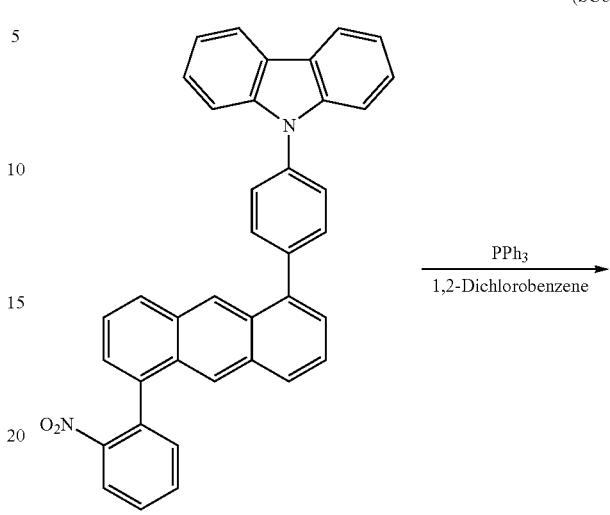

PPh$_3$
———————
1,2-Dichlorobenzene

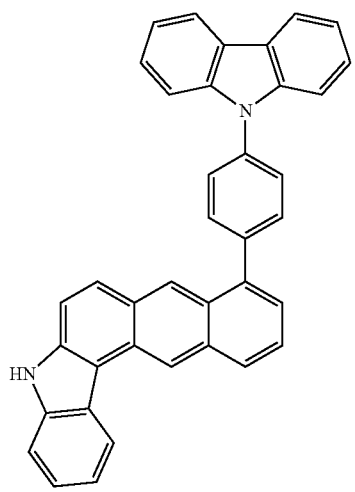

Step 4: Synthesis of 9-[4-(carbazol-9-yl)phenyl]-5-phenylnaphtho[2,3-c]carbazole Into a 50-mL three-necked flask, 0.94 g (1.8 mmol) of 9-[4-(carbazol-9-yl)phenyl]naphtho[2,3-c]carbazole synthesized in Step 3 above, 0.67 g (3.3 mmol) of iodobenzene, 85 mg (0.45 mmol) of copper(I) iodide, 0.34 g (0.75 mmol) of 18-crown-6-ether, 1.1 g (8.2 mmol) of potassium carbonate, and 7 mL of 1,3-dimethyl-3,4,5,6-tetrahydro-2(1H)-pyrimidinone were put. The mixture was stirred under a nitrogen stream at 180° C. for 22 hours.

After the stirring, the mixture was cooled to room temperature, and water was added thereto. An aqueous layer of the mixture was subjected to extraction with toluene, and the solution of the extract was washed with saturated saline and then dried with magnesium sulfate. The mixture was gravity filtered, and the filtrate was concentrated to give an oily substance.

The obtained oily substance was purified by silica gel column chromatography (toluene:hexane=1:2) and recrystallized with toluene/ethyl acetate to give 0.84 g of a pale yellow powder, which was the target substance, in a yield of 78%. The synthesis scheme of Step 4 is shown below.

[Chemical Formulae 45]

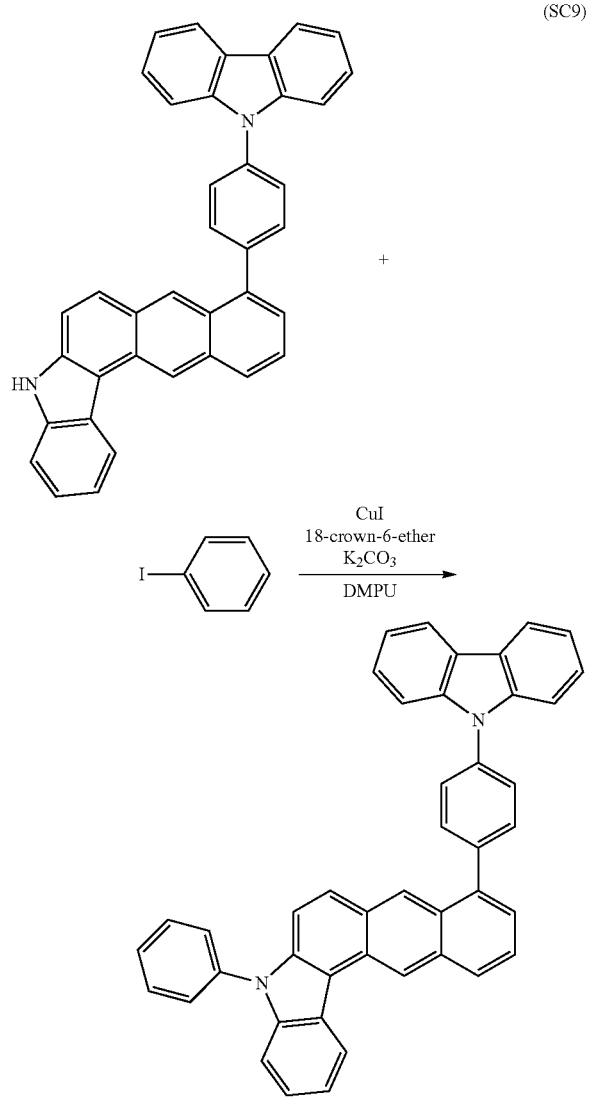

By a train sublimation method, 0.76 g of the obtained powder of 9-[4-(carbazol-9-yl)phenyl]-5-phenylnaphtho[2,3-c]carbazole was purified. In the purification by sublimation, 9-[4-(carbazol-9-yl)phenyl]-5-phenylnaphtho[2,3-c]carbazole was heated at 290° C. for 21 hours under a pressure of 4.4 Pa with the argon flow rate of 5.0 mL/min. After the purification by sublimation, 0.71 g of a pale yellow powder of 9-[4-(carbazol-9-yl)phenyl]-5-phenylnaphtho[2,3-c]carbazole was obtained in a yield of 93%.

[$^1$H NMR]

FIGS. 24A and 24B show the $^1$H NMR spectra of the obtained compound in a CDCl$_3$ solution. In addition, numerical data is shown below. This indicates that 9CzPPcNC was obtained in this synthesis example.

$^1$H NMR (CDCl$_3$, 300 MHz): δ=7.31-7.37 (m, 2H), 7.45-7.71 (m, 15H), 7.78 (d, J=8.7 Hz, 2H), 7.89 (d, J=8.7 Hz, 2H), 7.95 (d, J=9.3 Hz, 1H), 8.20 (d, J=7.8 Hz, 2H), 8.29 (d, J=8.4 Hz, 1H), 8.74 (s, 1H), 8.85 (d, J=8.7 Hz, 1H), 9.42 (s, 1H).

Example 2

In this example, thin films formed using the synthesized organic compounds of embodiments of the present invention will be described with reference to FIG. 25.

Figure 25:
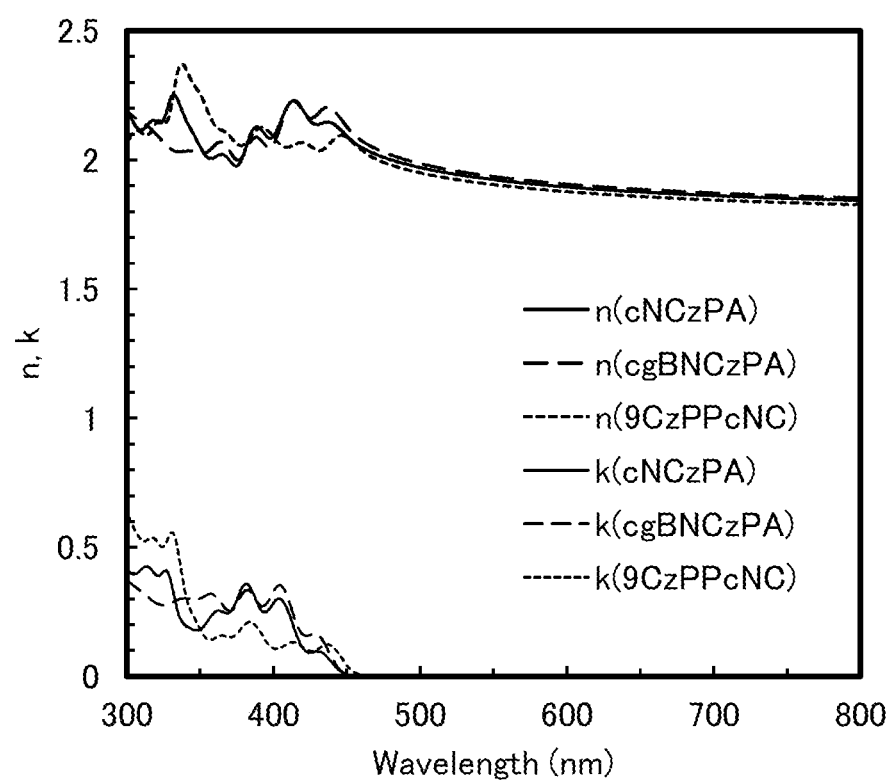
FIG. 25 shows refractive index-wavelength characteristics and attenuation coefficient-wavelength characteristics of organic compounds in Example.

FIG. 25 shows wavelength-refractive index characteristics and wavelength-attenuation coefficient characteristics of the thin films of the organic compounds. In this specification, when the measured material has both the ordinary refractive index and the extraordinary refractive index, the ordinary refractive index is used as an indicator. In FIG. 25, the vertical axis represents a refractive index n and an attenuation coefficient k.

The organic materials of embodiments of the present invention each have a high light-transmitting property and a high refractive index with respect to light with a wavelength of 450 nm. Thus, for example, when a thin film of the organic material of one embodiment of the present invention is formed such that an electrode through which light from a light-emitting device is extracted is interposed between the thin film and a light-emitting layer, the light from the light-emitting device can be efficiently extracted. Alternatively, a thin film of the organic material of one embodiment of the present invention can be suitably used as a cap layer of a light-emitting device. Alternatively, for example, when an inorganic film is formed as a sealing film (cap layer) over an electrode through which light from a light-emitting device is extracted, the organic material of one embodiment of the present invention is preferably formed between the electrode and the inorganic film because light extraction efficiency is increased. In this case, since the refractive index at around 450 nm of the organic material of one embodiment of the present invention is around 2 (1.9 to 2.1), the inorganic film can have a higher refractive index (1.9 to 2.5). For the inorganic film, for example, silicon oxynitride can be used. The thickness of the inorganic film is preferably less than or equal to 1 μm. The inorganic film and the organic material of one embodiment of the present invention may be stacked repeatedly to form a sealing film (cap layer). A thin film of the organic material of one embodiment of the present invention has a high light-transmitting property and a high refractive index in the whole visible region, and can be suitably used as a cap layer of a light-emitting device.

Example 3

In this example, a fabricated light-emitting device 1 of one embodiment of the present invention will be described with reference to FIG. 26, FIG. 27, FIG. 28, FIG. 29, FIG. 30, FIG. 31, and FIG. 32.

Figure 26:
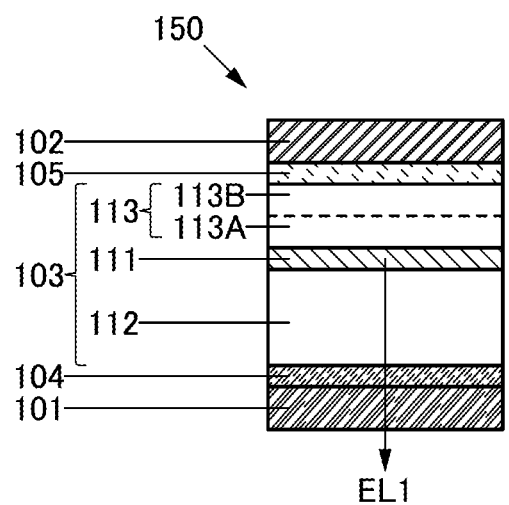
FIG. 26 illustrates a structure of a light-emitting device in Example.

FIG. 26 illustrates a structure of the light-emitting device.

Figure 27:
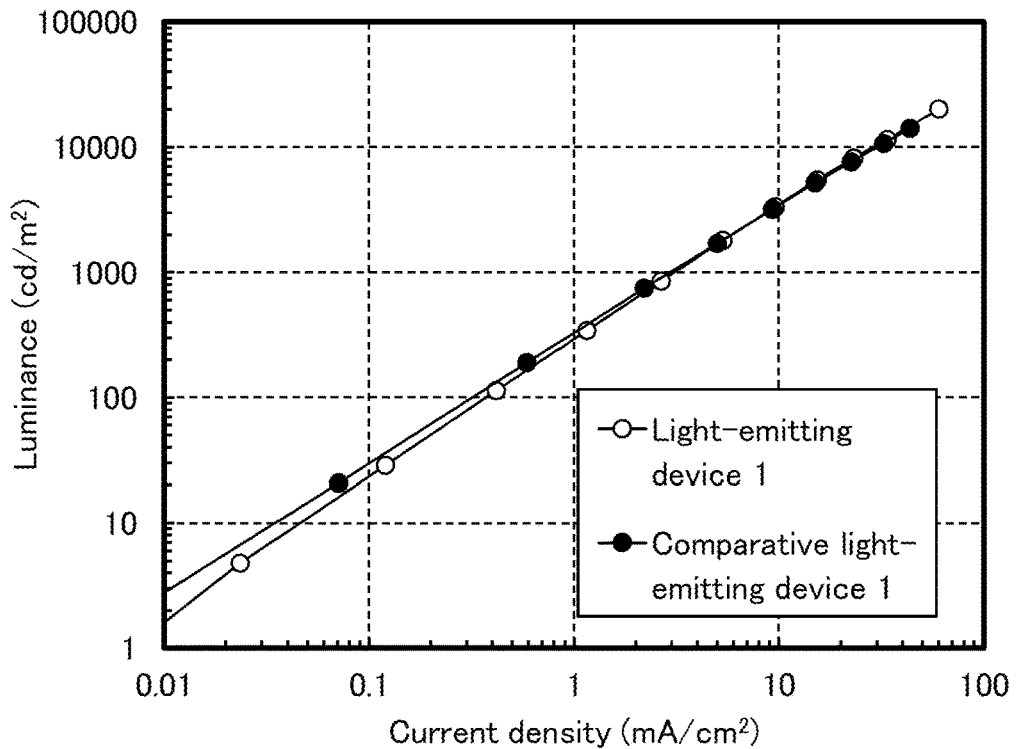
FIG. 27 shows current density-luminance characteristics of light-emitting devices in Example.

FIG. 27 shows current density-luminance characteristics of light-emitting devices.

Figure 28:
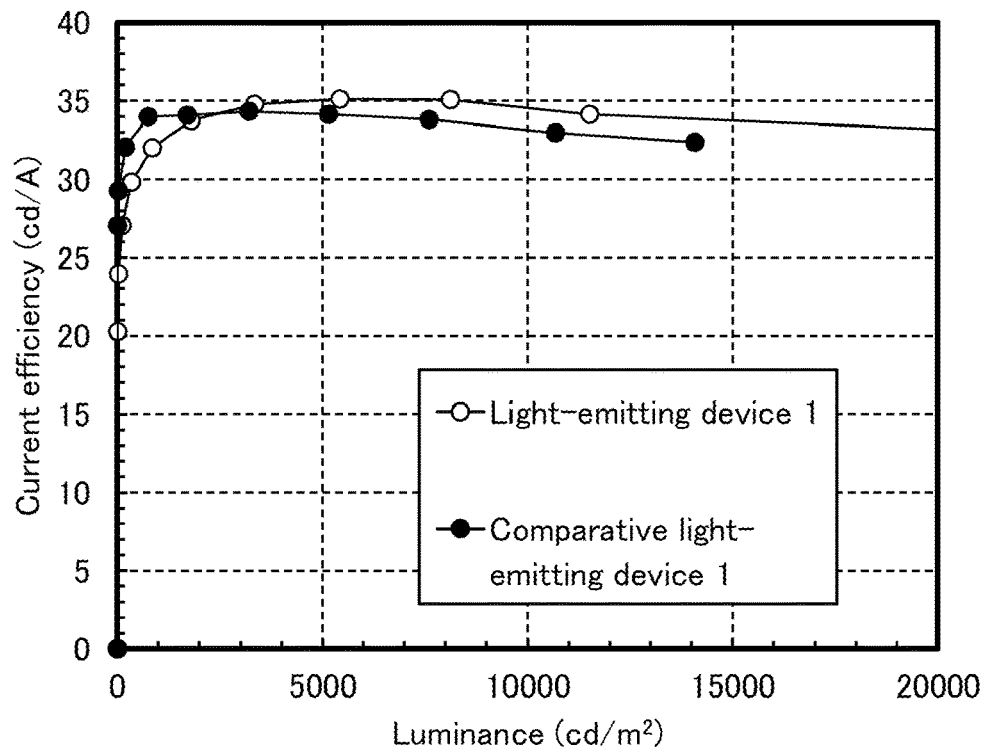
FIG. 28 shows luminance-current efficiency characteristics of the light-emitting devices in Example.

FIG. 28 shows luminance-current efficiency characteristics of the light-emitting devices.

Figure 29:
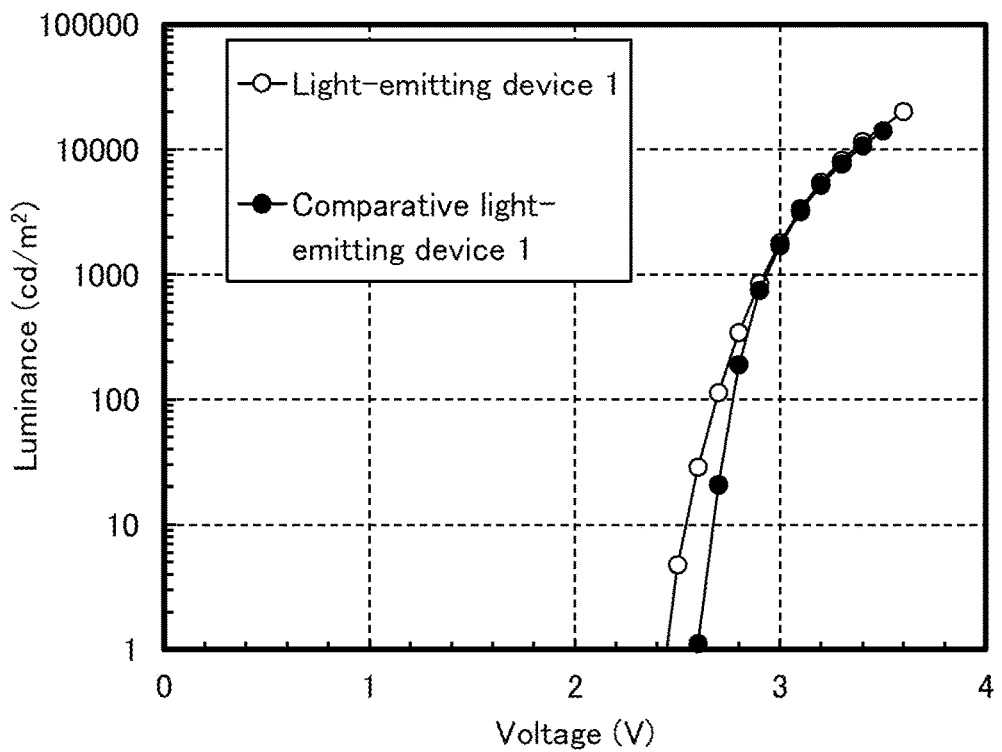
FIG. 29 shows voltage-luminance characteristics of the light-emitting devices in Example.

FIG. 29 shows voltage-luminance characteristics of the light-emitting devices.

Figure 30:
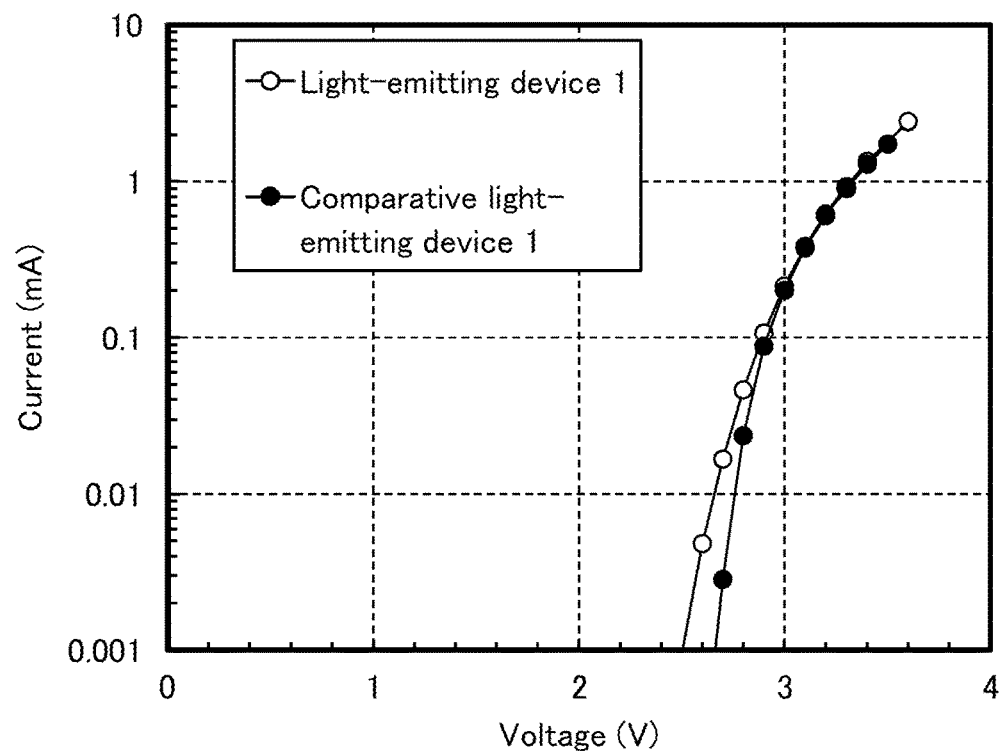
FIG. 30 shows voltage-current characteristics of the light-emitting devices in Example.

FIG. 30 shows voltage-current characteristics of the light-emitting devices.

Figure 31:
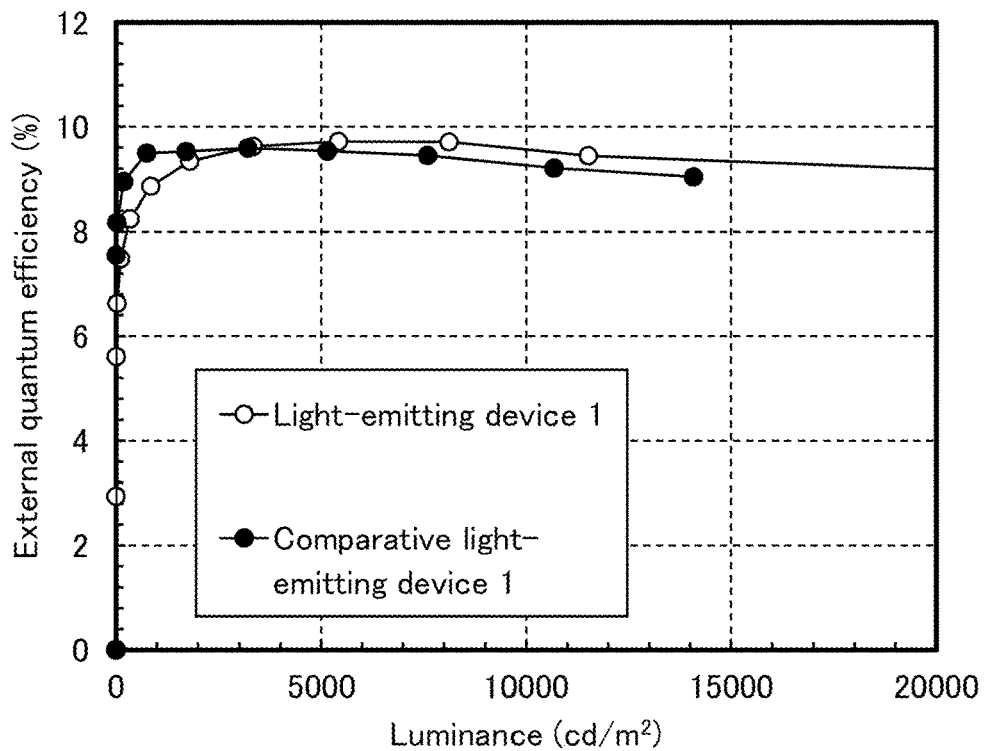
FIG. 31 shows luminance-external quantum efficiency characteristics of the light-emitting devices in Example.

FIG. 31 shows luminance-external quantum efficiency characteristics of the light-emitting devices. Note that the external quantum efficiency was calculated from an emission spectrum and luminance in frontal observation assuming that the light distribution characteristics of the light-emitting device are Lambertian type.

Figure 32:
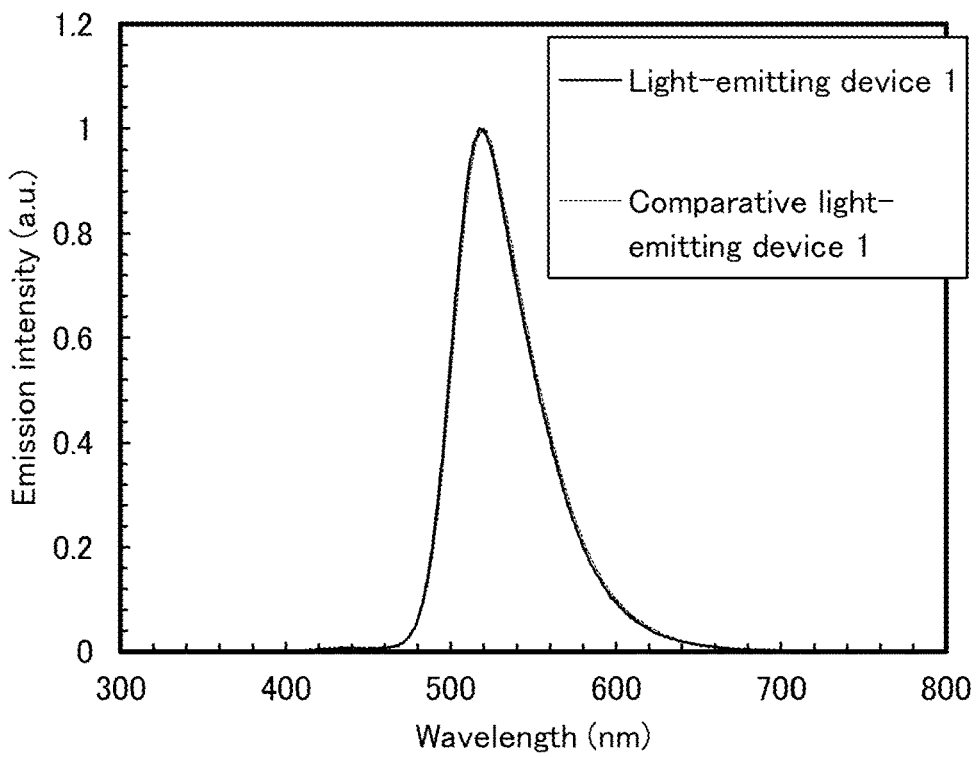
FIG. 32 shows emission spectra of the light-emitting devices in Example.

FIG. 32 shows emission spectra of the light-emitting devices emitting light with a luminance of 1000 cd/m$^2$.

<Light-Emitting Device 1>

The fabricated light-emitting devices described in this example each have a structure similar to that of the light-emitting device 150 (see FIG. 26).

The light-emitting device 150 includes the electrode 101, the electrode 102, the layer 111, and the unit 103. The electrode 102 includes a region overlapping with the electrode 101.

The unit 103 includes a region between the electrode 101 and the electrode 102. The light-emitting device includes the layer 104 and the layer 105. The layer 104 includes a region between the electrode 101 and the unit 103, and the layer 105 includes a region between the unit 103 and the electrode 102.

The unit 103 includes the layer 111, the layer 112, and the layer 113. The layer 112 includes a region between the electrode 101 and the layer 111.

The layer 111 includes a region between the layer 112 and the layer 113. The layer 111 includes a region between the electrode 101 and the electrode 102, and contains a light-emitting material and the charge-transport material CTM.

The layer 113 includes a region between the layer 111 and the electrode 102. The layer 113 includes a layer 113A and a layer 113B. The layer 113A includes a region between the layer 111 and the layer 113B, and contains the charge-transport material CTM.

The charge-transport material CTM is an organic compound of one embodiment of the present invention. For example, the organic compound described in Embodiment 1 can be used as the charge-transport material CTM.

<<Structure of Light-Emitting Device 1>>

Table 1 shows a structure of the light-emitting device 1. Note that in the light-emitting device 1, 5-[4-(10-phenyl-9-anthryl)phenyl]-5H-naphtho[2,3-c]carbazole (abbreviation: cNCzPA) was used as the charge-transport material CTM.

Structural formulae of materials used in the light-emitting devices described in this example are shown below (structural formulae of materials used in the light-emitting devices as well as the light-emitting device 1 are shown below, and the structures of the light-emitting devices other than the light-emitting device 1 will be described later).

TABLE 1

| Structure | Reference numeral | Material | Composition ratio | Thickness/nm |
|---|---|---|---|---|
| Electrode | 102 | Al | | 200 |
| Layer | 105 | Lif | | 1 |
| Layer | 113B | Bphen | | 15 |
| Layer | 113A | CTM | | 10 |
| Layer | 111 | CTM: 9,10mMemFLPA2A | 1:0.1 | 25 |
| Layer | 112 | PCPPn | | 30 |
| Layer | 104 | PCPPn:MoOx | 4:2 | 10 |
| Electrode | 101 | ITSO | | 70 |

[Chemical Formulae 46]

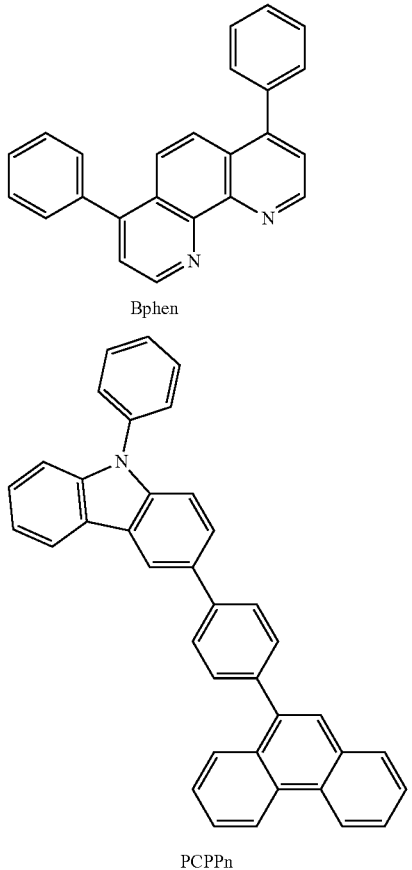

Bphen

PCPPn

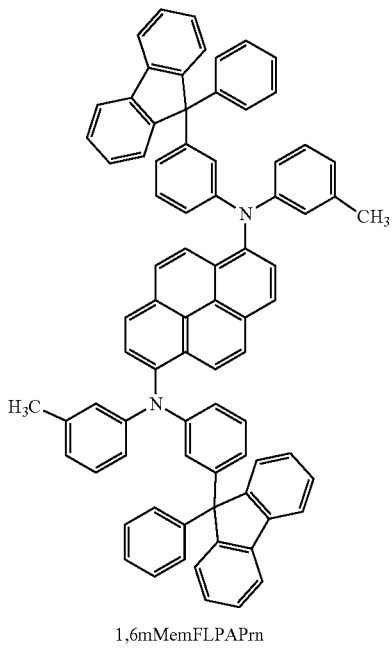

1,6mMemFLPAPrn

-continued

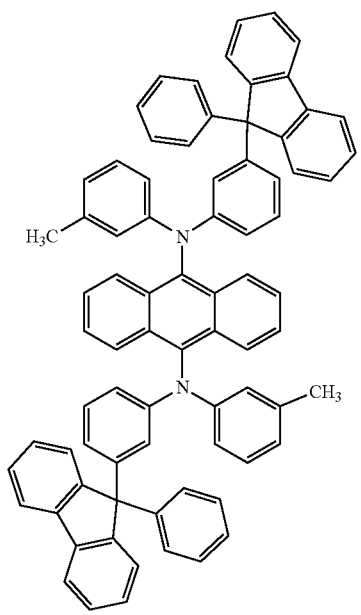

9,10mMemFLPA2A

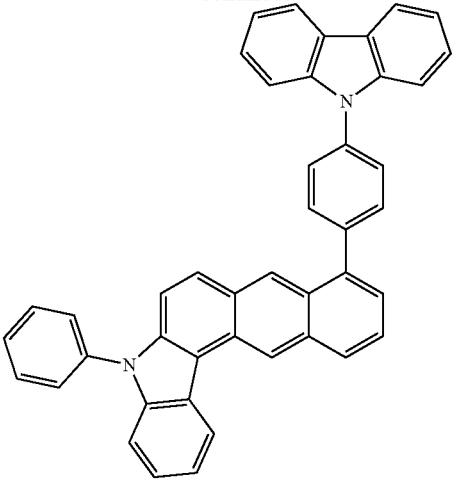

9CzPPcNC

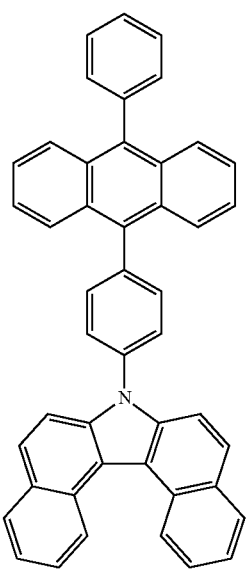

cgDBCzPA

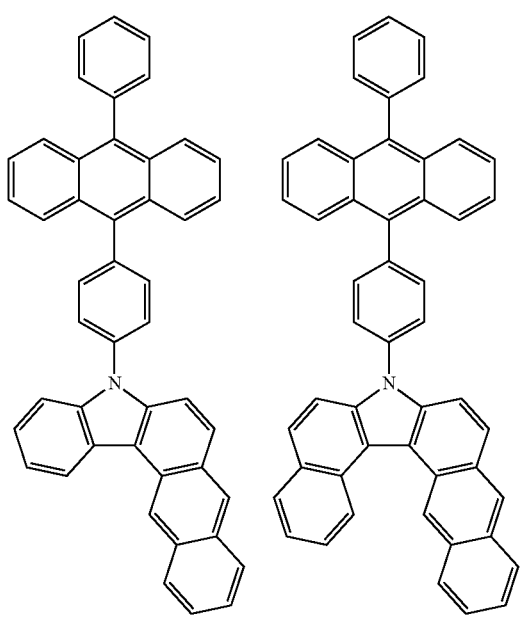

cNCzPA    cgBNCzPA

<<Fabrication Method of Light-Emitting Device 1>>

The light-emitting device 1 described in this example was fabricated using a method including steps described below.

[First Step]

In a first step, the electrode 101 was formed. Specifically, the electrode 101 was formed by a sputtering method using indium oxide-tin oxide containing silicon or silicon oxide (abbreviation: ITSO) as a target.

Note that the electrode 101 contains ITSO and has a thickness of 70 nm. Next, a substrate over which the electrode 101 was formed was washed with water, baked at 200° C. for an hour, and then subjected to UV ozone treatment for 370 seconds. After that, the substrate was transferred into a vacuum deposition apparatus whose pressure was reduced to approximately $10^{-4}$ Pa, and vacuum baking at 170° C. for 30 minutes was performed in a heating chamber of the vacuum deposition apparatus. Then, the substrate was allowed to cool for approximately 30 minutes.

[Second Step]

In a second step, the layer 104 was formed over the electrode 101. Specifically, materials were co-deposited by a resistance-heating method.

Note that the layer 104 contains 9-[4-(9-phenyl-9H-carbazol-3-yl)-phenyl]phenanthrene (abbreviation: PCPPn) and molybdenum oxide (abbreviation: MoOx) at a weight ratio of 4:2 and has a thickness of 10 nm.

[Third Step]

In a third step, the layer 112 was formed over the layer 104. Specifically, a material was deposited by a resistance-heating method.

Note that the layer 112 contains PCPPn and has a thickness of 30 nm.

[Fourth Step]

In a fourth step, the layer 111 was formed over the layer 112. Specifically, materials were co-deposited by a resistance-heating method.

Note that the layer 111 contains cNCzPA and N,N-bis(3-methylphenyl)-N,N'-bis[3-(9-phenyl-9H-fluoren-9-yl)phenyl]-anthracene-9,10-diamine (abbreviation: 9,10mMemFLPA2A) at a weight ratio of 1:0.1 and has a thickness of 25 nm.

[Fifth Step]

In a fifth step, the layer 113A was formed over the layer 111. Specifically, a material was deposited by a resistance-heating method.

Note that the layer 113A contains cNCzPA and has a thickness of 10 nm.

[Sixth Step]

In a sixth step, the layer 113B was formed over the layer 113A. Specifically, a material was deposited by a resistance-heating method.

Note that the layer 113B contains bathophenanthroline (abbreviation: BPhen) and has a thickness of 15 nm.

[Seventh Step]

In a seventh step, the layer 105 was formed over the layer 113B. Specifically, a material was deposited by a resistance-heating method.

Note that the layer 105 contains lithium fluoride (abbreviation: LiF) and has a thickness of 1 nm.

[Eighth Step]

In an eighth step, the electrode 102 was formed over the layer 105. Specifically, a material was deposited by a resistance-heating method.

Note that the electrode 102 contains Al and has a thickness of 200 nm.

<<Operation Characteristics of Light-Emitting Device 1>>

When supplied with electric power, the light-emitting device 1 emitted the light EL1 (see FIG. 26). Operation characteristics of the light-emitting device 1 were measured (see FIG. 27 to FIG. 32). Note that the measurement was performed at room temperature.

Table 2 shows main initial characteristics of the light-emitting device 1 emitting light with a luminance of approximately 1000 cd/m$^2$ (initial characteristics of the light-emitting devices as well as the light-emitting device 1 are shown in Table 2, and the structures of the light-emitting devices other than the light-emitting device 1 will be described later). Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 2

|  | Voltage (V) | Current (mA) | Current density (mA/cm2) | Chromaticity x | Chromaticity y | Current efficiency (cd/A) | External quantum efficiency (%) |
| --- | --- | --- | --- | --- | --- | --- | --- |
| Light-emitting device 1 | 2.9 | 0.11 | 2.7 | 0.27 | 0.66 | 32.0 | 8.9 |
| Comparative light-emitting device 1 | 2.9 | 0.09 | 2.2 | 0.26 | 0.66 | 34.0 | 9.5 |
| Light-emitting device 2 | 3.0 | 0.26 | 6.6 | 0.15 | 0.22 | 11.9 | 8.6 |
| Light-emitting device 3 | 3.1 | 0.43 | 10.7 | 0.18 | 0.31 | 10.7 | 5.6 |
| Light-emitting device 4 | 3.6 | 0.49 | 12.3 | 0.17 | 0.29 | 9.2 | 5.4 |

In a region having a high luminance of approximately 5000 cd/m$^2$, the efficiency of the light-emitting device 1 was higher than that of a comparative light-emitting device 1. For example, the light-emitting device 1 is preferably used for light-emitting elements for outdoor use or light-emitting elements for display devices used for augmented reality (AR) or the like, since such devices are required to have high luminance and high efficiency per light-emitting area. Moreover, in a region having a voltage of 3 V or lower, the current value of the light-emitting device 1 was larger than that of the comparative light-emitting device 1 (see FIG. 30). Furthermore, cNCzPA was able to be used as a host material in a light-emitting layer of the light-emitting device. A green fluorescent substance was used as a guest material, and cNCzPA was able to be suitably used as the host material.

Note that cNCzPA and cgBNCzPA each have an anthryl group as a substituent and have a high carrier-transport property. Accordingly, the driving voltage of the light-emitting device was able to be lowered.

Reference Example 1

Table 1 shows the structure of the comparative light-emitting device 1. Note that in the comparative light-emitting device 1, 7-[4-(10-phenyl-9-anthryl)phenyl]-7H-dibenzo[c,g]carbazole (abbreviation: cgDBCzPA) was used as the charge-transport material CTM.

The fabricated comparative light-emitting device 1 described in this example is different from the light-emitting device 1 in the charge-transport material CTM used for the layer 111 and the layer 113A. Specifically, the comparative light-emitting device 1 is different from the light-emitting device 1 in that cgDBCzPA is used instead of cNCzPA.

<<Fabrication Method of Comparative Light-Emitting Device 1>>

The comparative light-emitting device 1 was fabricated using a method including steps described below.

Note that the fabrication method of the comparative light-emitting device 1 is different from that of the light-emitting device 1 in that cgDBCzPA is used instead of cNCzPA in the step of forming the layer 111 and in the step of forming the layer 113A. Different parts will be described in detail below, and the above description is referred to for parts where a method similar to the above was employed.

[Fourth Step]

In a fourth step, the layer 111 was formed over the layer 112. Specifically, materials were co-deposited by a resistance-heating method.

Note that the layer 111 contains cgDBCzPA and 9,10mMemFLPA2A at a weight ratio of 1:0.1 and has a thickness of 25 nm.

[Fifth Step]

In a fifth step, the layer 113A was formed over the layer 111. Specifically, a material was deposited by a resistance-heating method.

Note that the layer 113A contains cgDBCzPA and has a thickness of 10 nm.

Table 2 shows the main initial characteristics of the comparative light-emitting device 1.

Example 4

In this example, fabricated light-emitting devices 2 to 4 of embodiments of the present invention will be described with reference to FIG. 26, FIG. 33, FIG. 34, FIG. 35, FIG. 36, FIG. 37, and FIG. 38.

Figure 33:
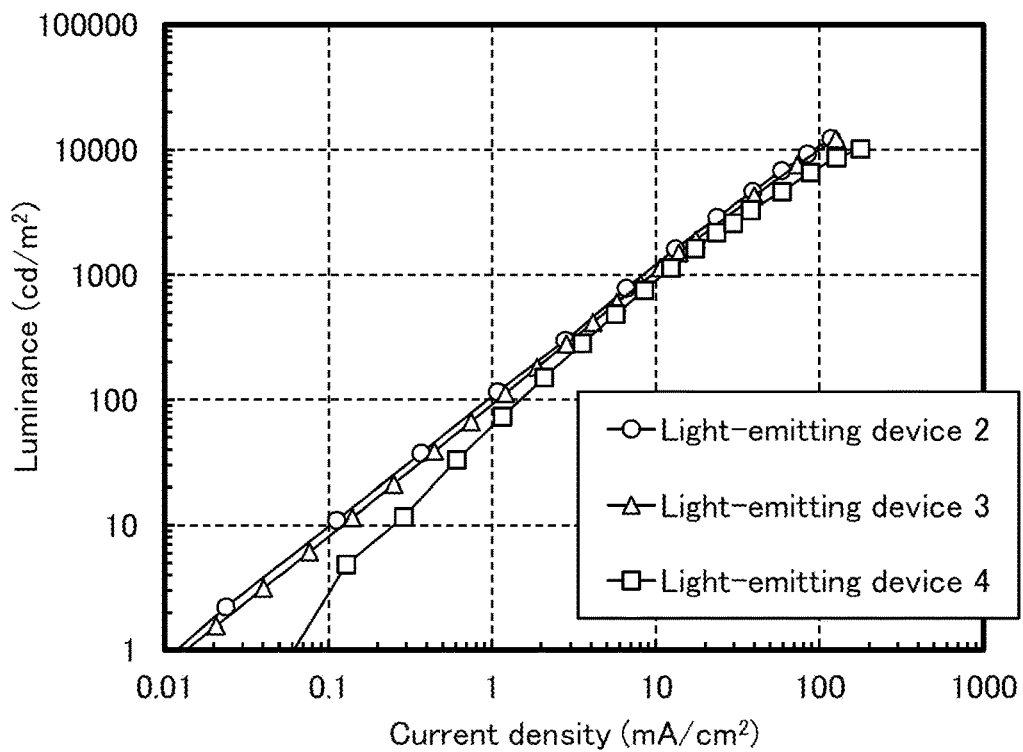
FIG. 33 shows current density-luminance characteristics of light-emitting devices in Example.

FIG. 33 shows current density-luminance characteristics of the light-emitting devices.

Figure 34:
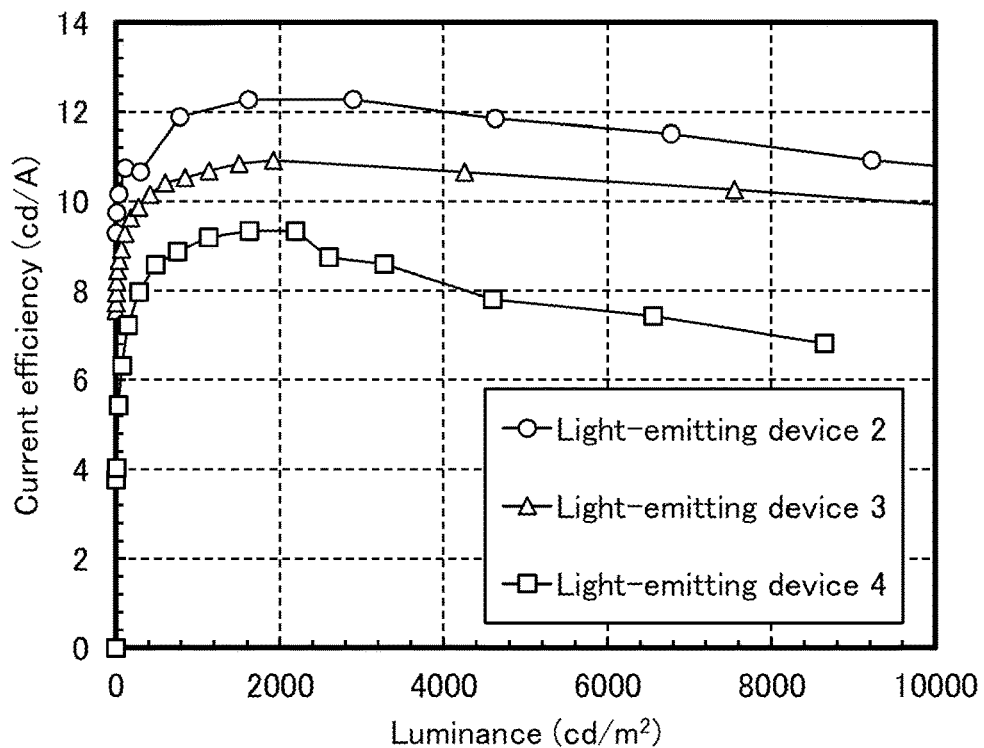
FIG. 34 shows luminance-current efficiency characteristics of the light-emitting devices in Example.

FIG. 34 shows luminance-current efficiency characteristics of the light-emitting devices.

Figure 35:
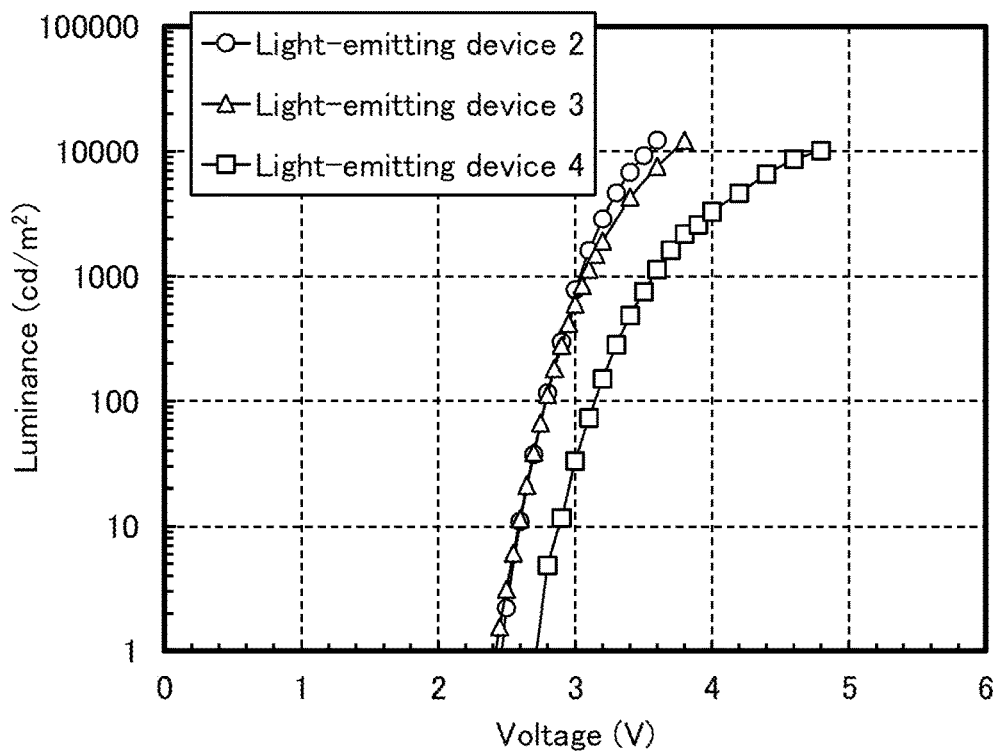
FIG. 35 shows voltage-luminance characteristics of the light-emitting devices in Example.

FIG. 35 shows voltage-luminance characteristics of the light-emitting devices.

Figure 36:
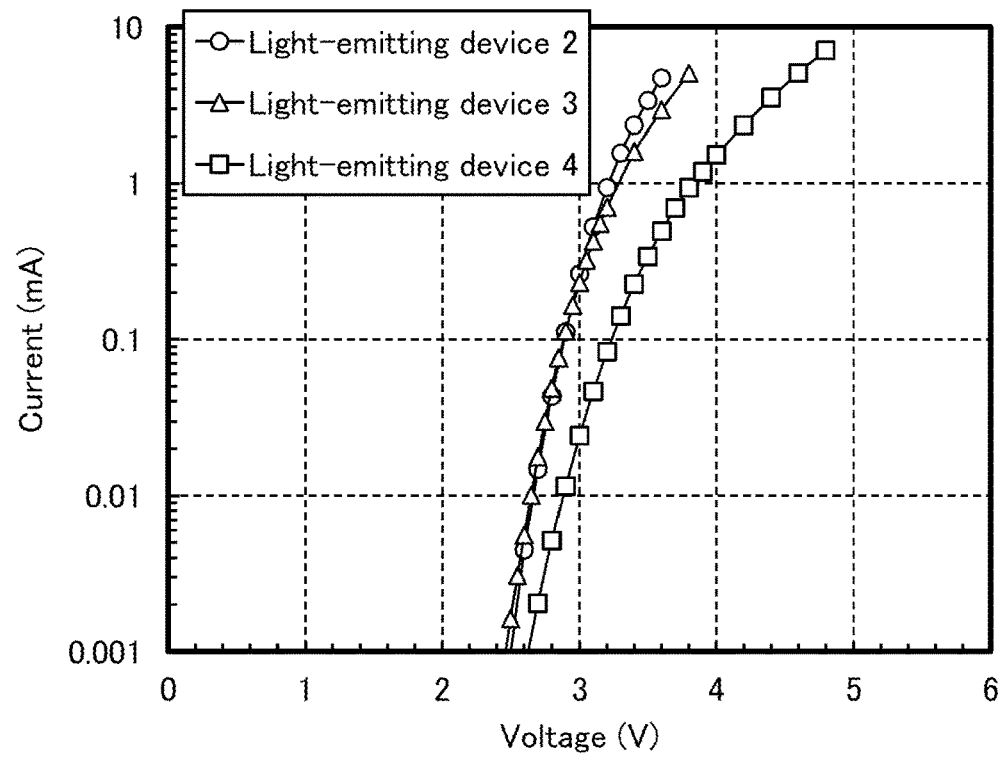
FIG. 36 shows voltage-current characteristics of the light-emitting devices in Example.

FIG. 36 shows voltage-current characteristics of the light-emitting devices.

Figure 37:
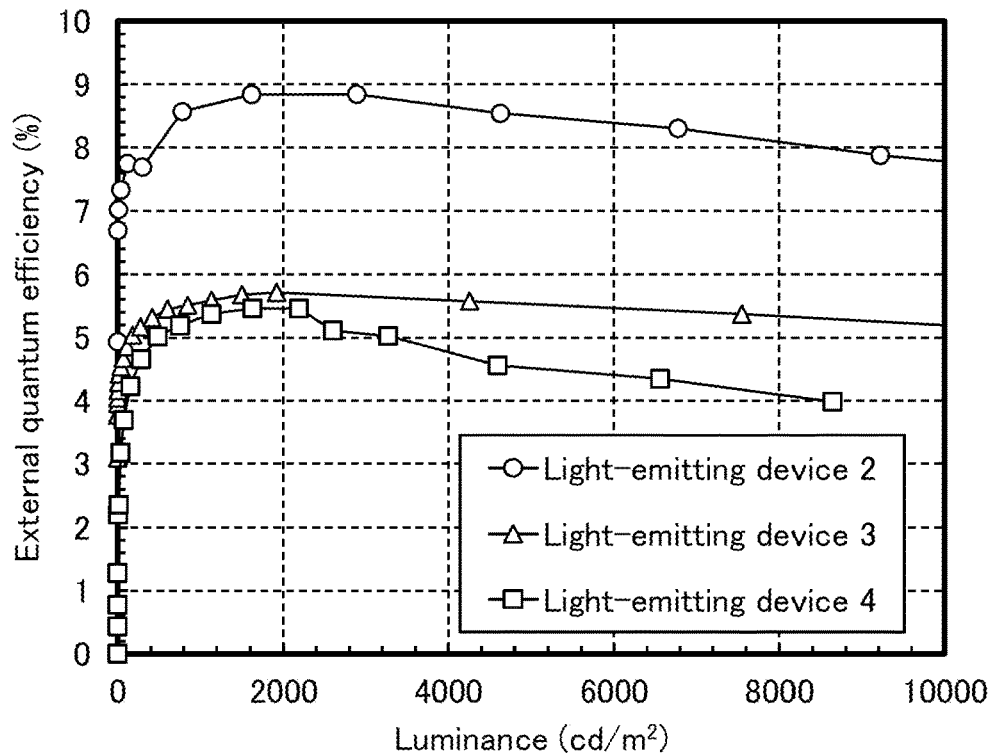
FIG. 37 shows luminance-external quantum efficiency characteristics of the light-emitting devices in Example.

FIG. 37 shows luminance-external quantum efficiency characteristics of the light-emitting devices. Note that the external quantum efficiency was calculated from an emission spectrum and luminance in frontal observation assuming that the light distribution characteristics of the light-emitting device are Lambertian type.

Figure 38:
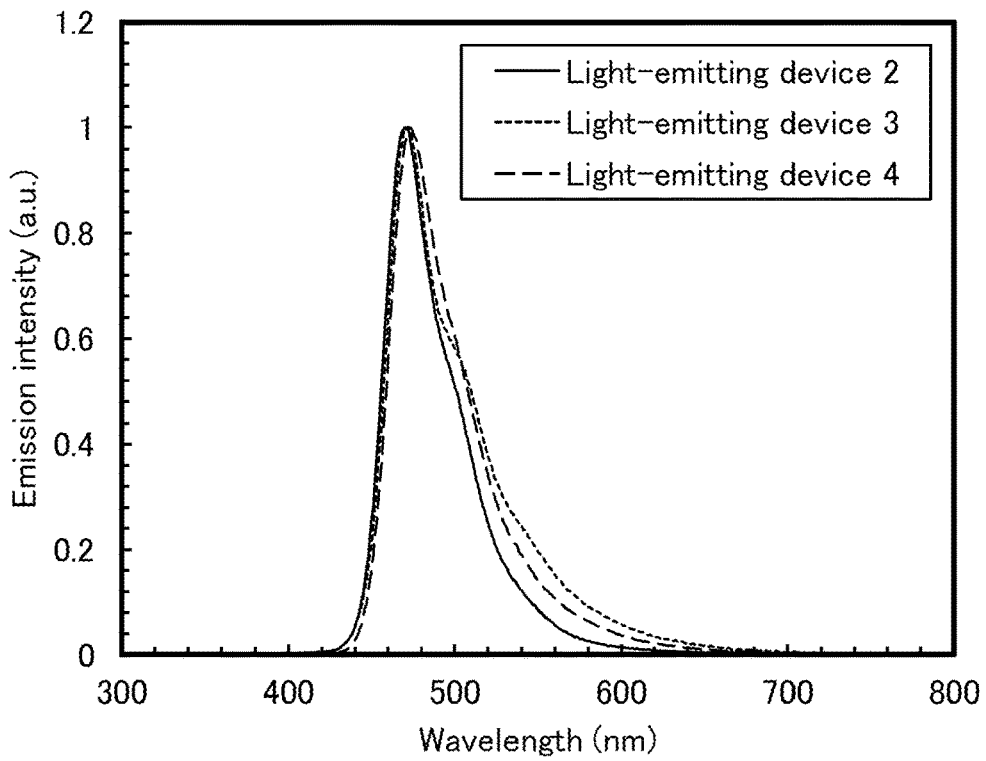
FIG. 38 shows emission spectra of the light-emitting devices in Example.

FIG. 38 shows emission spectra of the light-emitting devices emitting light with a luminance of 1000 cd/m$^2$.

<Light-Emitting Device 2>

The fabricated light-emitting devices described in this example each have a structure similar to that of the light-emitting device 150 (see FIG. 26).

<<Structure of Light-Emitting Device 2>>

Table 3 shows a structure of the light-emitting device 2. Note that in the light-emitting device 2, cNCzPA was used as the charge-transport material CTM.

The fabricated light-emitting device 2 described in this example is different from the light-emitting device 1 in the structures of the layer 112 and the layer 111. Specifically, the layer 112 had a thickness of 30 nm instead of a thickness of 20 nm.

Furthermore, in the layer 111, N,N'-bis(3-methylphenyl)-N,N'-bis[3-(9-phenyl-9H-fluoren-9-yl)phenyl]pyrene-1,6-diamine (abbreviation: 1,6mMemFLPAPrn) was used instead of 9,10mMemFLPA2A.

TABLE 3

| Structure | Reference numeral | Material | Composition ratio | Thickness/ nm |
| --- | --- | --- | --- | --- |
| Electrode | 102 | Al | | 200 |
| Layer | 105 | LiF | | 1 |
| Layer | 113B | Bphen | | 15 |
| Layer | 113A | CTM | | 10 |
| Layer | 111 | CTM: 1,6mMemFLPAPrn | 1:0.15 | 25 |
| Layer | 112 | PCPPn | | X |

TABLE 3-continued

| Structure | Reference numeral | Material | Composition ratio | Thickness/ nm |
| --- | --- | --- | --- | --- |
| Layer | 104 | PCPPn:MoOx | 4:2 | 10 |
| Electrode | 101 | ITSO | | 70 |

<<Fabrication Method of Light-Emitting Device 2>>

The light-emitting device 2 was fabricated using a method including steps described below.

Note that the fabrication method of the light-emitting device 2 is different from that of the light-emitting device 1 in that the layer 112 is formed to have a thickness of 30 nm instead of a thickness of 20 nm in the step of forming the layer 112 and 1,6mMemFLPAPrn is used instead of 9,10mMemFLPA2A in the step of forming the layer 111. Different parts will be described in detail below, and the above description is referred to for parts where a method similar to the above was employed.

[Third Step]

In a third step, the layer 112 was formed over the layer 104. Specifically, a material was deposited by a resistance-heating method.

Note that the layer 112 contains PCPPn and has a thickness of 20 nm.

[Fourth Step]

In a fourth step, the layer 111 was formed over the layer 112. Specifically, materials were co-deposited by a resistance-heating method.

Note that the layer 111 contains cNCzPA and 1,6mMemFLPAPrn at a weight ratio of 1:0.15 and has a thickness of 25 nm.

<<Operation Characteristics of Light-Emitting Device 2>>

When supplied with electric power, the light-emitting device 2 emitted the light EL1 (see FIG. 26). Operation characteristics of the light-emitting device 2 were measured (see FIG. 33 to FIG. 38). Note that the measurement was performed at room temperature.

Table 2 shows the main initial characteristics of the light-emitting device 2 emitting light with a luminance of approximately 1000 cd/m$^2$.

The light-emitting device using cNCzPA as a host material in a light-emitting layer was able to emit light with a luminance of approximately 1000 cd/m$^2$ at a low voltage of 3.0 V. In addition, an extremely high external quantum efficiency of 8.6% was obtained; thus, cNCzPA is an optimal host material that makes a blue fluorescent substance emit light as a guest material.

The organic compound of one embodiment of the present invention can be used as a host material in a light-emitting layer of a light-emitting device. Moreover, the organic compound of one embodiment of the present invention can be used as a host material while a blue fluorescent substance is used as a guest material. Furthermore, the blue fluorescent substance can be made to emit light with high efficiency.

<Light-Emitting Device 3>

The fabricated light-emitting devices described in this example each have a structure similar to that of the light-emitting device 150 (see FIG. 26).

<<Structure of Light-Emitting Device 3>>

Table 3 shows the structure of the light-emitting device 3. Note that in the light-emitting device 3, 3-[4-(10-phenyl-9-anthryl)phenyl]-3H-benzo[c]naphtho[2,3-g]carbazole (abbreviation: cgBNCzPA) was used as the charge-transport material CTM.

The fabricated light-emitting device 3 described in this example is different from the light-emitting device 1 in the structures of the layer 111 and the layer 113A. Specifically, cgBNCzPA was used instead of cNCzPA in the layer 111 and the layer 113A, and 1,6mMemFLPAPrn was used instead of 9,10mMemFLPA2A in the layer 111.

<<Fabrication Method of Light-Emitting Device 3>>

The light-emitting device 3 was fabricated using a method including steps described below.

Note that the fabrication method of the comparative light-emitting device 3 is different from that of the light-emitting device 1 in that cgBNCzPA is used instead of cNCzPA in the step of forming the layer 111 and in the step of forming the layer 113A, and 1,6mMemFLPAPrn is used instead of 9,10mMemFLPA2A in the step of forming the layer 111. Different parts will be described in detail below, and the above description is referred to for parts where a method similar to the above was employed.

[Fourth Step]

In a fourth step, the layer 111 was formed over the layer 112. Specifically, materials were co-deposited by a resistance-heating method.

Note that the layer 111 contains cgBNCzPA and 1,6mMemFLPAPrn at a weight ratio of 1:0.15 and has a thickness of 25 nm.

[Fifth Step]

In a fifth step, the layer 113A was formed over the layer 111. Specifically, a material was deposited by a resistance-heating method.

Note that the layer 113A contains cgBNCzPA and has a thickness of 10 nm.

<<Operation Characteristics of Light-Emitting Device 3>>

When supplied with electric power, the light-emitting device 3 emitted the light EL1 (see FIG. 26). Operation characteristics of the light-emitting device 3 were measured (see FIG. 33 to FIG. 38). Note that the measurement was performed at room temperature.

Table 2 shows the main initial characteristics of the light-emitting device 3 emitting light with a luminance of approximately 1000 cd/m$^2$.

The light-emitting device using cgBNCzPA as a host material in a light-emitting layer was able to emit light with a luminance of approximately 1000 cd/m$^2$ at a low voltage of 3.1 V. In addition, a fluorescent element having a high external quantum efficiency of 5.6% can be provided.

The organic compound of one embodiment of the present invention can be used as a host material in a light-emitting layer of a light-emitting device. Moreover, the organic compound of one embodiment of the present invention can be used as a host material while a blue fluorescent substance is used as a guest material. Furthermore, the blue fluorescent substance can be made to emit light with high efficiency.

<Light-Emitting Device 4>

The fabricated light-emitting devices described in this example each have a structure similar to that of the light-emitting device 150 (see FIG. 26).

<<Structure of Light-Emitting Device 4>>

Table 3 shows the structure of the light-emitting device 4. Note that in the light-emitting device 4, 9-[4-(carbazol-9-yl)phenyl]-5-phenylnaphtho[2,3-c]carbazole (abbreviation: 9CzPPcNC) was used as the charge-transport material CTM.

The fabricated light-emitting device 4 described in this example is different from the light-emitting device 1 in the structures of the layer 111 and the layer 113A. Specifically, 9CzPPcNC was used instead of cNCzPA in the layer 111 and the layer 113A, and 1,6mMemFLPAPrn was used instead of 9,10mMemFLPA2A in the layer 111.

<<Fabrication Method of Light-Emitting Device 4>>

The light-emitting device 4 was fabricated using a method including steps described below.

Note that the fabrication method of the comparative light-emitting device 4 is different from that of the light-emitting device 1 in that 9CzPPcNC is used instead of cNCzPA in the step of forming the layer 111 and in the step of forming the layer 113A, and 1,6mMemFLPAPrn is used instead of 9,10mMemFLPA2A in the step of forming the layer 111. Different parts will be described in detail below, and the above description is referred to for parts where a method similar to the above was employed.

[Fourth Step]

In a fourth step, the layer 111 was formed over the layer 112. Specifically, materials were co-deposited by a resistance-heating method.

Note that the layer 111 contains 9CzPPcNC and 1,6mMemFLPAPrn at a weight ratio of 1:0.15 and has a thickness of 25 nm.

[Fifth Step]

In a fifth step, the layer 113A was formed over the layer 111. Specifically, a material was deposited by a resistance-heating method.

Note that the layer 113A contains 9CzPPcNC and has a thickness of 10 nm.

<<Operation Characteristics of Light-Emitting Device 4>>

When supplied with electric power, the light-emitting device 4 emitted the light EL1 (see FIG. 26). Operation characteristics of the light-emitting device 4 were measured (see FIG. 33 to FIG. 38). Note that the measurement was performed at room temperature.

Table 2 shows the main initial characteristics of the light-emitting device 4 emitting light with a luminance of approximately 1000 cd/m$^2$.

A fluorescent element using 9CzPPcNC as a host material in a light-emitting layer can have a high external quantum efficiency of 5.4%.

The organic compound of one embodiment of the present invention can be used as a host material in a light-emitting layer of a light-emitting device. Moreover, a blue fluorescent substance can be used as a guest material while the organic compound of one embodiment of the present invention is used as a host material. Furthermore, the blue fluorescent substance can be made to emit light with high efficiency while the organic compound of one embodiment of the present invention is used as the host material.

This application is based on Japanese Patent Application Serial No. 2020-174339 filed with Japan Patent Office on Oct. 16, 2020, the entire contents of which are hereby incorporated by reference.

What is claimed is:
1. An organic compound represented by General Formula (G2),
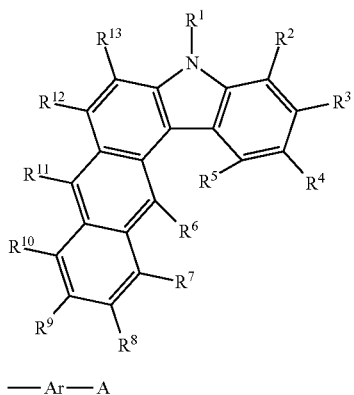
(G2)
—Ar—A
(G3)
wherein in the General Formula (G2):
any one of a substituent $R^1$ to a substituent $R^{13}$ is represented by the General Formula (G3), and
wherein in the General Formula (G3):
Ar represents any one of Structural Formulae (Ar-1) to (Ar-17);
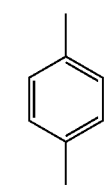
(Ar-1)
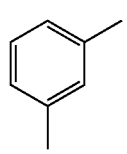
(Ar-2)
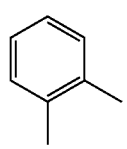
(Ar-3)
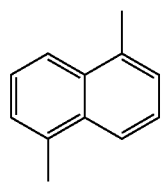
(Ar-4)
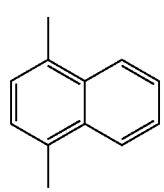
(Ar-5)
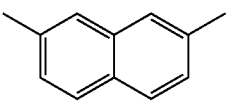
(Ar-6)
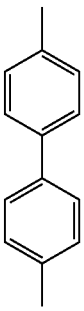
(Ar-7)
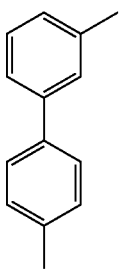
(Ar-8)
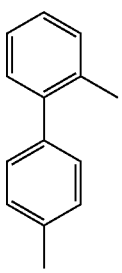
(Ar-9)
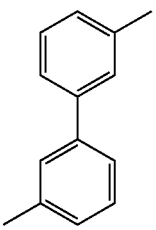
(Ar-10)
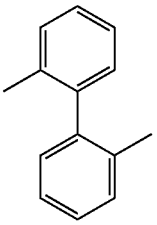
(Ar-11)
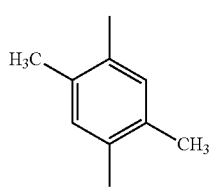
(Ar-12)

(Ar-13)
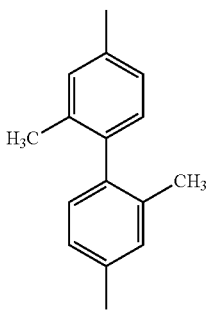

(Ar-14)
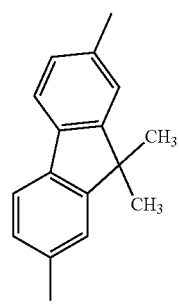

(Ar-15)
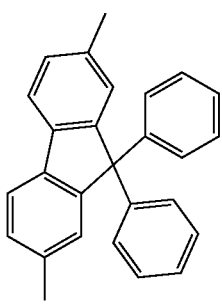

(Ar-16)
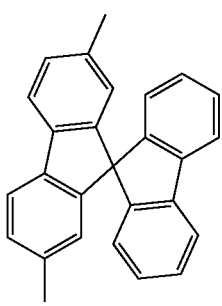

(Ar-17)
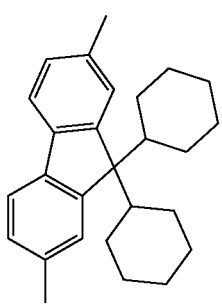

A represents a substituted or unsubstituted 9H-carbazolyl group or a substituted or unsubstituted anthryl group;
the others of the substituent $R^1$ to the substituent $R^{13}$ each independently represent hydrogen, an alkyl group, a cyclic alkyl group, or a substituted or unsubstituted aryl group;
the alkyl group comprises 1 to 6, inclusive, carbon atoms;
the cyclic alkyl group comprises 3 to 7, inclusive, carbon atoms; and
the substituted or unsubstituted aryl group comprises 6 to 13, inclusive, carbon atoms.

2. The organic compound according to claim 1,
wherein in the General Formula (G2),
any one of the substituent $R^1$, the substituent $R^3$, the substituent $R^4$, or the substituent $R^{10}$ is represented by the General Formula (G3).

3. The organic compound according to claim 1,
wherein in the General Formula (G3), A represents a substituted or unsubstituted carbazol-9-yl group or a substituted or unsubstituted 9-anthryl group.

4. A light-emitting device comprising:
a first electrode;
a second electrode;
a first layer; and
a second layer,
wherein the second electrode comprises a region overlapping with the first electrode,
wherein the first layer comprises a region between the first electrode and the second electrode,
wherein the first layer comprises a light-emitting material and a charge-transport material,
wherein the second layer comprises a region between the first layer and the second electrode,
wherein the second layer comprises the charge-transport material, and
wherein the charge-transport material is the organic compound according to claim 1.

5. A light-emitting apparatus comprising:
the light-emitting device according to claim 4; and
at least one of a transistor or a substrate.

6. A lighting device comprising:
the light-emitting apparatus according to claim 5; and
a housing.

7. A display device comprising:
the light-emitting device according to claim 4; and
at least one of a transistor or a substrate.

8. An electronic device comprising:
the display device according to claim 7; and
at least one of a sensor, an operation button, a speaker, or a microphone.

9. An organic compound represented by General Formula (G4), (G4)
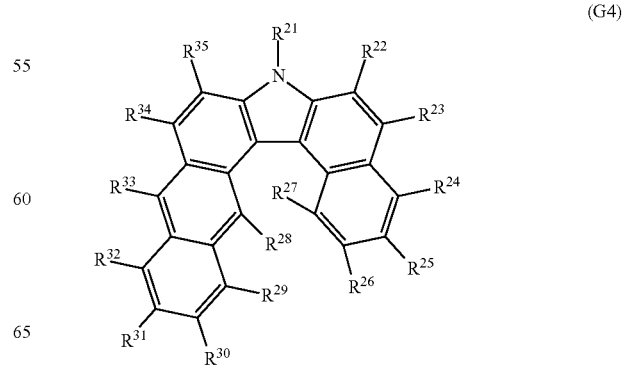

$$-Ar-A \quad (G3)$$
wherein in the General Formula (G4):
any one of a substituent $R^{21}$ to a substituent $R^{35}$ is represented by General Formula (G3), and
wherein in the General Formula (G3):
Ar represents any one of Structural Formulae (Ar-1) to (Ar-17);
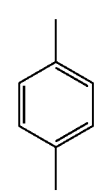
(Ar-1)
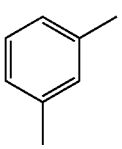
(Ar-2)
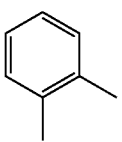
(Ar-3)
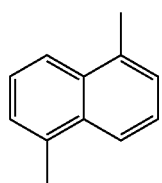
(Ar-4)
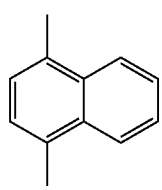
(Ar-5)
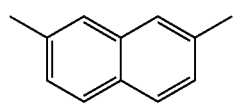
(Ar-6)
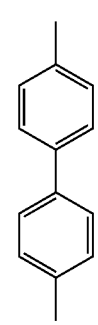
(Ar-7)
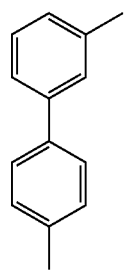
(Ar-8)
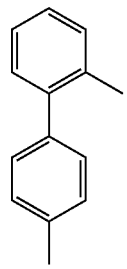
(Ar-9)
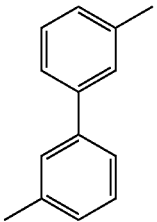
(Ar-10)
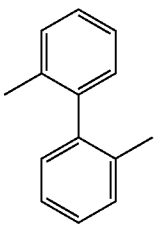
(Ar-11)
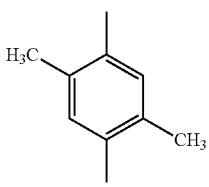
(Ar-12)
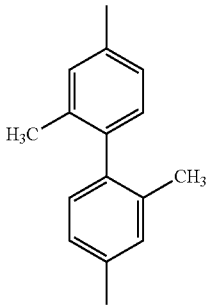
(Ar-13)

-continued (Ar-14)

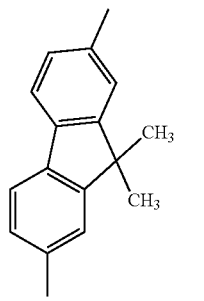

(Ar-15)

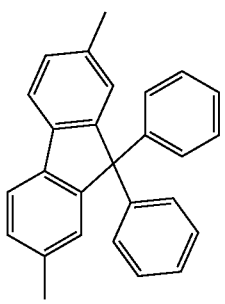

(Ar-16)

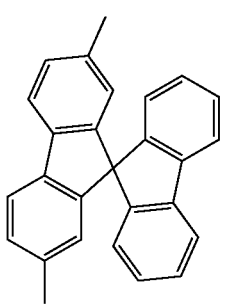

(Ar-17)

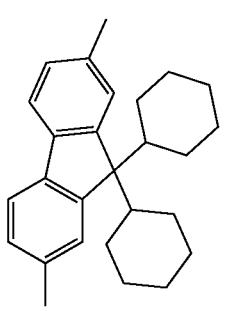

A represents a substituted or unsubstituted 9H-carbazolyl group or a substituted or unsubstituted anthryl group;
the others of the substituent $R^{21}$ to the substituent $R^{35}$ each independently represent hydrogen, an alkyl group, a cyclic alkyl group, or a substituted or unsubstituted aryl group;
the alkyl group comprises 1 to 6, inclusive, carbon atoms;
the cyclic alkyl group comprises 3 to 7, inclusive, carbon atoms; and
the substituted or unsubstituted aryl group comprises 6 to 13, inclusive, carbon atoms.

10. The organic compound according to claim 9,
wherein in the General Formula (G4), any one of the substituent $R^{21}$, the substituent $R^{23}$, the substituent $R^{24}$, or the substituent $R^{32}$ is represented by the General Formula (G3).

11. The organic compound according to claim 9,
wherein in the General Formula (G3), A represents a substituted or unsubstituted carbazol-9-yl group or a substituted or unsubstituted 9-anthryl group.

12. A light-emitting device comprising:
a first electrode;
a second electrode;
a first layer; and
a second layer,
wherein the second electrode comprises a region overlapping with the first electrode,
wherein the first layer comprises a region between the first electrode and the second electrode,
wherein the first layer comprises a light-emitting material and a charge-transport material,
wherein the second layer comprises a region between the first layer and the second electrode,
wherein the second layer comprises the charge-transport material, and
wherein the charge-transport material is the organic compound according to claim 9.

13. A light-emitting apparatus comprising:
the light-emitting device according to claim 12; and
at least one of a transistor or a substrate.

14. A lighting device comprising:
the light-emitting apparatus according to claim 13; and
a housing.

15. A display device comprising:
the light-emitting device according to claim 12; and
at least one of a transistor or a substrate.

16. An electronic device comprising:
the display device according to claim 15; and
at least one of a sensor, an operation button, a speaker, or a microphone.

* * * * *